(12) United States Patent
Adib et al.

(10) Patent No.: US 9,703,011 B2
(45) Date of Patent: Jul. 11, 2017

(54) SCRATCH-RESISTANT ARTICLES WITH A GRADIENT LAYER

(71) Applicant: CORNING INCORPORATED, Corning, NY (US)

(72) Inventors: Kaveh Adib, Corning, NY (US); Shandon Dee Hart, Corning, NY (US); Karl William Koch, III, Elmira, NY (US); Charles Andrew Paulson, Painted Post, NY (US); James Joseph Price, Corning, NY (US); Paul Arthur Sachenik, Corning, NY (US)

(73) Assignee: Corning Incorporated, Corning, NY (US)

( * ) Notice: Subject to any disclaimer, the term of this patent is extended or adjusted under 35 U.S.C. 154(b) by 198 days.

(21) Appl. No.: 14/262,224

(22) Filed: Apr. 25, 2014

(65) Prior Publication Data
US 2014/0334006 A1   Nov. 13, 2014

Related U.S. Application Data

(60) Provisional application No. 61/954,767, filed on Mar. 18, 2014, provisional application No. 61/877,568, (Continued)

(51) Int. Cl.
  *G02B 1/10*  (2015.01)
  *C23C 14/10* (2006.01)
  (Continued)

(52) U.S. Cl.
  CPC ............. *G02B 1/105* (2013.01); *C23C 14/10* (2013.01); *C23C 14/34* (2013.01); *G02B 1/115* (2013.01)

(58) Field of Classification Search
  CPC ......... G02B 1/105; G02B 1/115; C23C 14/10; C23C 14/34
  (Continued)

(56) References Cited

U.S. PATENT DOCUMENTS

| | | | |
|---|---|---|---|
| 3,934,961 A | 1/1976 | Itoh et al. | 350/164 |
| 3,989,350 A | 11/1976 | Cohen et al. | 350/96 |

(Continued)

FOREIGN PATENT DOCUMENTS

| | | | |
|---|---|---|---|
| AU | 766773 B2 | 5/2001 | C03C 17/34 |
| AU | 2002341016 A1 | 5/2003 | B32B 7/02 |

(Continued)

OTHER PUBLICATIONS

Pantano, Carlo G. "Al2O3 Coating by Atomic Layer Deposition (ALD) on various glass substrates for Surface Strength Improvement".

(Continued)

*Primary Examiner* — Bumsuk Won
*Assistant Examiner* — Grant Gagnon
(74) *Attorney, Agent, or Firm* — Payal A. Patel; Jeffrey A. Schmidt

(57) ABSTRACT

Embodiments of this disclosure pertain to articles that exhibit scratch-resistance and improved optical properties. In some examples, the article exhibits a color shift of about 2 or less, when viewed at an incident illumination angle in the range from about 0 degrees to about 60 degrees from normal under an illuminant. In one or more embodiments, the articles include a substrate, and an optical film disposed on the substrate. The optical film includes a scratch-resistant layer and a refractive index gradient. In one or more embodiments, the refractive index includes a refractive index that increases from a first surface at the interface between the substrate and the optical film to a second (Continued)

surface. The refractive index gradient may be formed from a compositional gradient and/or a porosity gradient.

19 Claims, 23 Drawing Sheets

Related U.S. Application Data filed on Sep. 13, 2013, provisional application No. 61/820,407, filed on May 7, 2013.

(51) Int. Cl.
   *G02B 1/11* (2015.01)
   *C23C 14/34* (2006.01)
   *G02B 1/115* (2015.01)

(58) Field of Classification Search
   USPC .......................................................... 359/580
   See application file for complete search history.

(56) References Cited

U.S. PATENT DOCUMENTS

| | | | |
|---|---|---|---|
| 4,033,667 A | 7/1977 | Fleming, Jr. ................... 350/96 |
| 4,137,365 A | 1/1979 | Wydeven et al. ............. 428/412 |
| 4,298,366 A | 11/1981 | Dabby et al. .................. 65/3.12 |
| 4,310,595 A | 1/1982 | Beall et al. .................... 428/332 |
| 4,423,925 A | 1/1984 | Dabby et al. ................. 350/96.31 |
| 4,519,966 A | 5/1985 | Aldinger et al. |
| 4,537,814 A | 8/1985 | Itoh et al. ..................... 428/217 |
| 4,568,140 A | 2/1986 | van der Werf et al. |
| 4,571,519 A | 2/1986 | Kawabata et al. ............ 310/313 |
| 4,995,684 A | 2/1991 | Tustison et al. |
| 5,178,911 A | 1/1993 | Gordon et al. ............... 427/255 |
| 5,234,769 A | 8/1993 | Shevlin |
| 5,268,217 A | 12/1993 | Kimock et al. |
| 5,300,951 A | 4/1994 | Yamazaki |
| 5,332,888 A | 7/1994 | Tausch ..................... H05B 3/86 |
| 5,390,274 A | 2/1995 | Toyoda et al. ................ 385/124 |
| 5,393,574 A | 2/1995 | Sulzback ...................... 427/530 |
| 5,478,634 A | 12/1995 | Setoyama et al. |
| 5,503,912 A | 4/1996 | Setoyama et al. |
| 5,508,092 A | 4/1996 | Kimock |
| 5,567,363 A | 10/1996 | Jung et al. ...................... 264/2.6 |
| 5,635,245 A | 6/1997 | Kimock et al. ............... 427/249 |
| 5,637,353 A | 6/1997 | Kimock et al. ............. 427/255.3 |
| 5,643,638 A | 7/1997 | Otto et al. ..................... 427/569 |
| 5,718,773 A | 2/1998 | Shiozaki |
| 5,719,705 A | 2/1998 | Machol |
| 5,766,783 A | 6/1998 | Utsumi et al. ................ 428/698 |
| 5,772,862 A | 6/1998 | Ando ..................... B32B 17/10 |
| 5,773,148 A | 6/1998 | Charrue et al. ............... 428/410 |
| 5,846,650 A | 12/1998 | Ko et al. ....................... 428/336 |
| 5,935,716 A | 8/1999 | McCurdy |
| 5,938,898 A | 8/1999 | Ando et al. |
| 6,074,730 A | 6/2000 | Laird et al. ................... 428/212 |
| 6,088,166 A | 7/2000 | Lee ................................ 359/654 |
| 6,114,043 A | 9/2000 | Joret ............................. 428/428 |
| 6,132,650 A | 10/2000 | Nakamura ................... 264/1.29 |
| 6,165,598 A | 12/2000 | Nelson ......................... 428/212 |
| 6,166,125 A | 12/2000 | Sugiyama et al. ............ 524/462 |
| 6,172,812 B1 | 1/2001 | Haaland |
| 6,238,781 B1 | 5/2001 | Anderson ................. E06B 5/00 |
| 6,250,758 B1 | 6/2001 | Yoshihara |
| 6,267,915 B1 | 7/2001 | Park et al. .................... 264/1.24 |
| 6,303,225 B1 | 10/2001 | Veerasamy |
| 6,337,771 B1 | 1/2002 | Chu et al. ..................... 359/586 |
| 6,344,288 B1 | 2/2002 | Oyama et al. ................ 428/701 |
| 6,355,334 B1 | 3/2002 | Rondeau et al. ............. 428/212 |
| 6,395,333 B2 | 5/2002 | Veerasamy ................. 427/249.7 |
| 6,416,872 B1 | 7/2002 | Maschwitz ............. B32B 17/10 |
| 6,495,251 B1 | 12/2002 | Arbab et al. .................. 428/336 |
| 6,503,557 B1 | 1/2003 | Joret ............................. 427/167 |
| 6,524,714 B1 | 2/2003 | Neuman ................. C03C 17/34 |
| 6,535,333 B1* | 3/2003 | Piepel .................... G03B 21/56 359/453 |
| 6,570,709 B2 | 5/2003 | Katayama et al. ........... 359/586 |
| 6,572,990 B1 | 6/2003 | Oyama et al. ................ 428/698 |
| 6,596,368 B1 | 7/2003 | Liebig |
| 6,605,358 B1 | 8/2003 | Stachowiak ............ C03C 17/36 |
| 6,707,610 B1 | 3/2004 | Woodard et al. ............. 359/582 |
| 6,730,352 B2 | 5/2004 | Stachowiak ............ C03C 17/36 |
| 6,746,775 B1 | 6/2004 | Boire et al. ................... 428/432 |
| 6,783,253 B2 | 8/2004 | Thomsen et al. |
| 6,813,096 B2 | 11/2004 | Ohta |
| 6,838,179 B1 | 1/2005 | Legrand ....................... 428/432 |
| 6,875,468 B2 | 4/2005 | Kunz et al. ............... 427/255.28 |
| 6,924,037 B1 | 8/2005 | Joret et al. |
| 6,950,236 B2 | 9/2005 | Hokazono ................ G02B 1/11 |
| 6,998,177 B2 | 2/2006 | Krzyzak et al. .............. 428/428 |
| 7,005,188 B2 | 2/2006 | Anderson et al. ............ 428/432 |
| 7,018,727 B2 | 3/2006 | Dzick ........................... 428/699 |
| 7,055,954 B2 | 6/2006 | Marechal ...................... 351/159 |
| 7,156,533 B2 | 1/2007 | Hoeing |
| 7,166,360 B2 | 1/2007 | Coustet et al. ............... 428/432 |
| 7,189,456 B2 | 3/2007 | King |
| 7,229,684 B2 | 6/2007 | Enniss .................... B32B 27/20 |
| 7,332,213 B2 | 2/2008 | Mimura et al. |
| 7,351,447 B2 | 4/2008 | Nishida et al. ............... 427/162 |
| 7,381,469 B2 | 6/2008 | Moelle et al. ................. 428/432 |
| 7,405,005 B2 | 7/2008 | Watanabe ..................... 428/432 |
| 7,426,328 B2 | 9/2008 | Zhou et al. |
| 7,521,123 B2 | 4/2009 | Hattori et al. |
| 7,541,102 B2 | 6/2009 | Klippe et al. ................. 428/701 |
| 7,643,719 B1 | 1/2010 | Zhou et al. .................... 385/131 |
| 7,655,298 B2 | 2/2010 | Thies et al. ................... 428/325 |
| 7,736,728 B2 | 6/2010 | Loboda et al. ............... 428/218 |
| 7,736,824 B2 | 6/2010 | Yoshikawa .................. G03F 1/00 |
| 7,910,215 B2 | 3/2011 | Reymond et al. ............ 428/428 |
| 7,926,939 B2 | 4/2011 | Kato ........................ G02C 7/02 |
| 7,978,402 B2 | 7/2011 | Sweeney .................. G02B 5/08 |
| 8,062,749 B2 | 11/2011 | Shelestak et al. ............ 428/410 |
| 8,067,094 B2 | 11/2011 | Benson et al. |
| 8,088,502 B2 | 1/2012 | Martin et al. |
| 8,118,896 B2 | 2/2012 | Can et al. ........................ 51/295 |
| 8,187,671 B2 | 5/2012 | Sol ................................ 427/165 |
| 8,236,433 B2 | 8/2012 | Chiu |
| 8,304,078 B2 | 11/2012 | Varshneya ................... 428/410 |
| 8,312,739 B2 | 11/2012 | Lee et al. |
| 8,360,574 B2 | 1/2013 | Ishak ........................ G02C 7/02 |
| 8,383,214 B2 | 2/2013 | Schaepkens et al. ......... 428/34.7 |
| 8,400,592 B2 | 3/2013 | Hirakata et al. |
| 8,409,716 B2 | 4/2013 | Schultz et al. ............... 428/428 |
| 8,425,035 B2 | 4/2013 | Von Blanckenhagen ....... G02C 7/02 |
| 8,432,611 B1 | 4/2013 | Wach |
| 8,445,112 B2 | 5/2013 | Di Stefano .................. 428/432 |
| 8,446,673 B2 | 5/2013 | Yoshihara ..................... 359/585 |
| 8,508,703 B2 | 8/2013 | Lee |
| 8,561,429 B2 | 10/2013 | Allan et al. |
| 8,679,631 B2 | 3/2014 | Murata ......................... 428/410 |
| 8,753,744 B2 | 6/2014 | Borrelli et al. ............... 428/410 |
| 8,784,933 B2 | 7/2014 | Krzyak |
| 8,840,257 B2 | 9/2014 | Kawagishi |
| 8,842,365 B2 | 9/2014 | Koike |
| 9,042,019 B2 | 5/2015 | Su |
| 9,079,802 B2 | 7/2015 | Bellman et al. |
| 9,110,230 B2 | 8/2015 | Koch, III et al. |
| 9,335,444 B2 | 5/2016 | Hart et al. |
| 2001/0002295 A1 | 5/2001 | Anderson et al. ............ 428/432 |
| 2001/0016262 A1 | 8/2001 | Toyoshima et al. .......... 428/428 |
| 2001/0017452 A1 | 8/2001 | Bernard .................... B60R 3/00 |
| 2001/0031365 A1 | 10/2001 | Anderson et al. |
| 2002/0009593 A1 | 1/2002 | Veerasamy |
| 2002/0017452 A1 | 2/2002 | Zimmermann et al. ... 204/192.1 |
| 2002/0051274 A1 | 5/2002 | Kim |
| 2002/0051294 A1 | 5/2002 | Katayama et al. |
| 2002/0136908 A1 | 9/2002 | Komatsu et al. ............. 428/446 |
| 2003/0019363 A1 | 1/2003 | Grover et al. |
| 2003/0031879 A1 | 2/2003 | Neuman et al. .............. 428/428 |
| 2003/0035044 A1 | 2/2003 | Nakayama et al. .......... 347/203 |
| 2003/0193636 A1 | 10/2003 | Allen et al. |
| 2004/0147185 A1 | 7/2004 | Decroupet ....................... 442/59 |

(56) References Cited

U.S. PATENT DOCUMENTS

| | | | |
|---|---|---|---|
| 2004/0258947 A1 | 12/2004 | Moelle et al. | 428/627 |
| 2005/0012569 A1 | 1/2005 | Sasaki | |
| 2005/0084705 A1 | 4/2005 | Klippe et al. | 428/633 |
| 2005/0123772 A1 | 6/2005 | Coustet et al. | 428/432 |
| 2005/0233091 A1 | 10/2005 | Kumar et al. | 427/569 |
| 2006/0008656 A1 | 1/2006 | Veerasamy et al. | |
| 2006/0093833 A1 | 5/2006 | Meyer et al. | 428/432 |
| 2006/0134436 A1 | 6/2006 | Maschwitz | 428/426 |
| 2006/0139783 A1 | 6/2006 | Decroupet | 359/883 |
| 2006/0154044 A1* | 7/2006 | Yamada | C03C 17/007 428/312.2 |
| 2006/0165963 A1 | 7/2006 | Fleury et al. | 428/212 |
| 2006/0197096 A1 | 9/2006 | Kerdiles et al. | 257/79 |
| 2006/0240266 A1 | 10/2006 | Schicht et al. | 428/426 |
| 2007/0018871 A1 | 1/2007 | Riley | |
| 2007/0030569 A1 | 2/2007 | Lu et al. | 359/586 |
| 2007/0128528 A1 | 6/2007 | Hess et al. | 430/5 |
| 2007/0237918 A1 | 10/2007 | Jonza et al. | 428/43 |
| 2007/0285776 A1 | 12/2007 | Nakamura et al. | 359/485 |
| 2008/0024867 A1 | 1/2008 | Kawashima et al. | |
| 2008/0032157 A1 | 2/2008 | Koekert et al. | 428/701 |
| 2009/0017314 A1 | 1/2009 | Nadaud et al. | 428/446 |
| 2009/0052041 A1 | 2/2009 | Watanabe et al. | |
| 2009/0104385 A1 | 4/2009 | Reymond et al. | |
| 2009/0141357 A1 | 6/2009 | Kamura | |
| 2009/0155490 A1 | 6/2009 | Bicker et al. | 427/576 |
| 2009/0195865 A1 | 8/2009 | Kleideiter et al. | 359/360 |
| 2009/0197048 A1 | 8/2009 | Amin et al. | 428/142 |
| 2009/0223437 A1 | 9/2009 | Ballard | 116/288 |
| 2009/0297877 A1 | 12/2009 | Chang et al. | |
| 2009/0298669 A1 | 12/2009 | Akiba et al. | 501/70 |
| 2009/0324844 A1 | 12/2009 | Haoto et al. | 427/527 |
| 2010/0009154 A1 | 1/2010 | Allan et al. | 428/220 |
| 2010/0027383 A1 | 2/2010 | Suzuki et al. | |
| 2010/0028607 A1 | 2/2010 | Lee et al. | |
| 2010/0047521 A1 | 2/2010 | Amin et al. | 428/141 |
| 2010/0062245 A1 | 3/2010 | Martin et al. | 428/336 |
| 2010/0119486 A1 | 5/2010 | Sakamoto et al. | |
| 2010/0183857 A1 | 7/2010 | Nouvelot | |
| 2010/0196685 A1 | 8/2010 | Murata et al. | 428/216 |
| 2010/0215950 A1 | 8/2010 | Schultz et al. | 428/336 |
| 2010/0247745 A1 | 9/2010 | Rudmann et al. | 427/9 |
| 2010/0291353 A1 | 11/2010 | Dejneka et al. | 428/192 |
| 2010/0304090 A1 | 12/2010 | Henn et al. | 428/172 |
| 2010/0311868 A1 | 12/2010 | Bekiarian et al. | 523/218 |
| 2010/0313875 A1 | 12/2010 | Kennedy | |
| 2011/0033681 A1 | 2/2011 | Adachi et al. | |
| 2011/0043719 A1 | 2/2011 | Thunhorst et al. | |
| 2011/0114160 A1 | 5/2011 | Murashige et al. | 136/252 |
| 2011/0120554 A1 | 5/2011 | Chhajed | |
| 2011/0151173 A1 | 6/2011 | Ramadas | B32B 1/06 |
| 2011/0157703 A1 | 6/2011 | Broadway et al. | |
| 2011/0177241 A1 | 7/2011 | Lee et al. | 427/165 |
| 2011/0235181 A1 | 9/2011 | Hayashibe | |
| 2011/0262742 A1 | 10/2011 | Takeuchi et al. | |
| 2011/0262754 A1 | 10/2011 | Zehentmaier | B32B 27/00 |
| 2012/0008217 A1 | 1/2012 | Ishak | G02C 7/10 |
| 2012/0027968 A1 | 2/2012 | Chang | B32B 1/02 |
| 2012/0040179 A1 | 2/2012 | Dave | 428/336 |
| 2012/0099323 A1 | 4/2012 | Thompson | F21V 11/00 |
| 2012/0135153 A1 | 5/2012 | Osakabe et al. | 427/399 |
| 2012/0196103 A1 | 8/2012 | Murashige et al. | 428/213 |
| 2012/0212826 A1 | 8/2012 | Henn et al. | 359/586 |
| 2012/0219792 A1 | 8/2012 | Yamamoto et al. | 428/336 |
| 2012/0250314 A1 | 10/2012 | Maikowski et al. | |
| 2012/0301676 A1 | 11/2012 | Ushida et al. | |
| 2012/0321898 A1 | 12/2012 | Meinhardt et al. | 428/410 |
| 2012/0327568 A1 | 12/2012 | Shedletsky et al. | 361/679.01 |
| 2013/0013574 A1 | 1/2013 | Wu | |
| 2013/0021669 A1 | 1/2013 | Xi et al. | 359/578 |
| 2013/0022798 A1 | 1/2013 | Fukawa et al. | 428/212 |
| 2013/0029118 A1 | 1/2013 | Kishi et al. | |
| 2013/0057950 A1 | 3/2013 | Lin | |
| 2013/0059137 A1 | 3/2013 | Hevesi et al. | |
| 2013/0120842 A1 | 5/2013 | Moens et al. | |
| 2013/0128342 A1 | 5/2013 | Mitarai et al. | |
| 2013/0170044 A1 | 7/2013 | Mont et al. | 359/580 |
| 2013/0176615 A1 | 7/2013 | Uefuji et al. | 359/359 |
| 2013/0177751 A1 | 7/2013 | Oh et al. | 428/216 |
| 2013/0183489 A1 | 7/2013 | Cremer et al. | |
| 2013/0187185 A1 | 7/2013 | Deshazer et al. | 257/98 |
| 2013/0209762 A1 | 8/2013 | Damm et al. | 428/212 |
| 2013/0260115 A1 | 10/2013 | Suzuki et al. | |
| 2013/0263784 A1 | 10/2013 | Lee et al. | |
| 2013/0271836 A1 | 10/2013 | Fukaya | |
| 2013/0334031 A1 | 12/2013 | Lee et al. | |
| 2014/0022630 A1 | 1/2014 | Reymond et al. | |
| 2014/0036175 A1 | 2/2014 | Morishima et al. | |
| 2014/0087101 A1 | 3/2014 | Tixhon et al. | |
| 2014/0090864 A1 | 4/2014 | Paulson | |
| 2014/0090974 A1 | 4/2014 | Ballet et al. | 204/192.15 |
| 2014/0093711 A1 | 4/2014 | Paulson | |
| 2014/0106141 A1 | 4/2014 | Bellman et al. | |
| 2014/0106146 A1 | 4/2014 | Decker et al. | |
| 2014/0106150 A1 | 4/2014 | Decker et al. | |
| 2014/0113083 A1 | 4/2014 | Lee et al. | |
| 2014/0113120 A1 | 4/2014 | Thiel | 428/212 |
| 2014/0139978 A1 | 5/2014 | Kwong | H05K 5/03 |
| 2014/0186615 A1 | 7/2014 | An et al. | 428/332 |
| 2014/0220327 A1 | 8/2014 | Adib et al. | |
| 2014/0233106 A1 | 8/2014 | Vergoehl et al. | |
| 2014/0255616 A1 | 9/2014 | Paulson | |
| 2014/0261615 A1 | 9/2014 | Nair et al. | 136/244 |
| 2014/0295330 A1 | 10/2014 | Pruneri et al. | 430/5 |
| 2014/0334006 A1 | 11/2014 | Adib et al. | |
| 2014/0335330 A1 | 11/2014 | Bellman et al. | |
| 2014/0362444 A1 | 12/2014 | Paulson | |
| 2014/0370264 A1 | 12/2014 | Ohara et al. | |
| 2014/0376094 A1 | 12/2014 | Bellman et al. | |
| 2014/0377522 A1 | 12/2014 | Koch, III et al. | |
| 2015/0037554 A1 | 2/2015 | Gao et al. | |
| 2015/0079398 A1 | 3/2015 | Amin et al. | |
| 2015/0322270 A1 | 11/2015 | Amin et al. | |
| 2015/0323705 A1 | 11/2015 | Hart et al. | |
| 2015/0376057 A1 | 12/2015 | Koch et al. | |

FOREIGN PATENT DOCUMENTS

| | | | |
|---|---|---|---|
| CA | 2141536 C | 2/1994 | B32B 17/06 |
| CN | 100360449 C | 1/2008 | C03C 17/22 |
| CN | 101236264 A | 8/2008 | |
| CN | 101349769 A | 1/2009 | G02B 1/10 |
| CN | 101356455 A | 1/2009 | G02B 5/28 |
| CN | 102681042 A | 9/2012 | |
| CN | WO2012144499 A1 | 10/2012 | B32B 9/00 |
| CN | 202661651 U | 1/2013 | |
| CN | 102967947 A | 3/2013 | |
| CN | 103073196 A | 5/2013 | C03C 17/36 |
| CN | 103395247 A | 11/2013 | B32B 17/06 |
| CN | 103508678 | 1/2014 | C03C 17/23 |
| CN | 103707578 A | 4/2014 | B32B 17/06 |
| CN | 102736136 B | 4/2015 | |
| EP | 0566271 A2 | 10/1993 | C03C 17/22 |
| EP | 592986 B1 | 8/1998 | B32B 15/04 |
| EP | 1289898 B1 | 8/2012 | C03C 17/22 |
| EP | 1490715 B1 | 2/2013 | G02B 5/08 |
| EP | 2628818 B1 | 10/2016 | |
| JP | 63238260 A | 10/1988 | C23C 14/06 |
| JP | 07035267 | 4/1995 | |
| JP | 2974879 | 9/1999 | |
| JP | 02974879 B2 | 11/1999 | C23C 16/06 |
| JP | 2000171601 A | 6/2000 | C03C 17/34 |
| JP | 2000171605 A | 6/2000 | H04N 5/65 |
| JP | 2000214302 | 8/2000 | G02B 1/11 |
| JP | 2001303246 A | 10/2001 | C03C 17/22 |
| JP | 2002174810 A | 6/2002 | G02F 1/1333 |
| JP | 2003131011 A | 5/2003 | G02F 1/1335 |
| JP | 2003285343 | 10/2003 | |
| JP | 2005114649 A | 4/2005 | |
| JP | 2005274527 | 10/2005 | G04B 39/00 |
| JP | 2007099557 A | 4/2007 | C03C 21/00 |
| JP | 2007156017 A | 6/2007 | G02B 1/11 |
| JP | 2007527328 A | 9/2007 | B32B 18/00 |
| JP | 2007271958 | 10/2007 | G02B 1/11 |

(56) References Cited

FOREIGN PATENT DOCUMENTS

| | | | |
|---|---|---|---|
| JP | 2008033348 | 2/2008 | |
| JP | 04250834 B2 | 4/2009 | ............ C23C 14/34 |
| JP | 2009116218 A | 5/2009 | ............ G02B 1/11 |
| JP | 2009116219 A | 5/2009 | ............ G02B 1/11 |
| JP | 2009116220 A | 5/2009 | ............ G02B 1/11 |
| JP | 2009265601 A | 11/2009 | ............ G02B 6/40 |
| JP | 04421142 B2 | 2/2010 | |
| JP | 2010202514 A | 9/2010 | ............ C03C 3/083 |
| JP | 04612827 B2 | 1/2011 | |
| JP | 2011017782 | 1/2011 | ............ G02B 1/11 |
| JP | 2011017782 A | 1/2011 | |
| JP | 2011057547 A | 3/2011 | ............ C03C 3/083 |
| JP | 2011093728 A | 5/2011 | ............ C03B 23/203 |
| JP | 04707656 B2 | 6/2011 | ............ G02B 1/11 |
| JP | 2011133800 A | 7/2011 | ............ G09F 9/00 |
| JP | 2011134464 | 7/2011 | ............ H01B 5/14 |
| JP | 04765069 B2 | 9/2011 | ............ C23C 24/08 |
| JP | 04790396 B2 | 10/2011 | ............ G02B 1/11 |
| JP | 2012171866 A | 9/2012 | ............ C03C 17/34 |
| JP | 2012189760 | 10/2012 | |
| JP | 2012230290 | 11/2012 | |
| JP | 2013252992 A | 12/2013 | ............ C03C 17/34 |
| JP | 2014194530 A | 10/2014 | |
| JP | 2015058605 | 3/2015 | |
| KR | 2014034172 A | 3/2004 | ............ C08L 83/10 |
| KR | 1103041 B1 | 1/2012 | ............ G02B 1/11 |
| KR | 1194257 B1 | 10/2012 | ............ H01L 31/04 |
| KR | 2013031689 A | 3/2013 | ............ B32B 17/06 |
| TW | I245919 B | 12/2005 | |
| WO | WO97/13003 A2 | 4/1997 | ............ C23C 14/00 |
| WO | 9837254 A2 | 8/1998 | ............ C23C 14/00 |
| WO | WO98/37254 | 8/1998 | ............ C23C 14/00 |
| WO | 0037384 | 6/2000 | ............ C03C 17/36 |
| WO | 0242834 A2 | 5/2002 | ............ G03B 21/56 |
| WO | 2006099765 A1 | 9/2006 | ............ C03C 17/00 |
| WO | WO2013001023 A1 | 1/2013 | ............ C03C 17/00 |
| WO | 2013/088856 A1 | 6/2013 | ............ G09F 9/00 |
| WO | WO2013098641 A2 | 7/2013 | |
| WO | 2013/160233 | 10/2013 | ............ G02B 1/10 |
| WO | WO2014167293 | 10/2014 | ............ C03C 17/34 |
| WO | 2014182639 | 11/2014 | |
| WO | 2015/031428 | 3/2015 | |
| WO | 2015041257 | 3/2015 | |
| WO | 2015076914 | 5/2015 | |
| WO | 2015085283 | 6/2015 | |
| WO | 2015/142837 | 9/2015 | |
| WO | 2015/179739 | 11/2015 | |

OTHER PUBLICATIONS

PCT International Search Report and Written Opinion, International Application No. PCT/US2014/055281, Mar. 13, 2015.

Portinha et al., "Hard ZrO2/Al2O3 nanolamianted PVD coatings evaluated by nanoindentation", Surface & Coatings Technology 200 (2005) 765-768.

Li et al, "Low-temperature magnetron sputter deposition, hardness and electrical resistivity of amorphous and crystalline alumina thin films" Journal of Vacuum Science & Technology A 18, 2333 (2000). (See copy).

Moghal et al., "Nanomechanical study of thin film nanocomposite and PVD thin films on polymer substrate for optical applications", J. Phys. D: Appl. Phys. 46 (2013).

Normand D. Corbin, Aluminum Oxynitride Spinel (ALON): A Review, Jul. 1987, Journal of the European Ceramic Society vol. 5, Issue 3, 1989, pp. 143-154.

Duncan T. Moore, "Gradient Index Optics: A Review," Applied Optics, vol. 19, No. 7, Apr. 1, 1980.

Patent Cooperation Treaty International Notification of Transmittal of the International Search Report and The Written Opinion of the International Searching Authority, international application No. PCT/US2014/036873: mailing date Aug. 26, 2014, 13 pages.

Patent Cooperation Treaty International Notification of Transmittal of the International Search Report and The Written Opinion of the International Searching Authority, international application No. PCT/US2014/036090: mailing date Aug. 22, 2014, 12 pages.

Patent Cooperation Treaty International Notification of Transmittal of the International Search Report and The Written Opinion of the International Searching Authority, international application No. PCT/US2014/036872: mailing date Aug. 26, 2014, 13 pages.

Patent Cooperation Treaty International Notification of Transmittal of the International Search Report and The Written Opinion of the International Searching Authority, international application No. PCT/US2014/055282: mailing date Nov. 20, 2014, 14 pages.

Lee M. Goldman et al., "Scale Up of Large ALON Windows", Window and Dome Technologies and Materials XIII, edited by Randal W. Tustison, Brian J. Zelinski,Proc. of SPIE vol. 8708, 870804.

James W. McCauley, et al, "AlON: A brief history of its emergence and evolution." Journal of the European Ceramic Society 29 (2009), 223-236.

Jonghoon Baek, James Ma, Michael F. Becker, John W.Keto, Desiderio Kovar. "Correlations between optical properties, microstructure, and processing conditions of Aluminum nitride thin films fabricated by pulsed laser deposition." Elsevier, Thin Solid Films 515 (2007) 7096-7104.

B. Bitterlich, K. Friederich. "Particle-reinforced SiAlONs for Cutting Tools." Materials Science Forum vol. 554 (2007) pp. 129-134.

R. Boichot, N. Coudurier, F. Mercier, S. Lay, A. Crisci, S. Coindeau, A. Claudel, E. Blanquet, M. Pons. "Epitaxial growth of AlN on c-plane sapphire by High Temperature Hydride Vapor Phase Epitaxy: Incluence of the gas phase N/Al ratio and low temperature protective layer." Elsevier, Surface & Coatings Technology 237 (2013) 118-125.

D. Chen, X.L. Ma, Y.M. Wang. "Thickness-dependent structural transformation in the AlN film." Elsevier, Acta Materialia 53 (2005) 5223-5227.

Cinzia Caliendo and Patrizia Imperatori. "Structural, optical, and acoustic characterization of high-quality AlN thick films sputtered on Al2O3 (001) at temperature for GHz—band electroacoustic devices applications." Journal of Applied Physics 96, No. 5, 2610 (2004).

K. Ait Aissa, A. Achour, J. Camus, L. Le Brizoual, P.-Y. Jouan, M.-A. Djouadi. "Comparison of the structural properties and residual stress of AlN films deposited by dc magnetron sputtering and high power impulse magnetron sputtering at different working pressures." Elsevier, Thin Solid Films, 550 (2014) 264-267.

T. Easwarakhanthan, S.S. Hussain, and P. Pigeat. "Spectroellipsometric investigation of optical, morphological, and structural properties of reactively sputtered polycrystalline AlN films." J. Vac. Sci. Technology A 28 (3), pp. 495-501, May/Jun. 2010.

J. Gazda, J. Zhao, P.Smith, and R.A. White. "Formation of ALN films on Ti/TiN Arc-Layer Interface with Al-0.5% Cu Interconects evaluated by XPS and Energy-filtered-TEM." Mat. Res. Soc. Symp. Proc. vol. 589, 365-370, 2001.

Fatemeh Hajakbari, Majid Mojtahedzadeh Larijani, Mahmood Ghoranneviss, Morteza Aslaninejad, and alireza Hojabri. "Optical Properties of Amorphous AlN Thin Films on Glass and Silicon Substrates Grown by Single Ion Beam Sputtering." Jpn. J. Appl. Phys. 49, 095802 (2010).

VN Inkin, GG Kirpilenko, AJ Kolpakov. "Properties of aluminium nitride coating obtained by vacuum arc discharge method with plasma flow separation." Elsevier, Diamond and Related Materials, 10 (2001) 1314-1316.

Takashi Ishiguro, Masato Nishimura and Takashi Yamazaki. "Solar Light Absorption Property of Sputtered Al1-N. Films with Enhanced Surface Roughness during Film Growth." Jpn. J. Appl. Phys. vol. 41 (2002) pp. 292-300.

XS Miao and YC Chan. "Optical Properties and Reactive Sputtering Conditions of AlN and AlSiN Thin Films for Magneto-Optical Applications." Journal of Electronic Materials, vol. 26, No. 1, 1997.

JA Savage. "Preparation and properties of hard crystalline materials for optical applications—a review." Journal of Crystal Growth 113 (1991) 698-715.

(56) References Cited

OTHER PUBLICATIONS

Krupitskaya, Auner. "Optical Characatization of AlN Films Grown by Plasma Source Molecular Beam Epitaxy." Journal of Applied Physices 84, 2861-2865, 1998.

Yamashita, Michihiro; Okuda, Kazuhid; Watanabe, Yasumitsu. "Preparation and Properties of A1ON-SiA1ON Composites." Jpn. Kokai Tokkyo Koho, 109, 434-439, 2001.

Bernd Schroter, Aimo Winkelmann, Wolfgang Richter. "X-ray photoelectron diffraction on SiC and AlN epitaxial films: polytype structure and polarity." Elsevier, Journal of Electron Spectroscopy and Related Phenomena. 114-116 (2001) 443-450.

Atul Vir Singh, Sudhir Chandra, AK Srivastava, BR Chakroborty, G Sehgal, MK Dalai, G Bose. "Structural and optical properties of RF magnetron sputtered aluminium nitride films without external substrate heating." Elsevier, Applied Surface Sceince 257 (2011) 9568-9573.

Tsui, et al., "Effects of Adhesion on the Measurement of Thin Film Mechanical Properties by Nanoindentation." Mat. Res. Soc. Symp. Proc. vol. 473 1997.

X Wang, A Kolitsch, and W Moller. "Roughness Improvement and Hardness Enhancement in Nanoscale Al/AlN Multilayered Thin Films." Applied Physics Letters vol. 71, No. 14, 1951-1953, Oct. 6, 1997.

Yoshihisa Watanabe, Yuji Hara, Takeshi Tokuda, Nobuaki Kitazawa, and Yoshikazu Nakamura. "Surface Oxidation of Aluminum Nitride Thin Films." Surface Modification Technologies XIII, Edited by Sudarshan, Khor, Jeandin, ASM International, Materials Park, Ohio, 1999. pp. 209-215.

Hiroshi Yamashita and Akira Yamaguchi. "Preparation and Properties of A1On-SiA1ON Composites." Journal of the Ceramic Society of Japan 109, pp. 434-439, 2001.

JS Zabinski, JJ Hu, JE Bultman, NA Pierce, AA Voevodin. "Stoichiometry and characterization of aluminium oxynitride thin films grown by ion-beam assisted pulsed laser deposition." Elsevier, Thin Solid Films, 516, pp. 6215-6219, 2008.

Shyang-ho Chi, Yen-Ling Chung. "Cracking in coating-substrate composites with multi-layered and FGM coatings." Engineering Fracture Mechanics, vol. 70, 1227-1243, 2003.

B. Reinhold, H.J. Spies. "Plasma Nitriding of Aluminum Alloys." Proceedings of the 1st International Automotive Heat Treating Conference. Jul. 13-15, 1998.

Wang,Qimin;Wu, Yingna; Ji, Ailing; Ke, Peiling; Sun, Chao; Huang, Rongfang; Wen, Lishi. "Study of ALON and CRON films deposited by arc ion plating as diffusion barriers." Jinshu Xuebao (2004), 40, 1, 83-87.

Hirai, Shinji; Miwa, Tetsuya; Iwata, Tsutomu; Ozawa, Masayoshi; Katayama, Hiroshi G."Formation of Aluminum Nitride by Carbothermic Reduction of Alumina in a Flowing Nitrogen Atmosphere."Nippon Kinzoku Gakkaishi (1989, 53 (10), 1035-40.

Xi, Zhong-hong, Li, Hai-Yi. "The Preparation and Optical properties of AlN Thin Films." Diwen Wuli Xuebao (2012), 34)6), 467-470.

Urushidani, Tanio; Kasahara, Takashi. "Etalon-Type Optical Filters, Their Modules, Spectrometers, and Optical Devices." Jpn. Kokai Tokkyo Koho, 2012.

Urushidani, Tanio; Kigahara, Koji. "Optical Filters Including Optical Films Covered with Thickness-Controlled Dielectric Films, and Optical Filter Modules, Spectrometers and Optical Apparatus Containing Them." 2012.

Yamamoto, Yuji; Hashizume, Haruo. "Manufacture of IR-Reflecting Bent Plate Glass." Jpn. Kokai Tokkyo Koho, 1988.

Xi, Zhong-hong; Li, Hai-yi. "The Preparation and Optical Properties of AlN Thin Films." Diwen Wuli Xuebao, 34, 467-470, 2012.

Wen, Mao et al. "The AlN layer thickness dependent coherent epitaxial growth, stress and hardness in NbN/AlN nanostructured multi-layer films." Surface and Coatings Technology 235 (2013) 367-375.

Yan, Feng , Liu, Zhengtang, Liu, Wenting. "The Preparation and Properties of Y2O3/AlN Anti Reflection Films on Chemical Vapor Deposition Diamond."Elsevier, Thin Solid Films, 520, pp. 734-738, 2011.

Huang, Meidong; Zhang, Linlin; Wang, Lige; Tong, Lina; Li, Xiaona; Dong, Chuang. "Effects of Substrate Temperature on Aluminum Nitride Films by Reactive Magnetron Sputtering." Xiyou Jinshu, 35 (5), pp. 715-718, 2011.

Borges, J.; Alves, E.: Vax, F.; Marques, L. "Optical Properties of AlNxOy Thin Films Deposited by DC Magnetron Sputtering." Proceedings of SPIE, 2011.

Yang, Shi-cai; Abduleziz, Ablat; Jian, Ji-Kang; Zheng, Yu-feng; Sun, Yan-fei; Wu, Rong. "Preparation and Properties of AlN Thin Films by Pure Nitrogen Reactive Sputtering." Rengong Jingti Xuebao, 39 (1), pp. 190-196, 2010.

Yang, Shi-cai; Abduleziz, Ablat; Jian, Ji-kang; Zheng, Yu-feng; Sun, Yan-fei; Wu, Rong. "Preparation and Properties of C-Axis Preferred Orientation AlN Thin Films by Pure Nitrogen Reactive Sputtering." Xianjiang Daxue Xuebao, Ziran Kexueban, 26 (4), pp. 444-449, 2009.

Zayats, Boiko, Gentsar, Litvin, Papusha, Sopinskii. "Optical Studies of AlN/n-Si(100) Films Obtained by the Method of High-Frequency Magnetron Sputtering.".

M.B. Assouar; O. Elmazria; M El Hakiki; and P. Alnot. "Study of Acoustical and Optical Properties of AlN Films for SAW and BAW Devices: Correlation Between These Properties." Integrated Ferroelectrics, 82: 45-54, 2006.

Chen, Skromme, Chen, Sun, Yang, Khan, Nakarmi, Lin, Jiang, Reitmeyer, Davis, Dalmau, Schlesser, and Sitar. "Optical Reflectance of Bulk AlN Crystals and AlN Epitaxial Films." AIP Conference Proceedings, 772, 297-298, 2005.

Yun, F., et al.. "Optical and Structural Investigation of AlN Grown on Sapphire with Reactive MBE Using RF Nitrogen or Ammonia." Mat. Res. Soc. Symp. Proc., vol. 764, 2003.

Danylyuk, et al.. "Optical and Electrical Properties of Al 1-x InxN Films Grown on Sapphire (0001) by Plasma Source Molecular Beam Epitaxy." Mat. Res. Soc. Symp., vol. 639, 2001.

Mania, Ryszard. "Magnetron Sputtering for Deposition of Aluminum Nitride Thin Films." Prace Komisji Nauk Ceramiczynych, 54, 429-433, 1997.

Chi et. al. "Cracking in coating-substrate composites with multilayered and FGM coatings," Engineering Fracture Mechanics 70 (2003) p. 1227.

Afanasyev-Charkin et al; "Hard Si-N-C films with a tunable band gap produced by pulsed glow discharge deposition"; Surface & Coatings Technology; 199 (2005) 38-42.

Chang et al; "Characteristics of Si-C-N. films deposited by microwave plasma CVD on Si wafers with various buffer layer materials" Diamond and Related Materials; 10 (2001) 1910-1915.

Huang et al; "Effect of deposition conditions on mechanical properties of low-temperature PECVD silicon nitride films"; Materials Science and Engineering A 435-436 (2006) 453-459.

PCT/US2015/043161 Search Report Dated Dec. 3, 2015.

PCT/US2015/030116 PCT Search Dated Jan. 12, 2016.

Koch III et al; U.S. Appl. No. 14/828,114 titled "Scratch-Resistant Laminates With Retained Optical Properties" filed Aug. 17, 2015.

Adib et al; U.S. Appl. No. 14/812,562 titled "Scratch-Resistant Materials and Articles Including the Same" filed Jul. 29, 2015.

Xu et al; "Chemical control of physical properties in silicon nitride films"; Appl Phys A (20163) 111: 867-876.

Godeker et al., "Antireflection coating for sapphire with consideratino of mechanical properties", Surface & Coatings Technology, 241 (2014) 59-63.

Gpi: http://generalplasma.com/products/large-area-pecvd/.

Madocks et al Durable Neutral Color Anti-Reflective Coating for Mobile Displays; SVC Bulletin Fall 2014 3 pages.

Martinet er al; "Deposition of SiO2 and TiO2 thin films by plasma enhanced chemical vapors deposition for antireflection coating", J. Non-Crystalline Solids; 216 (1997) 77-82.

Southwell, "Coating design using very thin high—and low-index layers," Applied Optics, vol. 24, Issue 4, pp. 457 (1985).

Carniero et al. "Hardness Evaluation of Nanolayered PVD Coatings Using Nanoindentation", Rev. Adv. Mater. Sci., 2014 p. 83-90.

(56) References Cited

OTHER PUBLICATIONS

Oliver et al. "An improved technique for determining hardness and elastic modulus using load and displacement sensing indentation experiments". J. Mater. Res., vol. 7, No. 6, 1992, 1564-1583.
Oliver et al. "Measurement of Hardness and Elastic Modulus by Instrument Indentation: Advances in Understanding and Refinements to Methodology". J. Mater. Res., vol. 19, No. 1, 2004, 3-20.
International Search Report and Written Opinion PCT/US2016/051488 Dated Nov. 21, 2016.
Chinese First Office Action CN201480037881.2 Dated Aug. 3, 2016.
Chinese First Office Action CN20140038909.4 Dated Aug. 3, 2016.
English Translation of JP2016512997 First Office Action Dated Jul. 5, 2016; 6 Pages; Japanese Patent Office.
CN201480061989.5 First Office Action Dated Jan. 4, 2017, China Patent Office.
US2007018871 (counterpart of Korean Patent Publication No. 2006-0058712).
Korean Patent Application No. 10-2015-7034640 Office Action Mailed Feb. 5, 2016.
English Translation of CN201480037881.2 Office Action Dated Mar. 24, 2017, China Patent Office.

* cited by examiner

SCRATCH-RESISTANT ARTICLES WITH A GRADIENT LAYER

This application claims the benefit of priority under 35 U.S.C. §119 of U.S. Provisional Application Ser. No. 61/954,767, filed on Mar. 18, 2014, U.S. Provisional Application Ser. No. 61/877,568, filed on Sep. 13, 2013, and U.S. Provisional Application Ser. No. 61/820,407, filed on May 7, 2013, the contents of which are relied upon and incorporated herein by reference in its entirety.

BACKGROUND

The disclosure relates to scratch-resistant articles with retained optical properties and more particularly to articles that exhibit low color shift when viewed at different incident illumination angles and a high hardness.

Cover substrates are often used in consumer electronic products to protect critical devices within the product, to provide a user interface for input and/or display, and/or many other functions. Such consumer electronic products include mobile devices, such as smart phones, mp3 players and computer tablets. These applications and others also often demand durable (e.g., scratch-resistant) cover substrate, which also has strong optical performance characteristics. Often, the cover substrate includes glass for this purpose.

Strong optical performance in terms of maximum light transmittance and minimum reflectance are required in cover substrate applications. Furthermore, cover substrate applications require that the color exhibited or perceived, in reflection and/or transmission, does not change appreciably as the viewing angle (or incident illumination angle) is changed. This is because, if the color in reflectivity or transmission changes with viewing angle to an appreciable degree, the user of the product incorporating the cover glass will perceive a change in the color or brightness of the display, which can diminish the perceived quality of the display. Of these changes, a change in color is often the most noticeable and may be the most objectionable to users.

Known cover substrates include glass and film combinations that often exhibit scratches after use in harsh operating conditions. Evidence suggests that the damage caused by sharp contact that occurs in a single event is a primary source of visible scratches in such glass-film cover substrates used in mobile devices. Once a significant scratch appears on the cover substrate, the appearance of the product is degraded since the scratch causes an increase in light scattering, which may cause significant reduction in brightness, clarity and contrast of images on the display. Significant scratches can also affect the accuracy and reliability of touch sensitive displays. These scratches, and even less significant scratches, are unsightly and can affect product performance.

Single event scratch damage can be contrasted with abrasion damage. Cover substrates do not typically experience abrasion damage because abrasion damage is typically caused by reciprocating sliding contact from hard counter face objects (e.g., sand, gravel and sandpaper). Instead, cover substrates used in display applications typically endure only reciprocating sliding contact from soft objects, such as fingers. In addition, abrasion damage can generate heat, which can degrade chemical bonds in the film materials and cause flaking and other types of damage to the cover glass. In addition, since abrasion damage is often experienced over a longer term than the single events that cause scratches, the film material experiencing abrasion damage can also oxidize, which further degrades the durability of the film and thus the glass-film laminate. The single events that cause scratches generally do not involve the same conditions as the events that cause abrasion damage and therefore, the solutions often utilized to prevent abrasion damage may not be applicable to prevent scratches in cover substrates. Moreover, known scratch and abrasion damage solutions often compromise the optical properties.

Accordingly, there is a need for new cover substrates, and methods for their manufacture, which are scratch resistant and have good optical performance.

SUMMARY

One aspect of the present disclosure pertains to an article including a substrate with a surface and an optical film disposed on the surface forming a coated surface. The article of one or more embodiments exhibits a color shift of less than 2, when viewed at an incident illumination angle in the range from about 0 degrees to about 60 degrees from normal incidence under an illuminant. In some embodiments, the article exhibits an average transmittance of at least 80% over the optical wavelength regime. The article of one or more embodiments exhibits an average transmittance or average reflectance having an average oscillation amplitude of about 10 percentage points or less, over an optical wavelength regime. In some instances, the average transmittance exhibited by the article over a selected wavelength of about 100 nm over the optical wavelength regime has a maximum oscillation amplitude of about 5 percentage points. In other instances, the transmittance exhibited by the article over a selected wavelength of about 100 nm over the optical wavelength regime has a maximum oscillation amplitude of about 3 percentage points.

The optical film may include at least one of $Al_2O_3$, $Nb_2O_5$, $TiO_2$, $Ta_2O_5$, $HfO_2$, $Y_2O_3$, $AlO_xN_y$, $SiO_xN_y$, $SiN_x$, and $SiAl_xO_yN_z$.

The optical film of one or more embodiments includes a plurality of layers. The thickness of the optical film may be in the range from about 0.5 μm to about 3 μm. In some embodiments, the optical film has a first surface disposed on the substrate and a second surface. In such embodiments, the first surface has a first refractive index and the second surface has a refractive index that is greater than the first refractive index. The optical film of one or more embodiments includes a refractive index gradient with a refractive index that increases from the first surface to the second surface along the thickness. In some embodiments, the refractive index gradient includes a positive slope gradient. The refractive index may increase along the refractive index gradient at an average rate in the range from about 0.2/μm to about 0.5/μm. The refractive index gradient of one or more embodiments may be in the range from about 1.5 to about 2.0. The refractive index gradient may include a first refractive index at the first surface of the optical film in the range from about 1.4 to about 1.65 and a second refractive index at the second surface of the optical film in the range from about 1.7 to about 2.2.

The optical film may include a compositional gradient. In some instances, the compositional gradient includes at least two of Si, Al, N, and O.

The optical film of one or more embodiments may include an optical modifying layer, and wherein the optical modifying layer comprises the first surface and the second surface opposite from the first surface of the optical film. In such embodiments, the optical modifying layer includes at least a portion or all of the refractive index gradient.

The optical film of one or more embodiments has an average hardness in the range from about 5 GPa to about 30 GPa or from about 8 GPa to about 50 GPa, as measured on the coated surface (of the article) by indenting the coated surface with a Berkovitch indenter to form an indent having an indentation depth of at least about 100 nm from the surface of the coated surface. The optical film may exhibit an average transmittance of 80% or more, over an optical wavelength regime. In accordance with one or more embodiments, the optical film includes a scratch resistant layer. In one or more alternative embodiments, the optical film includes a porosity gradient, a density gradient, an elastic modulus gradient or a combination thereof. In one variant, the optical film includes a scratch resistant layer, and a gradient that suppresses the growth of cracks that are bridging between the substrate and the scratch resistant layer. In another variant the suppression of crack growth is provided by a porosity gradient. In one example, the porosity gradient includes a plurality of nanopores. In another example, the optical film has a region with a thickness of about 50 nm or greater that has an average porosity in the range from about 10% to about 60%.

A second aspect of the present disclosure pertains to a method of forming an article as described herein. In one or more embodiments, the method includes providing a substrate having a major surface, disposing an optical film having a thickness on the major surface, and creating a refractive index gradient along at least a portion of the thickness of the optical film. In one or more embodiments, the substrate includes an amorphous substrate or a crystalline substrate. The article may exhibit an average light transmittance or an average light reflectance having an average amplitude of less than about 5%, over the optical wavelength regime. In accordance with one or more embodiments, the method includes creating a refractive index gradient comprises varying the composition of the optical film along the at least a portion of the thickness of the optical film. Varying the composition of the optical film can include increasing one or more of an oxygen content, nitrogen content, silicon content and aluminum content along at least a portion of the thickness of the optical film. Alternatively or additionally, creating a refractive index gradient includes varying the porosity of the optical film along the thickness. In one example, the porosity is in the range from about 20% to about 35%.

In one or more embodiments, the method includes reducing light absorption of the optical film. Reducing light absorption of the optical film can include exposing the optical film an elevated temperature and/or light, as the optical film is disposed on the surface. In some embodiments, exposing the optical film to an elevated temperature may include a temperature in the range from about 75° C. to about 300° C.

Additional features and advantages will be set forth in the detailed description which follows. Additional features and advantages will be readily apparent to those skilled in the art from that description or recognized by practicing the embodiments described herein and in the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiment(s), and together with the description, serve to explain principles and operation of the various embodiments.

DETAILED DESCRIPTION

Figure 1:
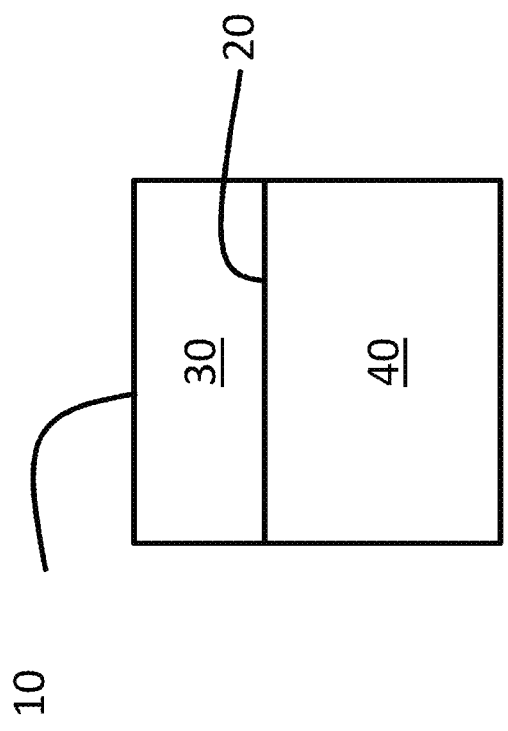
FIG. 1 is an illustration of a known substrate and a scratch-resistant material embodiment.

Reference will now be made in detail to various embodiment(s), examples of which are illustrated in the accompanying drawings. Whenever possible, the same reference numerals ill be used throughout the drawings to refer to the same or like parts.

Known scratch-resistant materials, such as MN, $Si_3N_4$, $AlO_xN_y$, and $SiO_xN_y$, have high refractive indices, for example, in the range from about 1.7 to about 2.1. Common substrates that include scratch-resistant materials are glass and plastic substrates. Glass and plastic materials typically have refractive indices in the range from about 1.45 to about 1.65. This difference in the refractive index of the scratch-resistant materials and the substrate can contribute to undesirable optical interference effects. These undesirable optical interference effects may be more pronounced where the scratch-resistant materials have a physical thickness in the range from about 0.05 to about 10 microns. Optical interference between reflected waves from the scratch-resistant material/air interface 10 (as shown in FIG. 1) and the scratch-resistant material/substrate interface 20 (as shown in FIG. 1) can lead to spectral reflectance oscillations that create apparent color in the scratch-resistant materials 30 (and/or the combination of the scratch-resistant materials 30 and substrate 40), particularly in reflection. The color shifts in reflection with viewing angle due to a shift in the spectral reflectance oscillations with incident illumination angle. The observed color and color shifts with incident illumination angle are often distracting or objectionable to device users, particularly under illumination with sharp spectral features such as fluorescent lighting and some LED lighting.

Figure 2:
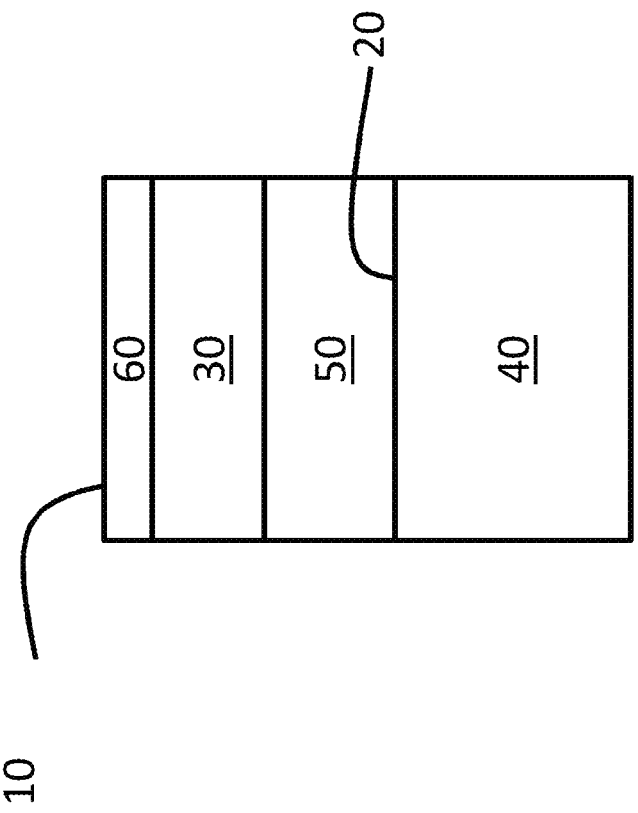
FIG. 2 is an illustration of a known article including a single layer interference layer.
Figure 3:
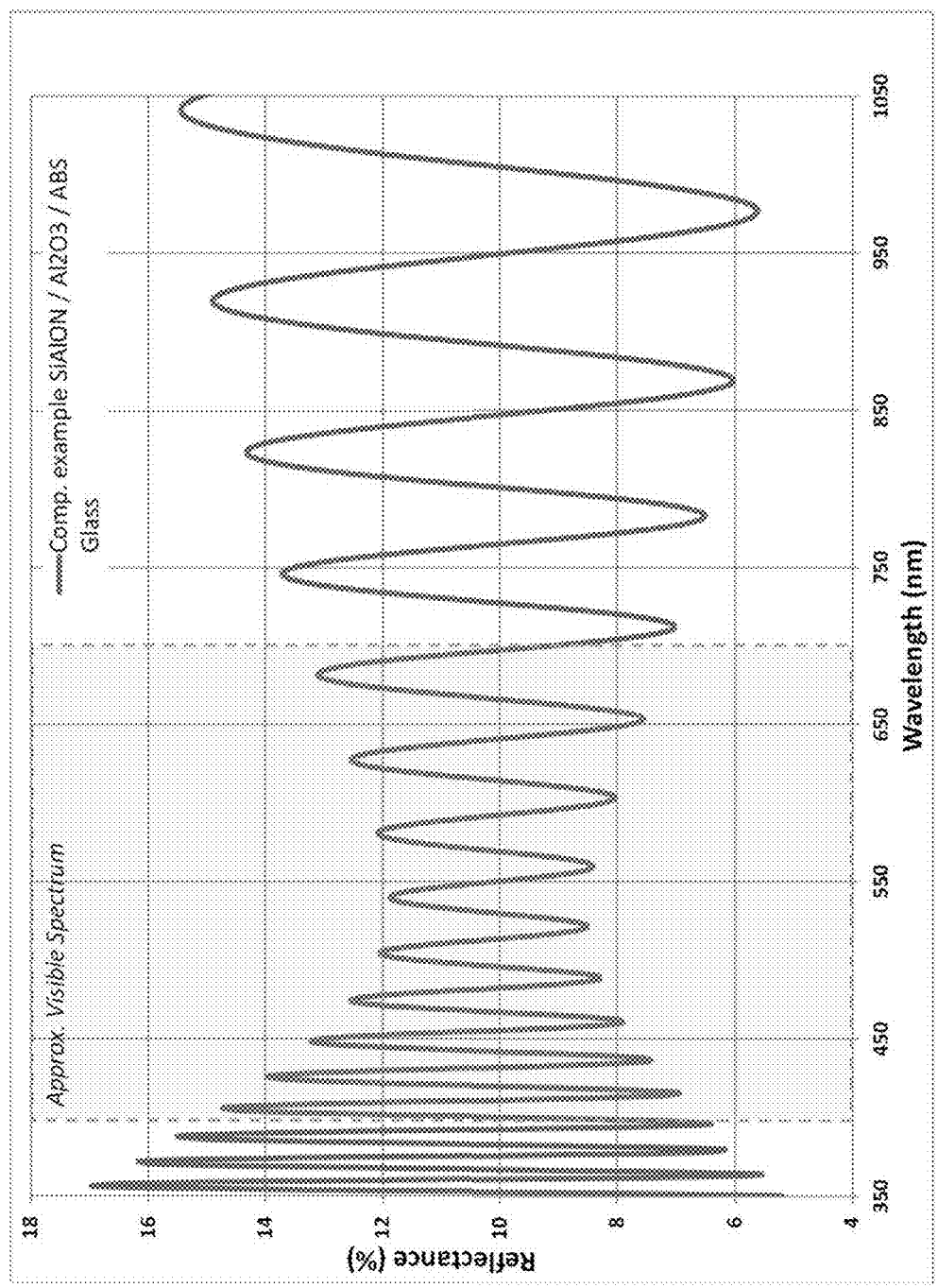
FIG. 3 is a reflectance spectra for the article shown in FIG. 2.

Observed color and color shifts can be reduced by minimizing the reflectance at one or both interfaces 10, 20, thus reducing reflectance oscillations and reflected color shifts for the entire article. For scratch-resistant materials, the reduction in reflectance is often most feasible at the scratch-material/substrate interface 20, while simultaneously retaining the high durability or scratch resistance of the scratch-resistant materials/air interface 10. Various ways to reduce reflectance include the use of a single optical interference layer (as shown in FIG. 2) at the scratch-resistant material/substrate interface 20. Such options, however, often exhibit large oscillations in the transmittance and/or reflectance spectra under various illuminants. A single layer interference layer is included in the article shown in FIG. 2. The article includes an alkali aluminoborosilicate glass substrate 10, a single layer interference layer 50 of $Al_2O_3$ having a physical thickness of about 80 nanometers (nm), an scratch-resistant layer 30 of $Si_uAl_vO_xN_y$ having a physical thickness of about 2000 nm, and a layer 60 of $SiO_2$ having a physical thickness of about 10 nm. FIG. 3 shows a modeled reflectance spectrum for the article illustrated in FIG. 2. The spectrum exhibits oscillations over the optical wavelength regime having amplitudes in the range from about 3.5 percentage points (e.g., a low reflectance of about 8.5% and a peak reflectance of about 12%, at the wavelength range from about 520 nm to 540 nm) to about 8 percentage points (e.g., a low reflectance of about 6.5% and a peak reflectance to about 14.5%, at the wavelength of about 400 nm to 410 nm). As used herein, the term "amplitude" includes the peak-to-valley change in reflectance or transmittance over the entire optical wavelength regime (as defined herein). As used herein, the term "transmittance" is defined as the percentage of incident optical power within a given wavelength range transmitted through a material (e.g., the article, the substrate or the optical film or portions thereof). The term "reflectance" is similarly defined as the percentage of incident optical power within a given wavelength range that is reflected from a material (e.g., the article, the substrate, or the optical film or portions thereof). Transmittance and reflectance are measured using a specific linewidth. In one or more embodiments, the spectral resolution of the characterization of the transmittance and reflectance is less than 5 nm or 0.02 eV.

Figure 4:
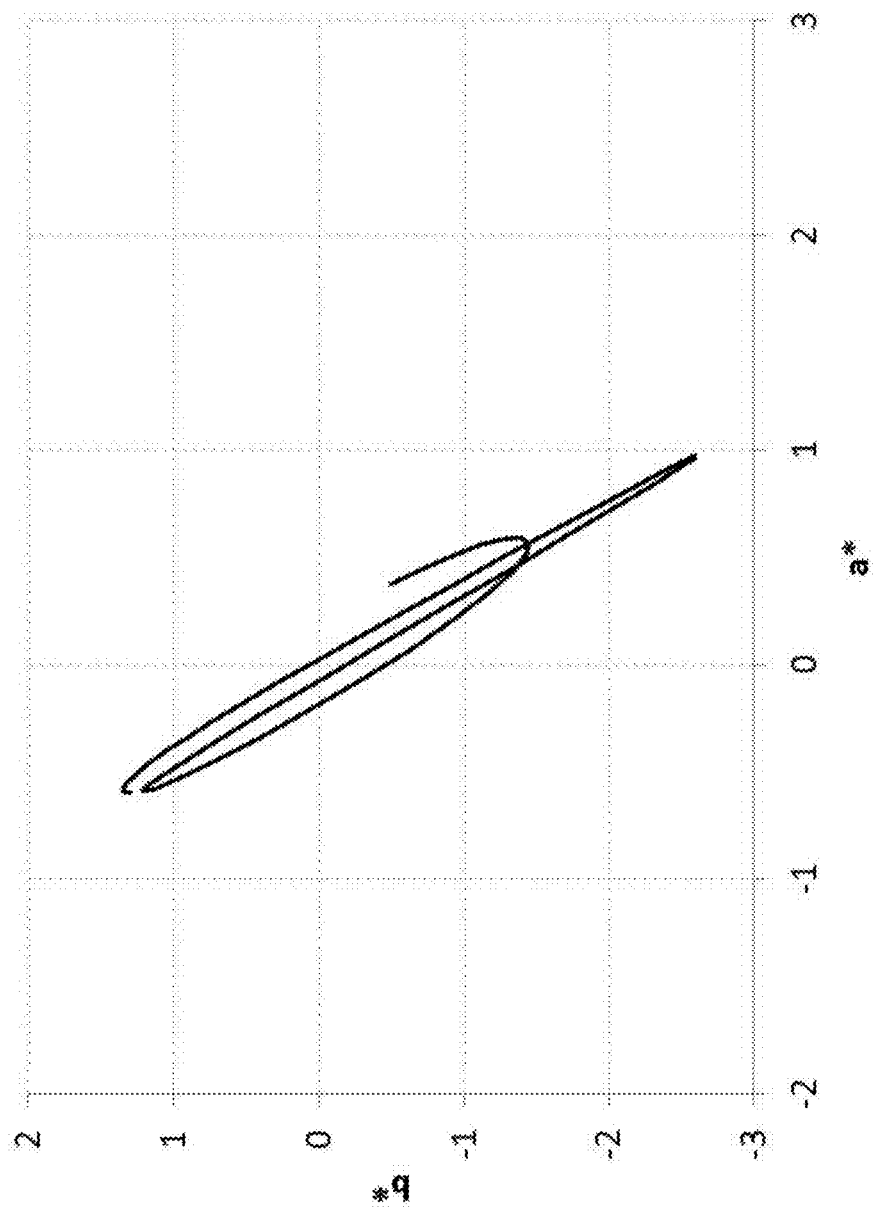
FIG. 4 is a graph showing the range of calculated a* and b* color shifts based on the reflectance spectra shown in FIG. 3.

The phrase "average amplitude" includes the peak-to-valley change in reflectance or transmittance averaged over every possible 100 nm wavelength range within the optical wavelength regime. As used herein, the "optical wavelength regime" includes the wavelength range from about 420 nm to about 700 nm. From this information, it can be calculated that the article shown in will exhibit relatively large color shifts when viewed at different incident illumination angles from normal incidence under different illuminants, as shown in FIG. 4.

The embodiments of this disclosure utilize an optical modifying layer including multiple layers disposed between the substrate and the scratch-resistant materials. The optical modifying layer achieves improved optical performance, in terms of colorlessness and/or smaller color shifts with viewed at varying incident illumination angles from normal incidence under different illuminants.

A first aspect of this disclosure pertains to an article that exhibits colorlessness even when viewed at different incident illumination angles under an illuminant. In one or more embodiments, the article exhibits a color shift of about 2 or less. As used herein, the phrase "color shift" refers to the change in both a* and b*, under the International Commission on Illumination ("CIE") L*, a*, b* colorimetry system. For example, color shift may be determined using the following equation: $\sqrt{((a^*_2-a^*_1)^2+(b^*_2-b^*_1)^2)}$, using the a* and b* coordinates of the article when viewed at normal incidence (i.e., $a^*_1$, and $b^*_1$) and at an incident illumination angle away from normal incidence (i.e., $a^*_2$, and $b^*_2$), provided that the incident illumination angle is different from normal incidence and in some cases differs from normal incidence by at least about 2 degrees or about 5 degrees. Measurements of the various colors over a collection of different observers indicate that the average observer sees a just-noticeable difference in the two colors when the color shift is of about 2.

In some instances, a color shift of about 2 or less is exhibited by the article when viewed at various incident illumination angles from normal incidence, under an illuminant. In some instances the color shift is about 1.9 or less, 1.8 or less, 1.7 or less, 1.6 or less, 1.5 or less, 1.4 or less, 1.3 or less, 1.2 or less, 1.1 or less, 1 or less, 0.9 or less, 0.8 or less, 0.7 or less, 0.6 or less, 0.5 or less, 0.4 or less, 0.3 or less, 0.2 or less, or 0.1 or less. In some embodiments, the color shift may be about 0. The illuminant can include standard illuminants as determined by the CIE, including A illuminants (representing tungsten-filament lighting), B illuminants (daylight simulating illuminants), C illuminants (daylight simulating illuminants), D series illuminants (representing natural daylight), and F series illuminants (representing various types of fluorescent lighting). In specific examples, the articles exhibit a color shift of about 2 or less when viewed at incident illumination angle from normal incidence under a CIE F2, F10, F11, F12 or D65 illuminant. The incident illumination angle may be in the range from about 0 degrees to about 80 degrees, from about 0 degrees to about 75 degrees, from about 0 degrees to about 70 degrees, from about 0 degrees to about 65 degrees, from about 0 degrees to about 60 degrees, from about 0 degrees to about 55 degrees, from about 0 degrees to about 50 degrees, from about 0 degrees to about 45 degrees, from about 0 degrees to about 40 degrees, from about 0 degrees to about 35 degrees, from about 0 degrees to about 30 degrees, from about 0 degrees to about 25 degrees, from about 0 degrees to about 20 degrees, from about 0 degrees to about 15 degrees, from about 5 degrees to about 80 degrees, from about 5 degrees to about 80 degrees, from about 5 degrees to about 70 degrees, from about 5 degrees to about 65 degrees, from about 5 degrees to about 60 degrees, from about 5 degrees to about 55 degrees, from about 5 degrees to about 50 degrees, from about 5 degrees to about 45 degrees, from about 5 degrees to about 40 degrees, from about 5 degrees to about 35 degrees, from about 5 degrees to about 30 degrees, from about 5 degrees to about 25 degrees, from about 5 degrees to about 20 degrees, from about 5 degrees to about 15 degrees, and all ranges and sub-ranges therebetween. The article may exhibit the maximum color shifts described herein at and along all the incident illumination angles in the range from about 0 to about 80, from about 0 to about 60 degrees, from about 0 to about 45 degrees, or from about 0 to about 30 degrees.

Figure 5:
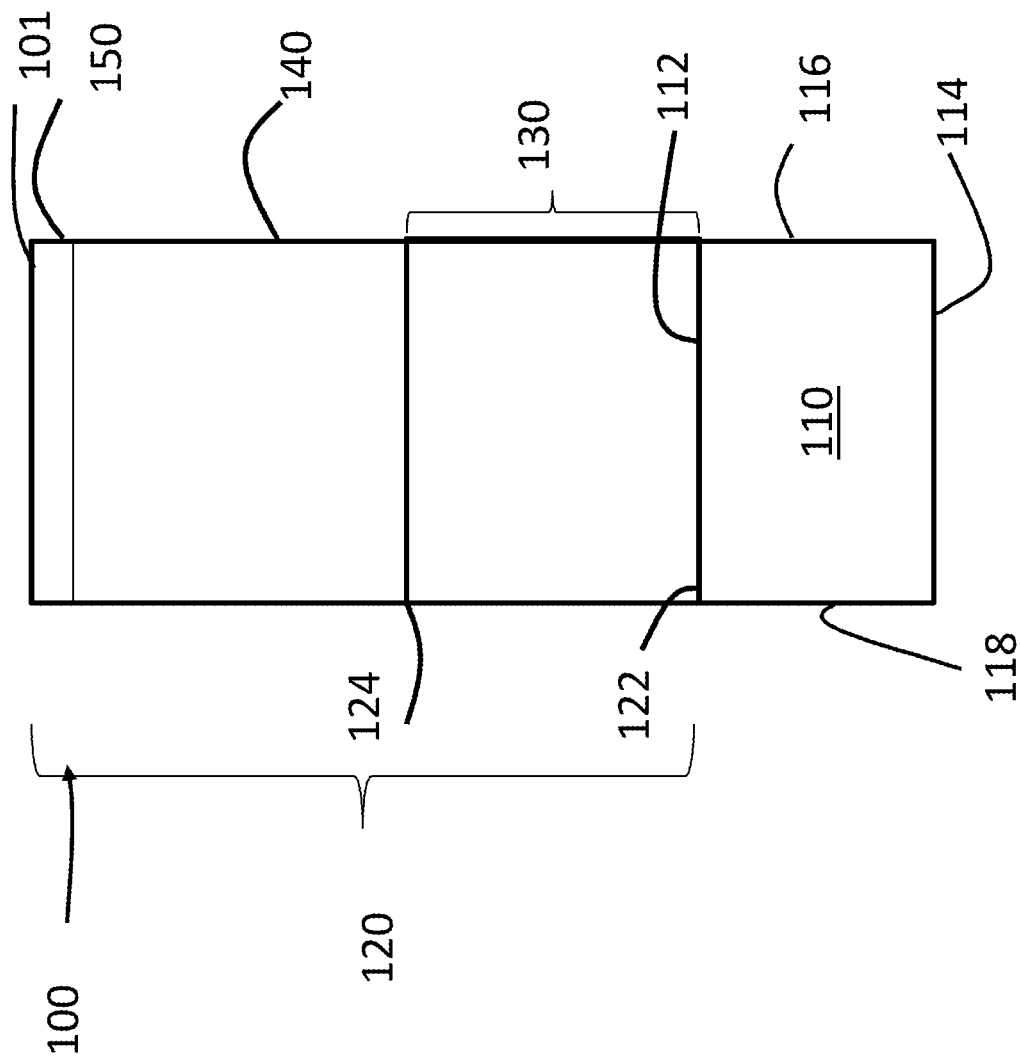
FIG. 5 is an illustration of an article according to one or more embodiments.

Referring to FIG. 5, the article 100 according to one or more embodiments may include a substrate 110, and an optical film 120 disposed on the substrate. The substrate 110 includes opposing major surfaces 112, 114 and opposing minor surfaces 116, 118. The optical film 120 is shown in FIG. 5 as being disposed on a first opposing major surface 112; however, the optical film 120 may be disposed on the second opposing major surface 114 and/or one or both of the opposing minor surfaces, in addition to or instead of being disposed on the first opposing major surface 112. The article 100 includes a coated surface 101.

The optical film 120 includes at least one layer of at least one material. The term "layer" may include a single layer or may include one or more sub-layers. Such sub-layers may be in direct contact with one another. The sub-layers may be formed from the same material or two or more different materials. In one or more alternative embodiments, such sub-layers may have intervening layers of different materials disposed therebetween. In one or more embodiments a layer may include one or more contiguous and uninterrupted layers and/or one or more discontinuous and interrupted layers (i.e., a layer having different materials formed adjacent to one another). A layer or sub-layers may be formed by any known method in the art, including discrete deposition or continuous deposition processes. In one or more embodiments, the layer may be formed using only continuous deposition processes, or, alternatively, only discrete deposition processes.

As used herein, the term "dispose" includes coating, depositing and/or forming a material onto a surface using any known method in the art. The disposed material may constitute a layer, as defined herein. The phrase "disposed on" includes the instance of forming a material onto a surface such that the material is in direct contact with the surface and also includes the instance where the material is formed on a surface, with one or more intervening material(s) is between the disposed material and the surface. The intervening material(s) may constitute a layer, as defined herein.

In one or more embodiments, the article 100 exhibits an average hardness of about 8 GPa or greater, about 10 GPa or greater, about 14 GPa or greater, about 18 GPa or greater, as measured on the coated surface 101 by indenting the coated surface with a Berkovitch indenter to form an indent having an indentation depth of at least about 100 nm from the surface of the coated surface. In some embodiments, the average hardness of the article may be in the range from about 5 GPa to about 30 GPa, from about 6 GPa to about 30 GPa, from about 7 GPa to about 30 GPa, from about 8 GPa to about 30 GPa, from about 9 GPa to about 30 GPa, from about 10 GPa to about 30 GPa, from about 12 GPa to about 30 GPa, from about 5 GPa to about 28 GPa, from about 5 GPa to about 26 GPa, from about 5 GPa to about 24 GPa, from about 5 GPa to about 22 GPa, from about 5 GPa to about 20 GPa, from about 12 GPa to about 25 GPa, from about 15 GPa to about 25 GPa, from about 16 GPa to about 24 GPa, from about 18 GPa to about 22 GPa and all ranges and sub-ranges therebetween.

In one or more embodiments, article 100 also exhibits abrasion resistance. In some embodiments, abrasion resistance is measured by known tests in the art such as those using a Crockmeter, a Taber abraser and other similar standard instruments. For example, Crockmeters are used to determine the Crock resistance of a surface subjected to such rubbing. The Crockmeter subjects a surface to direct contact with a rubbing tip or "finger" mounted on the end of a weighted arm. The standard finger supplied with the Crockmeter is a 15 millimeter (mm) diameter solid acrylic rod. A clean piece of standard crocking cloth is mounted to this acrylic finger. The finger then rests on the sample with a pressure of 900 g and the arm is mechanically moved back and forth repeatedly across the sample in an attempt to observe a change in the durability/crock resistance. The Crockmeter used in the tests described herein is a motorized model that provides a uniform stroke rate of 60 revolutions per minute. The Crockmeter test is described in ASTM test procedure F1319-94, entitled "Standard Test Method for Determination of Abrasion and Smudge Resistance of Images Produced from Business Copy Products," the contents of which are incorporated herein by reference in their entirety. Crock resistance or durability of the coated articles described herein is determined by optical (e.g., reflectance, haze, or transmittance) measurements after a specified number of wipes as defined by ASTM test procedure F1319-94. A "wipe" is defined as two strokes or one cycle, of the rubbing tip or finger.

According to one or more embodiments, the article 100 exhibits an average transmittance of about 80% or greater over the optical regime. In one or more embodiments, the article 100 has a total reflectance (which includes specular and diffuse reflectance) of about 20% or less. As used herein, the term "transmittance" is defined as the percentage of incident optical power within a given wavelength range transmitted through a material (e.g., the laminate, the inorganic oxide substrate or the optical film structure or portions thereof). The term "reflectance" is similarly defined as the percentage of incident optical power within a given wavelength range that is reflected from a material (e.g., the laminate, the inorganic oxide substrate or the optical film structure or portions thereof). Transmittance and reflectance are measured using a specific linewidth. In one or more embodiments, the spectral resolution of the characterization of the transmittance and reflectance is less than 5 nm or 0.02 eV.

The article 100 of specific embodiments may exhibit an average transmittance of about 80% or greater, about 82% or greater, about 85% or greater, about 90% or greater, about 90.5% or greater, about 91% or greater, about 91.5% or greater, about 92% or greater, about 92.5% or greater, about 93% or greater, about 93.5% or greater, about 94% or greater, about 94.5% or greater, or about 95% or greater over the optical regime.

In some examples, the article may have a total reflectance of about 20% or less, about 15%, or less, about 10% or less, about 9% or less, about 8% or less, about 7% or less, or about 6% or less. In some specific embodiments, the article has a total reflectance of about 6.9% or less, about 6.8% or less, about 6.7% or less, about 6.6% or less, about 6.5% or less, about 6.4% or less, about 6.3% or less, about 6.2% or less, about 6.1% or less, about 6.0% or less, about 5.9% or less, about 5.8% or less, about 5.7% or less, about 5.6% or less, or about 5.5% or less. In accordance with one or more embodiments, the article 100 has a total reflectivity that is the same or less than the total reflectivity of the substrate 110.

In one or more embodiments, the article 100 exhibits a relatively flat transmittance spectrum, reflectance spectrum or transmittance spectrum and reflectance spectrum over the optical wavelength regime. In some embodiments, the relatively flat transmittance and/or reflectance spectra includes an average oscillation amplitude of about 5 percentage points or less along the entire optical wavelength regime or wavelength range segments in the optical wavelength regime. Wavelength range segments may be about 50 nm, about 100 nm, about 200 nm or about 300 nm. In some embodiments, the average oscillation amplitude may be about 4.5 percentage points or less, about 4 percentage points or less, about 3.5 percentage points or less, about 3 percentage points or less, about 2.5 percentage points or less, about 2 percentage points or less, about 1.75 percentage points or less, about 1.5 percentage points or less, about 1.25 percentage points or less, about 1 percentage point or less, about 0.75 percentage points or less, about 0.5 percentage points of less, about 0.25 percentage points or less, or about 0 percentage points, and all ranges and sub-ranges therebetween. In one or more specific embodiments, the article exhibits a transmittance over a selected wavelength range segment of about 100 nm or 200 nm over the optical wavelength regime, wherein the oscillations from the spectra have a maximum peak of about 80%, about 82%, about 84%, about 86%, about 87%, about 88%, about 89%, about 90%, about 91%, about 92%, about 93%, about 95%, or about and all ranges and sub-ranges therebetween.

In some embodiments, the relatively flat average transmittance and/or average reflectance includes a maximum oscillation amplitude, expressed as a percent of the average transmittance or average reflectance, along a specified wavelength range segment in the optical wavelength regime. The average transmittance or average reflectance would also be measured along the same specified wavelength range segment in the optical wavelength regime. The wavelength range segment may be about 50 nm, about 100 nm or about 200 nm. In one or more embodiments, the article 100 exhibits an average transmittance and/or average reflectance with an average percent-based oscillation amplitude of about 10% or less, about 5% or less, about 4.5% of less, about 4% or less, about 3.5% or less, about 3% or less, about 2.5% or less, about 2% or less, about 1.75% or less, about 1.5% or less, about 1.25% or less, about 1% or less, about 0.75% or less, about 0.5% or less, about 0.25% or less, or about 0.1% or less, and all ranges and sub-ranges therebetween. Such percent-based average oscillation amplitude may be exhibited by the article along wavelength ranges segments of about 50 nm, about 100 nm, about 200 nm or about 300 nm, in the optical wavelength regime. For example, an article may exhibit an average transmittance of about 85% along the wavelength range from about 500 nm to about 600 nm, which is a wavelength range segment of about 100 nm, within the optical wavelength regime. The article may also exhibit an percent-based oscillation amplitude of about 3% along the same wavelength range (500 nm to about 600 nm), which means that along the wavelength range from 500 nm to 600 nm, the oscillation amplitude is 2.55 percentage points.

Substrate

The substrate 110 may include an amorphous substrate, a crystalline substrate or a combination thereof. The substrate 110 may be formed from man-made materials and/or naturally occurring materials. In some specific embodiments, the substrate 110 may specifically exclude plastic and/or metal substrates. In one or more embodiments, the substrate exhibits a refractive index in the range from about 1.45 to about 1.55. In specific embodiments, the substrate 110 may exhibit an average strain-to-failure at a surface on one or more opposing major surface that is 0.5% or greater, 0.6% or greater, 0.7% or greater, 0.8% or greater, 0.9% or greater, 1% or greater, 1.1% or greater, 1.2% or greater, 1.3% or greater, 1.4% or greater 1.5% or greater or even 2% or greater, as measured using ball-on-ring testing using at least 5, at least 10, at least 15, or at least 20 samples. In specific embodiments, the substrate 110 may exhibit an average strain-to-failure at its surface on one or more opposing major surface of about 1.2%, about 1.4%, about 1.6%, about 1.8%, about 2.2%, about 2.4%, about 2.6%, about 2.8%, or about 3% or greater.

Suitable substrates 110 may exhibit an elastic modulus (or Young's modulus) in the range from about 30 GPa to about 120 GPa. In some instances, the elastic modulus of the substrate may be in the range from about 30 GPa to about 110 GPa, from about 30 GPa to about 100 GPa, from about 30 GPa to about 90 GPa, from about 30 GPa to about 80 GPa, from about 30 GPa to about 70 GPa, from about 40 GPa to about 120 GPa, from about 50 GPa to about 120 GPa, from about 60 GPa to about 120 GPa, from about 70 GPa to about 120 GPa, and all ranges and sub-ranges therebetween.

In one or more embodiments, the amorphous substrate may include glass, which may be strengthened or non-strengthened. Examples of suitable glass include soda lime glass, alkali aluminosilicate glass, alkali containing borosilicate glass and alkali aluminoborosilicate glass. In some variants, the glass may be free of lithia. In one or more alternative embodiments, the substrate 110 may include crystalline substrates such as glass ceramic substrates (which may be strengthened or non-strengthened) or may include a single crystal structure, such as sapphire. In one or more specific embodiments, the substrate 110 includes an amorphous base (e.g., glass) and a crystalline cladding (e.g., sapphire layer, a polycrystalline alumina layer and/or or a spinel ($MgAl_2O_4$) layer).

The substrate 110 may be substantially planar or sheet-like, although other embodiments may utilize a curved or otherwise shaped or sculpted substrate. The substrate 110 may be substantially optically clear, transparent and free from light scattering. In such embodiments, the substrate may exhibit an average transmittance over the optical wavelength regime of about 85% or greater, about 86% or greater, about 87% or greater, about 88% or greater, about 89% or greater, about 90% or greater, about 91% or greater or about 92% or greater. In one or more alternative embodiments, the substrate 110 may be opaque or exhibit an average transmittance over the optical wavelength regime of less than about 10%, less than about 9%, less than about 8%, less than about 7%, less than about 6%, less than about 5%, less than about 4%, less than about 3%, less than about 2%, less than about 1%, or less than about 0%. In substrate 110 may optionally exhibit a color, such as white, black, red, blue, green, yellow, orange etc.

Additionally or alternatively, the physical thickness of the substrate 110 may vary along one or more of its dimensions for aesthetic and/or functional reasons. For example, the edges of the substrate 110 may be thicker as compared to more central regions of the substrate 110. The length, width and physical thickness dimensions of the substrate 110 may also vary according to the application or use of the article 100.

The substrate 110 may be provided using a variety of different processes. For instance, where the substrate 110 includes an amorphous substrate such as glass, various forming methods can include float glass processes and down-draw processes such as fusion draw and slot draw.

Once formed, a substrate 110 may be strengthened to form a strengthened substrate. As used herein, the term "strengthened substrate" may refer to a substrate that has been chemically strengthened, for example through ion-exchange of larger ions for smaller ions in the surface of the substrate. However, other strengthening methods known in the art, such as thermal tempering, or utilizing a mismatch of the coefficient of thermal expansion between portions of the substrate to create compressive stress and central tension regions, may be utilized to form strengthened substrates.

Where the substrate is chemically strengthened by an ion exchange process, the ions in the surface layer of the substrate are replaced by—or exchanged with—larger ions having the same valence or oxidation state. Ion exchange processes are typically carried out by immersing a substrate in a molten salt bath containing the larger ions to be exchanged with the smaller ions in the substrate. It will be appreciated by those skilled in the art that parameters for the ion exchange process, including, but not limited to, bath composition and temperature, immersion time, the number of immersions of the substrate in a salt bath (or baths), use of multiple salt baths, additional steps such as annealing, washing, and the like, are generally determined by the composition of the substrate and the desired compressive stress (CS), depth of compressive stress layer (or depth of layer) of the substrate that result from the strengthening operation. By way of example, ion exchange of alkali metal-containing glass substrates may be achieved by immersion in at least one molten bath containing a salt such as, but not limited to, nitrates, sulfates, and chlorides of the larger alkali metal ion. The temperature of the molten salt bath typically is in a range from about 380° C. up to about 450° C., while immersion times range from about 15 minutes up to about 40 hours. However, temperatures and immersion times different from those described above may also be used.

In addition, non-limiting examples of ion exchange processes in which glass substrates are immersed in multiple ion exchange baths, with washing and/or annealing steps between immersions, are described in U.S. patent application Ser. No. 12/500,650, filed Jul. 10, 2009, by Douglas C. Allan et al., entitled "Glass with Compressive Surface for Consumer Applications" and claiming priority from U.S. Provisional Patent Application No. 61/079,995, filed Jul. 11, 2008, in which glass substrates are strengthened by immersion in multiple, successive, ion exchange treatments in salt baths of different concentrations; and U.S. Pat. No. 8,312,739, by Christopher M. Lee et al., issued on Nov. 20, 2012, and entitled "Dual Stage Ion Exchange for Chemical Strengthening of Glass," and claiming priority from U.S. Provisional Patent Application No. 61/084,398, filed Jul. 29, 2008, in which glass substrates are strengthened by ion exchange in a first bath is diluted with an effluent ion, followed by immersion in a second bath having a smaller concentration of the effluent ion than the first bath. The contents of U.S. patent application Ser. No. 12/500,650 and U.S. Pat. No. 8,312,739 are incorporated herein by reference in their entirety.

The degree of chemical strengthening achieved by ion exchange may be quantified based on the parameters of central tension (CT), surface CS, and depth of layer (DOL). Surface CS may be measured near the surface or within the strengthened glass at various depths. A maximum CS value may include the measured CS at the surface ($CS_s$) of the strengthened substrate. The CT, which is computed for the inner region adjacent the compressive stress layer within a glass substrate, can be calculated from the CS, the physical thickness t, and the DOL. CS and DOL are measured using those means known in the art. Such means include, but are not limited to, measurement of surface stress (FSM) using commercially available instruments such as the FSM-6000, manufactured by Luceo Co., Ltd. (Tokyo, Japan), or the like, and methods of measuring CS and DOL are described in ASTM 1422C-99, entitled "Standard Specification for Chemically Strengthened Flat Glass," and ASTM 1279.19779 "Standard Test Method for Non-Destructive Photoelastic Measurement of Edge and Surface Stresses in Annealed, Heat-Strengthened, and Fully-Tempered Flat Glass," the contents of which are incorporated herein by reference in their entirety. Surface stress measurements rely upon the accurate measurement of the stress optical coefficient (SOC), which is related to the birefringence of the glass substrate. SOC in turn is measured by those methods that are known in the art, such as fiber and four point bend methods, both of which are described in ASTM standard C770-98 (2008), entitled "Standard Test Method for Measurement of Glass Stress-Optical Coefficient," the contents of which are incorporated herein by reference in their entirety, and a bulk cylinder method. The relationship between CS and CT is given by the expression (1):

$$CT=(CS \cdot DOL)/(t-2DOL) \qquad (1),$$

wherein t is the physical thickness (μm) of the glass article. In various sections of the disclosure, CT and CS are expressed herein in megaPascals (MPa), physical thickness t is expressed in either micrometers (μm) or millimeters (mm) and DOL is expressed in micrometers (μm).

In one embodiment, a strengthened substrate 110 can have a surface CS of 250 MPa or greater, 300 MPa or greater, e.g., 400 MPa or greater, 450 MPa or greater, 500 MPa or greater, 550 MPa or greater, 600 MPa or greater, 650 MPa or greater, 700 MPa or greater, 750 MPa or greater or 800 MPa or greater. The strengthened substrate may have a DOL of 10 μm or greater, 15 μm or greater, 20 μm or greater (e.g., 25 μm, 30 μm, 35 μm, 40 μm, 45 μm, 50 μm or greater) and/or a CT of 10 MPa or greater, 20 MPa or greater, 30 MPa or greater, 40 MPa or greater (e.g., 42 MPa, 45 MPa, or 50 MPa or greater) but less than 100 MPa (e.g., 95, 90, 85, 80, 75, 70, 65, 60, 55 MPa or less). In one or more specific embodiments, the strengthened substrate has one or more of the following: a surface CS greater than 500 MPa, a DOL greater than 15 μm, and a CT greater than 18 MPa.

Example glasses that may be used in the substrate may include alkali aluminosilicate glass compositions or alkali aluminoborosilicate glass compositions, though other glass compositions are contemplated. Such glass compositions are capable of being chemically strengthened by an ion exchange process. One example glass composition comprises $SiO_2$, $B_2O_3$ and $Na_2O$, where $(SiO_2+B_2O_3) \geq 66$ mol. %, and $Na_2O \geq 9$ mol. %. In an embodiment, the glass composition includes at least 6 wt. % aluminum oxide. In a further embodiment, the substrate includes a glass composition with one or more alkaline earth oxides, such that a content of alkaline earth oxides is at least 5 wt. %. Suitable glass compositions, in some embodiments, further comprise at least one of $K_2O$, MgO, and CaO. In a particular embodiment, the glass compositions used in the substrate can comprise 61-75 mol. % SiO2; 7-15 mol. % $Al_2O_3$; 0-12 mol. % $B_2O_3$; 9-21 mol. % $Na_2O$; 0-4 mol. % $K_2O$; 0-7 mol. % MgO; and 0-3 mol. % CaO.

A further example glass composition suitable for the substrate comprises: 60-70 mol. % $SiO_2$; 6-14 mol. % $Al_2O_3$; 0-15 mol. % $B_2O_3$; 0-15 mol. % $Li_2O$; 0-20 mol. % $Na_2O$; 0-10 mol. % $K_2O$; 0-8 mol. % MgO; 0-10 mol. % CaO; 0-5 mol. % $ZrO_2$; 0-1 mol. % $SnO_2$; 0-1 mol. % $CeO_2$; less than 50 ppm. $As_2O_3$; and less than 50 ppm $Sb_2O_3$; where 12 mol. %≤($Li_2O+Na_2O+K_2O$)≤20 mol. % and 0 mol. %≤(MgO+CaO)≤10 mol. %.

A still further example glass composition suitable for the substrate comprises: 63.5-66.5 mol. % $SiO_2$; 8-12 mol. % $Al_2O_3$; 0-3 mol. % $B_2O_3$; 0-5 mol. % $Li_2O$; 8-18 mol. % $Na_2O$; 0-5 mol. % $K_2O$; 1-7 mol. % MgO; 0-2.5 mol. % CaO; 0-3 mol. % $ZrO_2$; 0.05-0.25 mol. % $SnO_2$; 0.05-0.5 mol. % $CeO_2$; less than 50 ppm. $As_2O_3$; and less than 50 ppm $Sb_2O_3$; where 14 mol. %≤($Li_2O+Na_2O+K_2O$)≤18 mol. % and 2 mol. %≤(MgO+CaO)≤7 mol. %.

In a particular embodiment, an alkali aluminosilicate glass composition suitable for the substrate comprises alumina, at least one alkali metal and, in some embodiments, greater than 50 mol. % $SiO_2$, in other embodiments at least 58 mol. % $SiO_2$, and in still other embodiments at least 60 mol. % $SiO_2$, wherein the ratio $$\frac{Al_2O_3 + B_2O_3}{\sum \text{modifiers}} > 1,$$

where in the ratio the components are expressed in mol. % and the modifiers are alkali metal oxides. This glass composition, in particular embodiments, comprises: 58-72 mol. % $SiO_2$; 9-17 mol. % $Al_2O_3$; 2-12 mol. % $B_2O_3$; 8-16 mol. % $Na_2O$; and 0-4 mol. % $K_2O$, wherein the ratio $$\frac{Al_2O_3 + B_2O_3}{\sum \text{modifiers}} > 1.$$

In still another embodiment, the substrate may include an alkali aluminosilicate glass composition comprising: 64-68 mol. % $SiO_2$; 12-16 mol. % $Na_2O$; 8-12 mol. % $Al_2O_3$; 0-3 mol. % $B_2O_3$; 2-5 mol. % $K_2O$; 4-6 mol. % MgO; and 0-5 mol. % CaO, wherein: 66 mol. %≤$SiO_2+B_2O_3+CaO$≤69 mol. %; $Na_2O+K_2O+B_2O_3+MgO+CaO+SrO$>10 mol. %; 5 mol. %≤MgO+CaO+SrO≤8 mol. %; ($Na_2O+B_2O_3$)−$Al_2O_3$≤2 mol. %; 2 mol. %≤$Na_2O−Al_2O_3$≤6 mol. %; and 4 mol. %≤($Na_2O+K_2O$)−$Al_2O_3$≤10 mol. %.

In an alternative embodiment, the substrate may comprise an alkali aluminosilicate glass composition comprising: 2 mol % or more of $Al_2O_3$ and/or $ZrO_2$, or 4 mol % or more of $Al_2O_3$ and/or $ZrO_2$.

Where the substrate 110 includes a crystalline substrate, the substrate may include a single crystal, which may include $Al_2O_3$. Such single crystal substrates are referred to as sapphire. Other suitable materials for a crystalline substrate include polycrystalline alumina layer and/or spinel ($MgAl_2O_4$).

Optionally, the crystalline substrate 110 may include a glass ceramic substrate, which may be strengthened or non-strengthened. Examples of suitable glass ceramics may include $Li_2O—Al_2O_3—SiO_2$ system (i.e. LAS-System) glass ceramics, $MgO—Al_2O_3—SiO_2$ system (i.e. MAS-System) glass ceramics, and/or glass ceramics that include a predominant crystal phase including β-quartz solid solution, β-spodumene ss, cordierite, and lithium disilicate. The glass ceramic substrates may be strengthened using the chemical strengthening processes disclosed herein. In one or more embodiments, MAS-System glass ceramic substrates may be strengthened in $Li_2SO_4$ molten salt, whereby an exchange of $2Li^+$ for $Mg^{2+}$ can occur.

The substrate 110 according to one or more embodiments can have a physical thickness ranging from about 100 µm to about 5 mm. Example substrate 110 physical thicknesses range from about 100 µm to about 500 µm (e.g., 100, 200, 300, 400 or 500 µm). Further example substrate 110 physical thicknesses range from about 500 µm to about 1000 µm (e.g., 500, 600, 700, 800, 900 or 1000 µm). The substrate 110 may have a physical thickness greater than about 1 mm (e.g., about 2, 3, 4, or 5 mm) In one or more specific embodiments, the substrate 110 may have a physical thickness of 2 mm or less or less than 1 mm. The substrate 110 may be acid polished or otherwise treated to remove or reduce the effect of surface flaws.

Optical Film

Figure 6:
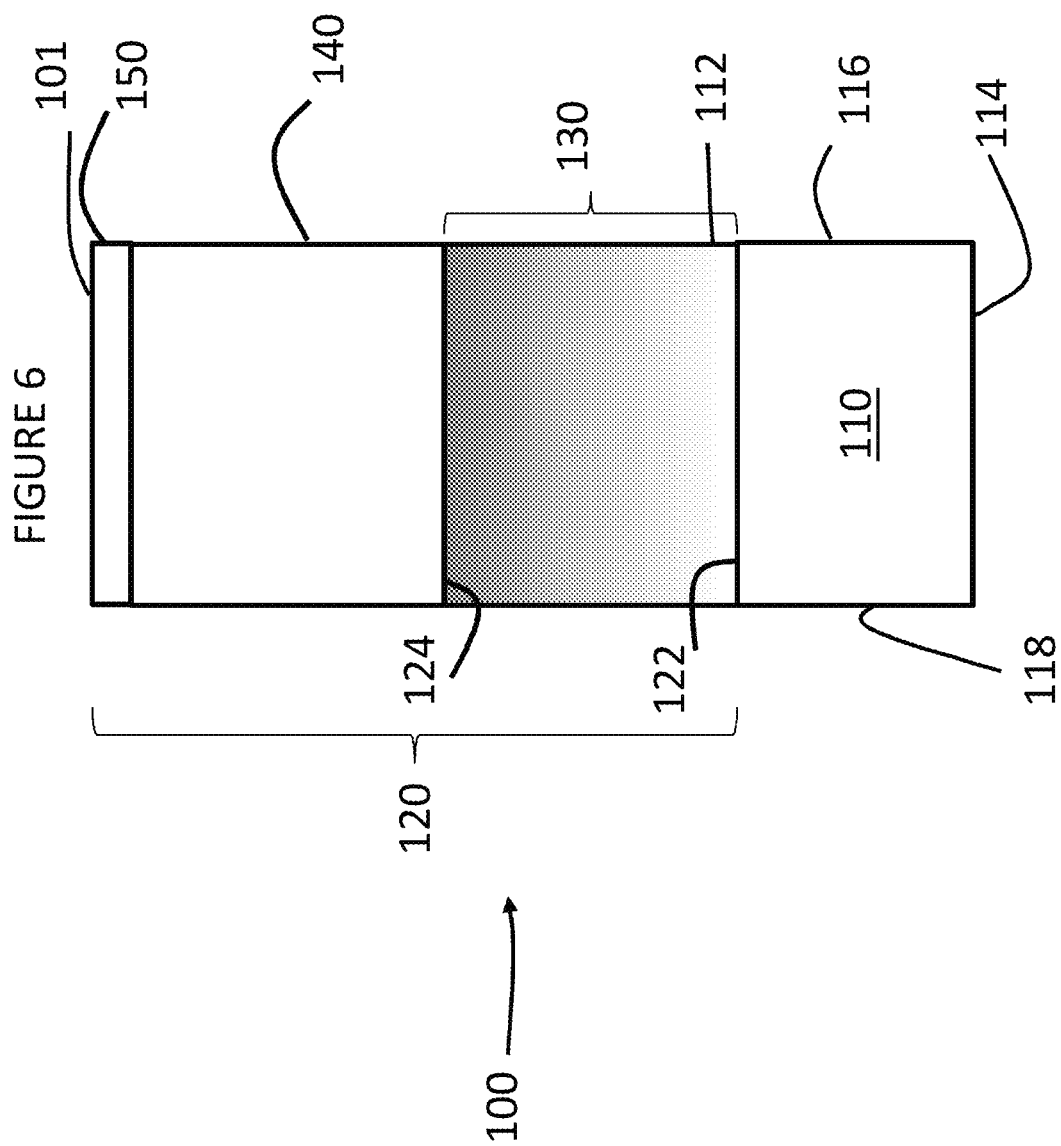
FIG. 6 is a detailed illustration of the article shown in FIG. 5.

As shown in FIG. 5-6, the optical film 120 may include a plurality of layers 130, 140, 150. Additional layers may also be included in optical film 120. Moreover, in some embodiments, one or more films or layers may be disposed on the opposite side of the substrate 110 from the optical film 120 (i.e., on major surface 114).

The physical thickness of the optical film 120 may be in the range from about 0.5 µm to about 3 µm. In some instances, the physical thickness of the optical film 120 may be in the range from about 0.5 µm to about 2.9 µm, from about 0.5 µm to about 2.8 µm, from about 0.5 µm to about 2.7 µm, from about 0.5 µm to about 2.6 µm, from about 0.5 µm to about 2.5 µm, from about 0.5 µm to about 2.4 µm, from about 0.5 µm to about 2.3 µm, from about 0.5 µm to about 2.2 µm, from about 0.5 µm to about 2.1 µm, from about 0.5 µm to about 2 µm, from about 0.75 µm to about 3 µm, from about 1 µm to about 3 µm, from about 1.1 µm to about 3 µm, from about 1.2 µm to about 3 µm, from about 1.3 µm to about 3 µm, from about 1.4 µm to about 3 µm, or from about 1.5 µm to about 3 µm, and all ranges and sub-ranges therebetween.

The optical film 120 may exhibit an average hardness of greater than about 5 GPa, as measured on the coated surface 101, by indenting that surface with a Berkovitch indenter to form an indent having an indentation depth of at least about 100 nm (measured from the coated surface 101). For example, the optical film 120 may exhibit an average hardness in the range from about 6 GPa to about 30 GPa, from about 7 GPa to about 30 GPa, from about 8 GPa to about 30 GPa, from about 9 GPa to about 30 GPa, from about 10 GPa to about 30 GPa, from about 12 GPa to about 30 GPa, from about 5 GPa to about 28 GPa, from about 5 GPa to about 26 GPa, from about 5 GPa to about 24 GPa, from about 5 GPa to about 22 GPa, from about 5 GPa to about 20 GPa, from about 12 GPa to about 25 GPa, from about 15 GPa to about 25 GPa, from about 16 GPa to about 24 GPa, from about 18 GPa to about 22 GPa and all ranges and sub-ranges therebetween.

In one or more embodiments, the optical film includes an optical modifying layer 130 disposed on major surface 112 of the substrate 110, a scratch-resistant layer 140 disposed on the optical modifying layer 130 and an optional capping layer 150 disposed on the scratch resistant layer 140. In the embodiment shown, the optical modifying layer 130 is disposed between the substrate 110 and the scratch-resistant layer 140, thus modifying the interface between the substrate 110 and the scratch-resistant layer 140.

As will be described herein, the optical film 120 includes a refractive index gradient, which may form part or all of the optical modifying layer 130. The refractive index gradient modifies the interface between the substrate 110 and the scratch-resistant layer 140 by minimizing reflectance and absorption, maximizing transmittance and reducing color shift when the article is viewed at various incident viewing angles from normal incidence, under different illuminants. The embodiments of the refractive index described herein provide such modification using interference-based and non-interference-based structures.

Figure 7:
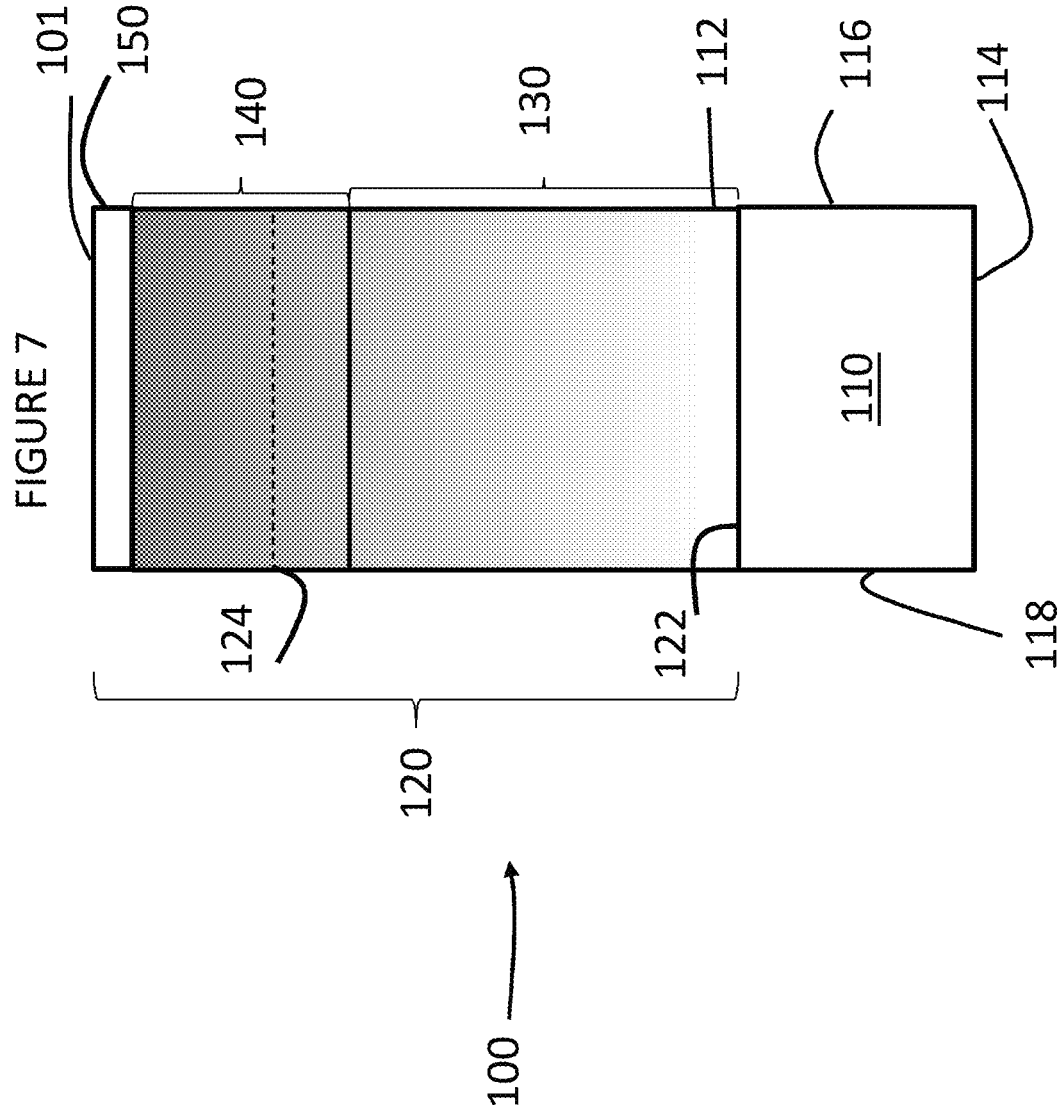
FIG. 7 is an illustration of an article according to one or more alternative embodiments.

The refractive index gradient may extend along a portion or all of the optical film 120. In one or more embodiments, the optical film 120 includes a first surface 122 at the interface between the substrate 110 and the optical film 120 and a second surface 124. The refractive index of the optical film 120 at or adjacent to the first surface 122 may be less than the refractive index of the optical film 120 at or adjacent to the second surface. In the embodiment shown in FIGS. 5-6, the first surface 122 forms one end of the optical modifying layer 130 and the second surface 124 forms the opposite end of the optical modifying layer. In such embodiments, the optical modifying layer includes all of the refractive index gradient. In one or more embodiments, the refractive index gradient extends from the first surface 122 to the second surface 124 which may be located at a portion along the scratch resistant layer 140, as shown in FIG. 7. In one or more embodiments, the refractive index increases from the first surface 122 to the second surface 124 along the thickness of the optical film 120 between the first surface 122 and the second surface 124.

The refractive index gradient may be in the range from the refractive index of the substrate 110 to the refractive index of the scratch resistant layer 140. In one or more specific embodiments, the refractive index of the refractive index gradient may be in the range from about 1.3 to about 2.5. For example, the refractive index of the refractive index gradient may be in the range from about 1.3 to about 2.4, from about 1.3 to about 2.3, from about 1.3 to about 2.2, from about 1.3 to about 2.1, from about 1.3 to about 2, from about 1.3 to about 1.9, from about 1.3 to about 1.8, from about 1.3 to about 1.7, from about 1.4 to about 2.5, from about 1.5 to about 2.5, from about 1.6 to about 2.5, from about 1.7 to about 2.5, from about 1.8 to about 2.5, from about 1.9 to about 2.5, and all ranges and sub-ranges therebetween. In one or more embodiments, the refractive index at or adjacent to the first surface 122 may be in the range from about 1.3 to about 1.7, from about 1.35 to about 1.7, from about 1.4 to about 1.7, from about 1.45 to about 1.7, from about 1.3 to about 1.65, from about 1.3 to about 1.6, from about 1.3 to about 1.55 and all ranges and sub-ranges therebetween. The refractive index at or adjacent to the second surface 124 may be in the range from about 1.5 to about 2.5, from about 1.6 to about 2.5, from about 1.7 to about 2.5, from about 1.8 to about 2.5, from about 1.9 to about 2.5, from about 1.5 to about 2.4, from about 1.5 to about 2.3, from about 1.5 to about 2.2, from about 1.5 to about 2.1, from about 1.5 to about 2.0, and all ranges and sub-ranges therebetween.

In one or more embodiments, the increase in refractive index in the refractive index gradient is monotonic or continuously increasing. In the same or other embodiments, the refractive index gradient may comprise a positive slope gradient where the refractive index rises with distance from the first surface 122 to the second surface 124. In other embodiments, the refractive index gradient may comprise regions of positive slope (refractive index rising with increased distance from the substrate) in addition to regions of negative slope.

In some embodiments, the increase in refractive index from the first surface 122 to the second surface 124 occurs an average rate in the range from about $0.01/\mu m$ to about $1/\mu m$, from about $0.01/\mu m$ to about $0.94/\mu m$, from about $0.01/\mu m$ to about $0.8/\mu m$, from about $0.01/\mu m$ to about $0.74/\mu m$, from about $0.01/\mu m$ to about $0.64/\mu m$, from about $0.14/\mu m$ to about $1/\mu m$, from about $0.24/\mu m$ to about $1/\mu m$, from about $0.34/\mu m$ to about $1/\mu m$, from about $0.44/\mu m$ to about $1/\mu m$, from about $0.54/\mu m$ to about $1/\mu m$ and all ranges and sub-ranges therebetween. In one or more embodiments, the refractive index gradient may have a refractive index slope that, when reduced or minimized, results in an article that exhibits even smaller oscillations in reflectance and/or transmittance spectra. In one or more embodiments, the slope of the refractive index gradient as a function of thickness of about $1/\mu m$ or less, about $0.75/\mu m$ or less, $0.54/\mu m$ or less or $0.25/\mu m$ or less results in an article having an average oscillation amplitude of about 2 percentage points over the entire optical wavelength regime or selected wavelength range segments of the optical wavelength regime.

Figure 8:
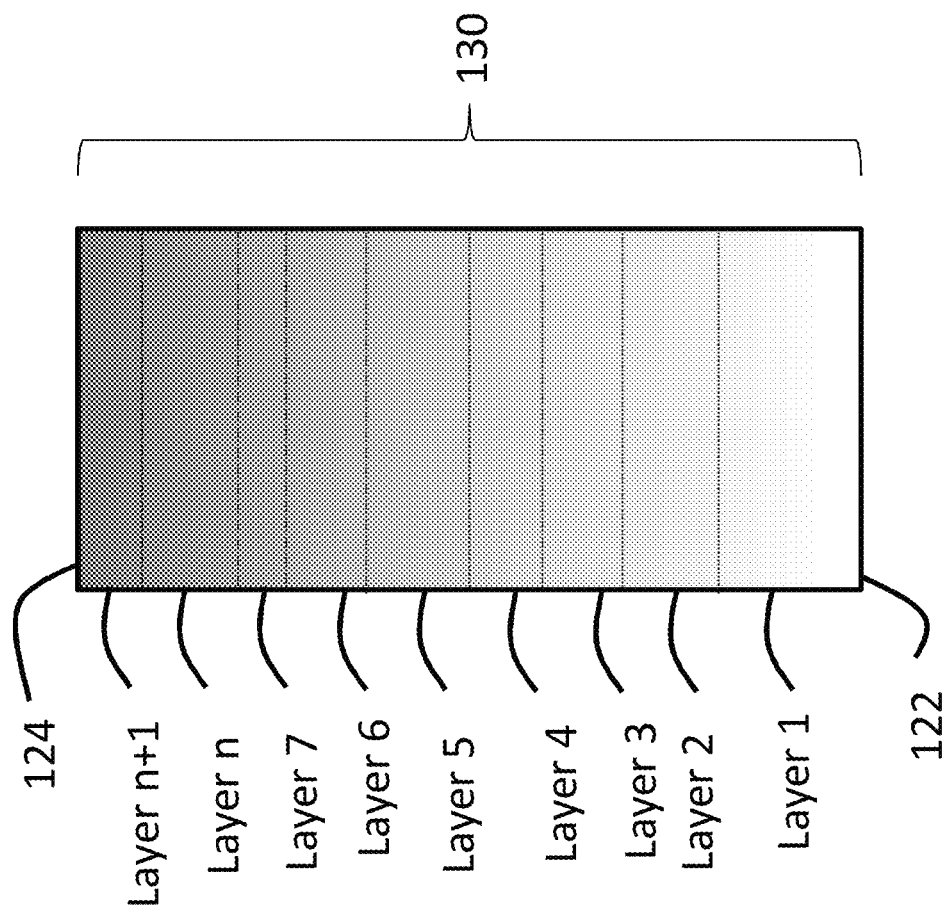
FIG. 8 is an enlarged view of a refractive index gradient, according to one or more embodiments.

In the embodiment shown in FIG. 8, the refractive index gradient may be formed by a plurality of discrete sub-layers. In one or more embodiments, the plurality of sub-layers may include 2 or more sub-layers, 10 or more sub-layers, 20 or more sub-layers, 30 or more sub-layers, 40 or more sub-layers, 50 or more sub-layers, 60 or more sub-layers, 70 or more sub-layers, 80 or more sub-layers, 90 or more sub-layers, 100 or more sub-layers, 110 or more sub-layers, 120 or more sub-layers, 130 or more sub-layers, 140 or more sub-layers, 150 or more sub-layers and all ranges or sub-ranges therebetween. The number of sub-layers is not particularly limited, notwithstanding the thickness, mechanical and optical properties recited herein for the optical film 120. The sub-layers may have the same thickness as each other or different thicknesses. In one or more embodiments, each of the sub-layers has a specific refractive index and, when combined with the other sub-layers, forms part of the refractive index gradient.

In one or more embodiments, the refractive index gradient may be formed by a compositional gradient. In such embodiments, the composition at or adjacent to the first surface 122 may be tuned to provide a refractive index as described herein and may include materials that exhibit a lower refractive index than materials at or adjacent to the second surface 124. The composition at or adjacent to the second surface 124 may be tuned to provide a refractive index as described herein and may include materials that exhibit a higher refractive index than materials used at or adjacent to the first surface 124. For example, where a low refractive index is desired, oxides may be utilized instead of nitrides. Where high refractive index is desired, nitrides may be utilized. In the example shown in FIG. 8, each of the sub-layers has a specific composition, which when combined with the other sub-layers, forms a compositional gradient and thus, the refractive index gradient.

In one or more specific embodiments, the composition gradient may be formed from materials such as Si, Al, N, O, C, and/or combinations thereof. In one or more specific embodiments, the composition gradient is formed from Si, Al, N and/or O. In one example, the refractive index gradient may include a silicon-content gradient in which the silicon content decreases along the thickness of the refractive index gradient from the first surface 122 to the second surface 124.

In another example, the refractive index gradient may include an aluminum-content gradient in which the aluminum content increases along the thickness of the refractive index gradient from the first surface 122 to the second surface 124. In another example, the refractive index gradient may include an oxygen-content gradient in which the oxygen content decreases or remains constant along the thickness of the refractive index gradient from the first surface 122 to the second surface 124. In yet another example, the refractive index gradient may include a nitrogen-content gradient in which the nitrogen content increases or remains constant along the thickness of the refractive index gradient from the first surface 122 to the second surface 124. In some examples, the refractive index gradient includes at least two, at least three or all four of a silicon-content gradient, an aluminum-content gradient, an oxygen-content gradient and a nitrogen-content gradient.

In one or more embodiments, the refractive index gradient may be formed by a porosity gradient. In such embodiments, the porosity at or adjacent to the first surface 122 may be tuned to provide a refractive index as described herein and may include a greater porosity than the porosity at or adjacent to the second surface 124. The porosity at or adjacent to the second surface 124 may be tuned to provide a refractive index as described herein and may include a lower porosity than the porosity at or adjacent to the first surface 124.

In one or more specific embodiments, the porosity gradient may be formed by including a plurality of nanopores in specific locations of the optical film 120. The material in which the plurality of nanopores are formed or provided is not particularly limited and can include materials such as Si, Al, N, O, C, and combinations thereof. Materials suitable for use in creating porosity gradients also include $TiO_2$, $Nb_2O_5$, $HfO_2$, $ZrO_2$, indium tin oxide (ITO), ZnO, MgO, and other known optical materials. In one or more embodiments, the optical film 120 (or, in specific embodiments, the optical modifying layer 130) may include a region with a thickness of 10 nm or greater, 25 nm or greater, 50 nm or greater, or 100 nm or greater having an average porosity in the range from about 5% to about 75%. In some embodiments, this region may have a porosity in the range from about 5% to about 70%, from about 5% to about 65%, from about 5% to about 60%, from about 5% to about 55%, from about 5% to about 50%, from about 5% to about 45%, from about 5% to about 40%, from about 10% to about 75%, from about 15% to about 75%, from about 20% to about 75%, from about 25% to about 75%, from about 30% to about 75%, from about 35% to about 75%, from about 40% to about 75%, from about 20% to about 40%, from about 20% to about 35%, and all ranges and sub-ranges therebetween. The porosity gradient may have an average porosity of about 20% to about 35%.

In one or more specific embodiments, the article may include a substrate, a porous optical modifying layer including, for example porous and non-porous $Al_2O_3$, and a scratch-resistant layer including $AlO_xN_y$. Porous $Al_2O_3$ may be considered a substitute for layers or sub-layers formed from $SiO_2$, in some embodiments. The porosity of the porous layers or sub-layers may be graded such that the layers or sub-layers with greater porosity are positioned closer to the substrate (i.e., at or adjacent to the first surface 122) and the layers or sub-layers with no porosity are positioned at or adjacent to the second surface 124. In other embodiments, porosity and compositional gradients may be combined to provide refractive index gradients.

In one or more alternative embodiments, the optical film 120 may include a density gradient and/or an elastic modulus gradient, in addition to or instead of the refractive index gradient otherwise described herein. In one or more embodiments, the optical film 120 may provide strength retention properties to the article (e.g., through the porosity gradient, density gradient and/or elastic modulus gradient). In such embodiments, the optical film may suppress growth of cracks that are formed in one of the substrate 110 or the scratch resistant layer 140 and bridge into the other of the substrate 110 or the scratch resistant layer 140. In some embodiments, the optical film may be combined with separate layers, or multiple separate layers, where the separate layers act as crack mitigating layers. These crack mitigating layers may or may not also perform optical functions.

Exemplary materials suitable for use in the optical modifying layer 130 include: $SiO_2$, $Al_2O_3$, $GeO_2$, SiO, $AlOxNy$, AlN, $Si_3N_4$, $SiO_xN_y$, $Si_uAl_vO_xN_y$, $Ta_2O_5$, $Nb_2O_5$, $TiO_2$, $ZrO_2$, TiN, MgO, $MgF_2$, $BaF_2$, $CaF_2$, $SnO_2$, $HfO_2$, $Y_2O_3$, $MoO_3$, $DyF_3$, $YbF_3$, $YF_3$, $CeF_3$, polymers, fluoropolymers, plasma-polymerized polymers, siloxane polymers, silsesquioxanes, polyimides, fluorinated polyimides, polyetherimide, polyethersulfone, polyphenylsulfone, polycarbonate, polyethylene terephthalate, polyethylene naphthalate, acrylic polymers, urethane polymers, polymethylmethacrylate, and other materials known in the art.

In one or more embodiments, the optical modifying layer 130 has a physical thickness of about 800 nm or less. The optical modifying layer 130 may have a physical thickness in the range from about 10 nm to about 800 nm, from about 50 nm to about 800 nm, from about 100 nm to about 800 nm, from about 150 nm to about 800 nm, from about 200 nm to about 800 nm, from about 10 nm to about 750 nm, from about 10 nm to about 700 nm, from about 10 nm to about 650 nm, from about 10 nm to about 600 nm, from about 10 nm to about 550 nm, from about 10 nm to about 500 nm, from about 10 nm to about 450 nm, from about 10 nm to about 400 nm, from about 10 nm to about 350 nm, from about 10 nm to about 300 nm, and all ranges and sub-ranges therebetween. In similar or alternate embodiments, the physical thickness of the optical modifying layer 130 may be in the range from about 0.5 μm to about 5 μm. In some instances, the physical thickness of the optical modifying layer 130 may be in the range from about 0.5 μm to about 2.9 μm, from about 0.5 μm to about 2.8 μm, from about 0.5 μm to about 2.7 μm, from about 0.5 μm to about 2.6 μm, from about 0.5 μm to about 2.5 μm, from about 0.5 μm to about 2.4 μm, from about 0.5 μm to about 2.3 μm, from about 0.5 μm to about 2.2 μm, from about 0.5 μm to about 2.1 μm, from about 0.5 μm to about 2 μm, from about 0.75 μm to about 5 μm, from about 1 μm to about 5 μm, from about 1.1 μm to about 3 μm, from about 1.2 μm to about 3 μm, from about 1.3 μm to about 3 μm, from about 1.4 μm to about 3 μm, or from about 1.5 μm to about 3 μm, and all ranges and sub-ranges therebetween.

In some embodiments, the optical modifying layer exhibits an average light reflectance of about 2% or less, 1.5% or less, 0.75% or less, 0.5% or less, 0.25% or less, 0.1% or less, or even 0.05% or less over the optical wavelength regime, when measured in an immersed state. As used herein, the phrase "immersed state" includes the measurement of the average reflectance by subtracting or otherwise removing reflections created by the article at interfaces other than those involving the optical modifying layer, and/or by removing interfaces with air. In some instances, the optical modifying layer may exhibit such average light reflectance over other wavelength ranges such as from about 450 nm to about 650 nm, from about 420 nm to about 680 nm, from about 420 nm to about 740 nm, from about 420 nm to about 850 nm, or from about 420 nm to about 950 nm. In some embodiments, the optical modifying layer exhibits an average transmittance of about 90% or greater, 92% or greater, 94% or greater, 96% or greater, or 98% or greater, over the optical wavelength regime.

The optical film 120 of some embodiments includes a scratch-resistant layer 140, which may include an inorganic carbide, nitride, oxide, diamond-like material, or combination of these. Examples of suitable materials for the scratch-resistant layer 140 include metal oxides, metal nitrides, metal oxynitrides, metal carbides, metal oxycarbides, and/or combinations thereof combination thereof. Exemplary metals include B, Al, Si, Ti, V, Cr, Y, Zr, Nb, Mo, Sn, Hf, Ta and W. Specific examples of materials that may be utilized in the scratch-resistant layer 140 may include $Al_2O_3$, AlN, $AlO_xN_y$, $Si_3N_4$, $SiO_xN_y$, $Si_uAl_vO_xN_y$, diamond, diamond-like carbon, $Si_xC_y$, $Si_xO_yC_z$, $ZrO_2$, $TiO_xN_y$, and combinations thereof.

The composition of the scratch-resistant layer 140 may be modified to provide specific properties (e.g., hardness). In one or more embodiments, the scratch-resistant layer 140 exhibits an average hardness in the range from about 5 GPa to about 30 GPa as measured on a major surface of the scratch-resistant layer, by indenting that surface with a Berkovitch indenter to form an indent having an indentation depth of at least about 100 nm (measured from the major surface of the scratch-resistant layer). In one or more embodiments, the scratch-resistant layer 140 exhibits an average hardness in the range from about 6 GPa to about 30 GPa, from about 7 GPa to about 30 GPa, from about 8 GPa to about 30 GPa, from about 9 GPa to about 30 GPa, from about 10 GPa to about 30 GPa, from about 12 GPa to about 30 GPa, from about 5 GPa to about 28 GPa, from about 5 GPa to about 26 GPa, from about 5 GPa to about 24 GPa, from about 5 GPa to about 22 GPa, from about 5 GPa to about 20 GPa, from about 12 GPa to about 25 GPa, from about 15 GPa to about 25 GPa, from about 16 GPa to about 24 GPa, from about 18 GPa to about 22 GPa and all ranges and sub-ranges therebetween.

The physical thickness of the scratch-resistant layer 140 may be in the range from about 0 μm to about 3 μm or from about 1.5 μm to about 3 μm. In some embodiments, the physical thickness of the scratch-resistant layer 140 may be in the range from about 1.5 μm to about 3 μm, from about 1.5 μm to about 2.8 μm, from about 1.5 μm to about 2.6 μm, from about 1.5 μm to about 2.4 μm, from about 1.5 μm to about 2.2 μm, from about 1.5 μm to about 2 μm, from about 1.6 μm to about 3 μm, from about 1.7 μm to about 3 μm, from about 1.8 μm to about 3 μm, from about 1.9 μm to about 3 μm, from about 2 μm to about 3 μm, from about 2.1 μm to about 3 μm, from about 2.2 μm to about 3 μm, from about 2.3 μm to about 3 μm, and all ranges and sub-ranges therebetween. In specific embodiments, scratch-resistant layer 140 may be thinner and may have a thickness of less than about 1 μm. In some instances, the optical modifying layer 130 alone or in combination with the substrate 110 provides some hardness (and thus scratch-resistance) such that the thickness of the scratch-resistant layer may be reduced. For example, the thickness of the scratch-resistant layer 140 may be in the range from about 1 nm to about 900 nm, from about 1 nm to about 800 nm, from about 1 nm to about 700 nm, from about 1 nm to about 600 nm, from about 1 nm to about 500 nm, from about 1 nm to about 400 nm, from about 1 nm to about 300 nm, from about 1 nm to about 200 nm, from about 1 nm to about 100 nm, from about 100 nm to about 750 nm, from about 100 nm to about 500 nm, from about 100 nm to about 250 nm, from about 250 nm to about 750 nm, and all ranges and sub-ranges therebetween. In some instances, the optical film 130 may be free of a scratch-resistant layer. In such embodiments, the optical modifying layer 130 alone or in combination with the substrate 110 provides a level of hardness such that the article exhibits the hardness ranges recited herein, thus imparting scratch resistance or abrasion resistance to the article.

In one or more embodiments, the scratch-resistant layer 140 has a refractive index of about 1.7 or greater. In some instances, the refractive index of the scratch-resistant layer 140 may be about 1.8 or greater, 1.9 or greater, 2 or greater, or 2.1 or greater. The scratch-resistant layer may have a refractive index that is greater than the refractive index of the substrate 110. In specific embodiments, the scratch-resistant layer has a refractive index that is about 0.05 index units greater or about 0.2 index units greater than the refractive index of the substrate, when measured at a wavelength of about 550 nm.

The capping layer 150 of one or more embodiments may include a low refractive index material, such as $SiO_2$, $Al_2O_3$, $GeO_2$, SiO, $AlO_xN_y$, $SiO_xN_y$, $Si_uAl_vO_xN_y$, MgO, $MgF_2$, $BaF_2$, $CaF_2$, $DyF_3$, $YbF_3$, $YF_3$, and $CeF_3$ and other such materials. The refractive index of the capping layer 150 may be in the range from about 1.3 to about 1.7, from about 1.3 to about 1.65, from about 1.3 to about 1.6, from about 1.3 to about 1.55, from about 1.35 to about 1.7, from about 1.4 to about 1.7, from about 1.45 to about 1.7, from about 1.4 to about 1.65 and all ranges and sub-ranges therebetween.

The physical thickness of the capping layer may be in the range from about 0 to about 100 nm, from about 0.1 nm to about 50 nm, from about 1 nm to about 50 nm, from about 5 nm to about 50 nm, from about 10 nm to about 50 nm, from about 0 nm to about 40, from about 0 nm to about 30, from about 0 nm to about 20 nm, from about 0 nm to about 10 nm, from about 0.1 nm to about 15 nm, from about 0.1 nm to about 12 nm, from about 0.1 nm to about 10 nm, from about 0.1 nm to about 8 nm, from about 8 nm to about 12 nm, from about 9 nm to about 10 nm, and all ranges and sub-ranges therebetween. In one or more embodiments, the article has a refractive index of about 1.7 or greater at the coated surface 101, which may include the capping layer. The capping layer 150 may formed using silane-based low-friction materials, including fluorosilane, alkyl silane, silsesquioxane, and the like, either by liquid deposition or vapor deposition methods. In one or more embodiments, the capping layer may comprise two or more materials or two or more sub-layers (e.g., 4 sub-layers or 6 sub-layers). The capping layer may provide an anti-reflective function especially where multiple sub-layers are utilized. The sub-layers may include different refractive indices and may include layers with high refractive indices (H) and low refractive indices (L) where "high" and "low" are with respect to one another and within known ranges for anti-reflective films. The sub-layers may be arranged so that high and low refractive index sub-layers alternate. The materials or sub-layers can include, for example $SiO_2$ or $SiO_xN_y$. In such embodiments, the one or more sub-layers can have a thickness each or combined in the range from about 4 nm to about 50 nm. In some embodiments, the capping layer 150 may include a silane-based low-friction sub-layer having a thickness in the range from about 0.1 nm to about 20 nm, disposed on underlying sub-layers of the capping layer (e.g., the $SiO_2$ and/or $SiO_xN_y$ layer(s)).

The physical and/or optical thicknesses of the layers of the optical film 120 can be adjusted to achieve desired optical and mechanical properties (e.g., hardness). For example, the scratch-resistant layer 140 may be can be made thinner, for example in the range from about 100 nm to about 500 nm, while still providing some resistance to scratch, abrasion, or damage events (including drop events of the article onto hard surfaces such as asphalt, cement, or sandpaper). The capping layer physical and/or optical thickness can also be adjusted. The capping layer may be included when even lower total reflectance is desired. The capping layer may also be included to further tune color of the article. For example, the optical films described herein minimize color shift with changing incidence illumination angle in a* or b* coordinates, but may also exhibit a slight slope to the reflectance spectra. A capping layer 150 may be included in the optical film 120 and the physical and/or optical thickness of the capping layer may be adjusted slightly (e.g., from about 10 nm to about 14 nm) to provide an even flatter reflectance spectrum (or a reflectance spectrum with oscillations having even smaller amplitudes) across the optical wavelength regime.

The optical film 120 may be formed using various deposition methods such as vacuum deposition techniques, for example, chemical vapor deposition (e.g., plasma enhanced chemical vapor deposition and atmospheric pressure chemical vapor deposition), physical vapor deposition (e.g., reactive or nonreactive sputtering or laser ablation), thermal or e-beam evaporation and/or atomic layer deposition. One or more layers of the optical film 120 may include nano-pores and/or compositional gradients formed from mixed-materials to provide specific refractive index ranges or values.

The physical thicknesses of the layers of the optical film 120 may be vary by less than about 1 nm or less than about 0.5 nm (representing the range of six standard deviations) to achieve the maximum targeted repeatability (e.g., a* and b* variations no greater than +/−0.2 for reflected F2 illumination). In some embodiments, larger variations in physical thicknesses of the layers can be tolerated while still achieving the desired targets of the invention for some applications (e.g., a* and b* variations no greater than +/−2.0 for reflected F2 illumination).

High-angle optical performance may be improved in some embodiments by adding additional layers to the optical film 120 and/or the article 100. In some cases, these additional layers can extend the wavelengths at which the reflectance spectrum has low amplitude oscillations (e.g., into the near-IR wavelengths, such as to 800 nm, 900 nm, or even 1000 nm). This leads to lower oscillations and lower color at high incidence angles, because generally the entire reflectance spectra of the article shifts to shorter wavelengths at higher light incidence angles. In some cases, this extended-band performance can be achieved by adjusting the interference layer design, for example by allowing a slightly higher oscillation amplitude to achieve a wider-wavelength-band of low oscillations, without necessarily adding more layers. This extended-band or wide-wavelength-band of low oscillations (correlated to an extended band of low reflectance for the interference layers) can also be useful in making the article tolerant to deposition non-uniformity, substrate curvature, substrate sculpting, or substrate shaping which causes shadowing during directional deposition processes, or other geometry factors that cause a substantially uniform relative shift in all layer thicknesses relative to the typically ideal target thicknesses.

A second aspect of the present disclosure pertains to methods of forming the articles described herein. In one or more embodiments, the method includes providing a substrate having a major surface, disposing an optical film having a thickness on the major surface, and creating a refractive index gradient along at least a portion of the thickness of the optical film. In one or more embodiments, the method includes creating the refractive index gradient by varying the composition of the optical film along the thickness. In some embodiments, varying the composition of the optical film can include increasing or decreasing the oxygen content, silicon content, nitrogen content and/or aluminum content along the thickness of the optical film. The compositional gradient may be formed by changing the process conditions by which the optical film is formed. In one or more embodiments, the compositional gradient is formed by varying one or more of: flow of oxygen, power supplied to a material target (e.g., silicon and/or aluminum), and deposition time. In one example, the optical film is formed by sputtering and the compositional gradient is created by varying the amount of gases flowed into the chamber and/or power supplied to a target disposed within the chamber.

In one or more alternative embodiments, creating a refractive index gradient includes varying the porosity of the optical film along the thickness (e.g., an average porosity in the range from about 20% to about 35%). In one or more embodiments, the method may include using aluminum as the primary metallic constituent of the optical film 120 (and in some instances, all layers of the optical film), thus reducing the number of sputtering targets, evaporation boats, or chemical precursors that are needed to provide an optical film with a refractive index gradient. In such embodiments, for example, a reactive sputtering process using the single Al metal target could be used to provide an optical film including a porous and non-porous $Al_2O_3$ optical modifying layer (or refractive index gradient created by porosity), and an $AlO_xN_y$ scratch-resistant layer by adjusting the pressures and relative gas flows of oxygen, nitrogen, and argon during deposition.

In one or more embodiments, the method may include reducing light absorption of the optical film. In such embodiments, reducing light absorption of the optical film can include exposing the optical film to elevated temperature and/or light, as the optical film is disposed on the surface. Examples of suitable elevated temperatures include a temperature in the range from about 75° C. to about 300° C.

Additionally, the optical film 120 and/or the optical modifying layer 130 of one or more embodiments may be heat-treated to minimize coloration perceived by the eye. In one example, the method includes heating the optical film 120 and/or optical modifying layer 130 during deposition to reduce yellowing, which even without post-treatment is slight. After such heat-treatment, the coloration is reduced to near zero (i.e., a* and/or b* are near zero). In some embodiments, the method includes heating the optical film 120 and/or optical modifying layer 130 in air after deposition to reduce coloration. In one example, the optical film 120 and/or optical modifying layer 130 is heated at a temperature of about 200° C. for about 1 hour. In addition, alternate heating temperatures can be used (for example 250° C., 300° C., 400° C., or 500° C.). In certain cases the post-treatment heating temperature treatment is limited to less than about 350° C. when the substrate is chemically strengthened glass substrate to avoid relaxation of the compressive stress present in such substrates.

EXAMPLES

Various embodiments will be further clarified by the following examples. In the following examples, unless specified otherwise, the optical films were formed by reactive sputtering using an AJA-Industries Sputter Deposition Tool. The targets used to form the optical film included 3" diameter targets of silicon or aluminum. The reactive gases utilized included nitrogen and argon and a argon was used as the working or inert gas. Radio frequency (RF) power was supplied to the silicon target at about 13.56 Mhz. DC power was supplied to the aluminum target. The refractive index gradient was formed by changing the composition of the optical film by changing one or more of: flows of oxygen gas (sccm), power (kW) supplied to the silicon target, power (kW) supplied to the aluminum target, and deposition time (seconds). The deposition time was particularly modified to control thickness of the layer or sub-layer being deposited.

In each example, optical data such as transmittance and reflectance spectra, was obtained using an optical reflectance and transmittance measurement tool supplied by Filmetrics, Inc. To visually evaluate the scratch resistance of the optical films and articles made in the Examples, the articles or optical films were scratched by hand using garnet sandpaper (e.g., garnet sandpaper having a 100 C grit or 220 C grit).

Example A

Example A1 and Comparative Example A2 were formed by providing a chemically strengthened aluminoborosilicate glass substrate having a compressive stress of about 900 MPa and a DOL of about 45 μm. Example A1 included an optical modifying layer with a refractive index gradient including a compositional gradient of $Si_uAl_vO_xN_y$. The compositional gradient of optical film of Example A1 was formed using 120 sub-layers. A scratch-resistant layer was formed on the refractive index gradient sub-layers. The optical film was formed using the process recipe shown in Table 1. Each "step" shown in Table 1 corresponds to a layer or sub-layer. In the case of steps 0-120, 120 sub-layers were formed. In step 121, the scratch-resistant layer was formed. Comparative Example A2 included a single layer having substantially uniform composition of $Si_uAl_vO_xN_y$, having a thickness of about 502 nm, as measured by ellipsometry. Comparative Example A2 was formed by sputtering by flowing no oxygen into the chamber and by flowing about 40 sccm N2 and 20 sccm Ar into the chamber, which had a pressure of about 3 mT. About 180 W RF was supplied to a Si target and about 480 W DC was supplied to an AL target. The deposition time was about 7200 seconds.

TABLE 1

Process recipe for Example A1. Example A1

| Constant gas flows: | N₂ flow (sccm) | Ar flow (sccm) | | |
|---|---|---|---|---|
| | 40 | 20 | | |
| Step | O2 flow (sccm) | power Si (W) | power Al (W) | duration (S) |
| 0 | 2 | 400 | 0 | 240 |
| 1 | 2 | 400 | 50 | 240 |
| 2 | 2 | 400 | 70 | 240 |
| 3 | 2 | 400 | 90 | 240 |
| 4 | 2 | 400 | 110 | 240 |
| 5 | 2 | 400 | 130 | 240 |
| 6 | 2 | 400 | 150 | 240 |
| 7 | 2 | 400 | 170 | 240 |
| 8 | 2 | 400 | 190 | 240 |
| 9 | 2 | 400 | 210 | 240 |
| 10 | 2 | 400 | 230 | 240 |
| 11 | 2 | 400 | 250 | 240 |
| 12 | 2 | 400 | 270 | 240 |
| 13 | 2 | 400 | 290 | 240 |
| 14 | 2 | 400 | 310 | 240 |
| 15 | 2 | 380 | 320 | 240 |
| 16 | 2 | 360 | 330 | 240 |
| 17 | 2 | 340 | 340 | 240 |
| 18 | 2 | 320 | 350 | 240 |
| 19 | 2 | 300 | 360 | 240 |
| 20 | 2 | 280 | 370 | 240 |
| 21 | 2 | 260 | 380 | 240 |
| 22 | 2 | 240 | 390 | 240 |
| 23 | 2 | 220 | 400 | 240 |
| 24 | 2 | 200 | 410 | 240 |
| 25 | 2 | 180 | 420 | 240 |
| 26 | 2 | 160 | 430 | 240 |
| 27 | 2 | 140 | 440 | 240 |
| 28 | 2 | 120 | 450 | 240 |
| 29 | 2 | 100 | 460 | 240 |
| 30 | 2 | 80 | 470 | 240 |
| 31 | 2 | 60 | 480 | 240 |
| 32 | 2 | 40 | 480 | 240 |
| 33 | 2 | 0 | 480 | 240 |
| 34 | 1.98 | 0 | 480 | 240 |
| 35 | 1.96 | 0 | 480 | 240 |
| 36 | 1.94 | 0 | 480 | 240 |
| 37 | 1.92 | 0 | 480 | 240 |
| 38 | 1.9 | 0 | 480 | 240 |
| 39 | 1.88 | 0 | 480 | 240 |
| 40 | 1.86 | 0 | 480 | 240 |
| 41 | 1.84 | 0 | 480 | 240 |
| 42 | 1.82 | 0 | 480 | 240 |
| 43 | 1.8 | 0 | 480 | 240 |
| 44 | 1.78 | 0 | 480 | 240 |
| 45 | 1.76 | 0 | 480 | 240 |
| 46 | 1.74 | 0 | 480 | 240 |
| 47 | 1.72 | 0 | 480 | 240 |
| 48 | 1.7 | 0 | 480 | 240 |
| 49 | 1.68 | 0 | 480 | 240 |
| 50 | 1.66 | 0 | 480 | 240 |
| 51 | 1.64 | 0 | 480 | 240 |
| 52 | 1.62 | 0 | 480 | 240 |
| 53 | 1.6 | 0 | 480 | 240 |
| 54 | 1.58 | 0 | 480 | 240 |
| 55 | 1.56 | 0 | 480 | 240 |
| 56 | 1.54 | 0 | 480 | 240 |
| 57 | 1.52 | 0 | 480 | 240 |
| 58 | 1.5 | 0 | 480 | 240 |
| 59 | 1.48 | 0 | 480 | 240 |
| 60 | 1.46 | 0 | 480 | 240 |
| 61 | 1.44 | 0 | 480 | 240 |
| 62 | 1.42 | 0 | 480 | 240 |
| 63 | 1.4 | 0 | 480 | 240 |
| 64 | 1.38 | 0 | 480 | 240 |
| 65 | 1.36 | 0 | 480 | 240 |
| 66 | 1.34 | 0 | 480 | 240 |
| 67 | 1.32 | 0 | 480 | 240 |
| 68 | 1.3 | 0 | 480 | 240 |
| 69 | 1.28 | 0 | 480 | 240 |
| 70 | 1.26 | 0 | 480 | 240 |
| 71 | 1.24 | 0 | 480 | 240 |
| 72 | 1.22 | 0 | 480 | 240 |
| 73 | 1.2 | 0 | 480 | 240 |
| 74 | 1.18 | 0 | 480 | 240 |
| 75 | 1.16 | 0 | 480 | 240 |
| 76 | 1.14 | 0 | 480 | 240 |
| 77 | 1.12 | 0 | 480 | 240 |
| 78 | 1.1 | 0 | 480 | 240 |
| 79 | 1.08 | 0 | 480 | 240 |
| 80 | 1.06 | 0 | 480 | 240 |
| 81 | 1.04 | 0 | 480 | 240 |
| 82 | 1.02 | 0 | 480 | 240 |
| 83 | 1 | 0 | 480 | 240 |
| 84 | 0.98 | 0 | 480 | 240 |
| 85 | 0.96 | 0 | 480 | 240 |
| 86 | 0.94 | 0 | 480 | 240 |

TABLE 1-continued

Process recipe for Example A1.
Example A1

| | | | | |
|---|---|---|---|---|
| 87 | 0.92 | 0 | 480 | 240 |
| 88 | 0.9 | 0 | 480 | 240 |
| 89 | 0.88 | 0 | 480 | 240 |
| 90 | 0.86 | 0 | 480 | 240 |
| 91 | 0.84 | 0 | 480 | 240 |
| 92 | 0.82 | 0 | 480 | 240 |
| 93 | 0.8 | 0 | 480 | 240 |
| 94 | 0.78 | 0 | 480 | 240 |
| 95 | 0.76 | 0 | 480 | 240 |
| 96 | 0.74 | 0 | 480 | 240 |
| 97 | 0.72 | 0 | 480 | 240 |
| 98 | 0.7 | 0 | 480 | 240 |
| 99 | 0.68 | 0 | 480 | 240 |
| 100 | 0.66 | 0 | 480 | 240 |
| 101 | 0.64 | 0 | 480 | 240 |
| 102 | 0.62 | 0 | 480 | 240 |
| 103 | 0.6 | 0 | 480 | 240 |
| 104 | 0.58 | 0 | 480 | 240 |
| 105 | 0.56 | 0 | 480 | 240 |
| 106 | 0.54 | 0 | 480 | 240 |
| 107 | 0.52 | 0 | 480 | 240 |
| 108 | 0.5 | 0 | 480 | 240 |
| 109 | 0.48 | 0 | 480 | 240 |
| 110 | 0.46 | 0 | 480 | 240 |
| 111 | 0.44 | 0 | 480 | 240 |
| 112 | 0.42 | 0 | 480 | 240 |
| 113 | 0.4 | 0 | 480 | 240 |
| 114 | 0.38 | 0 | 480 | 240 |
| 115 | 0.36 | 0 | 480 | 240 |
| 116 | 0.34 | 0 | 480 | 240 |
| 117 | 0.32 | 0 | 480 | 240 |
| 118 | 0.3 | 0 | 480 | 240 |
| 119 | 0.28 | 0 | 480 | 240 |
| 120 | 0.26 | 0 | 480 | 240 |
| 121 | 0.24 | 0 | 480 | 10800 |

Figure 9:
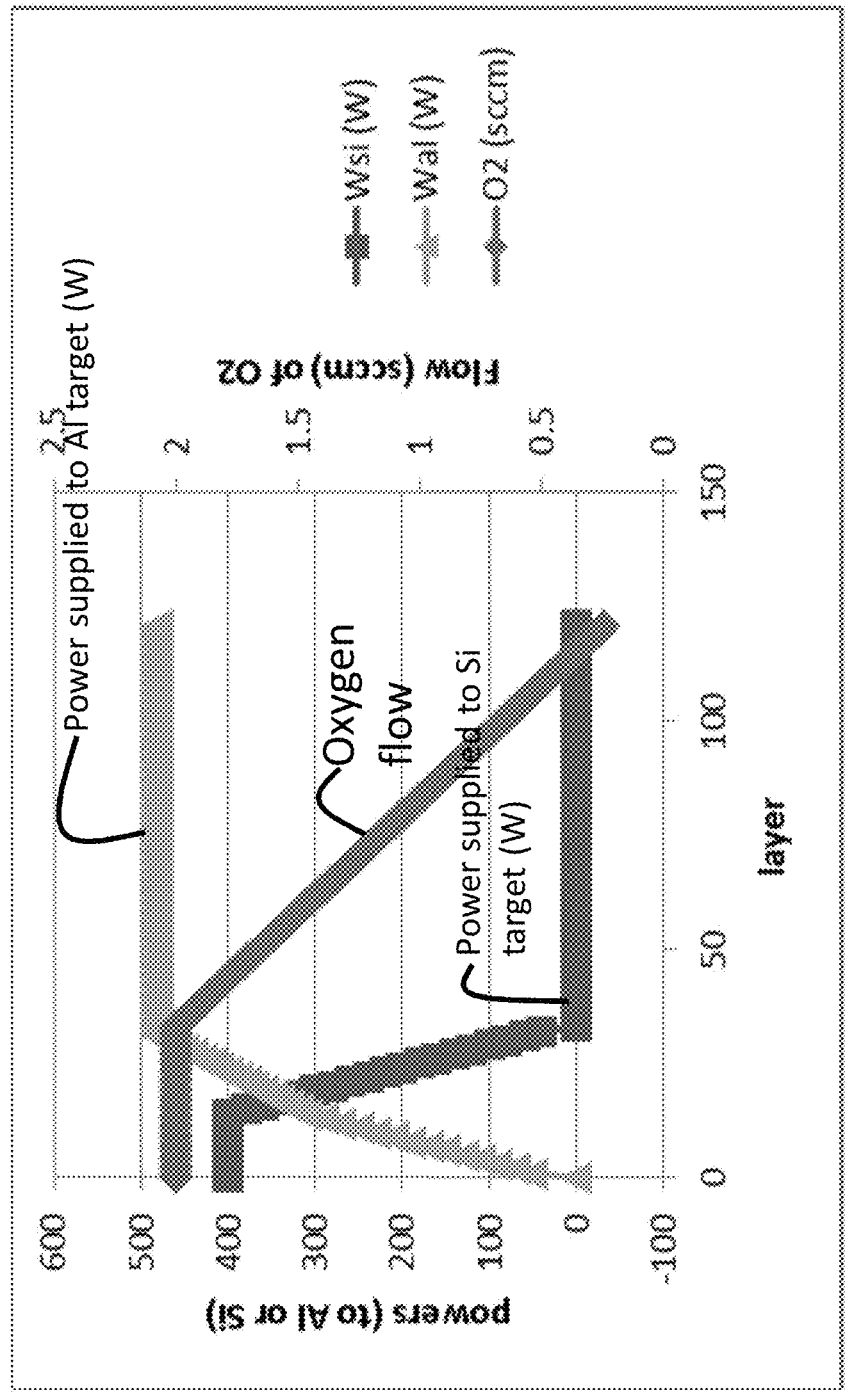
FIG. 9 is a graphical depiction of process parameters used to create the refractive index gradient of Example A1.
Figure 10:
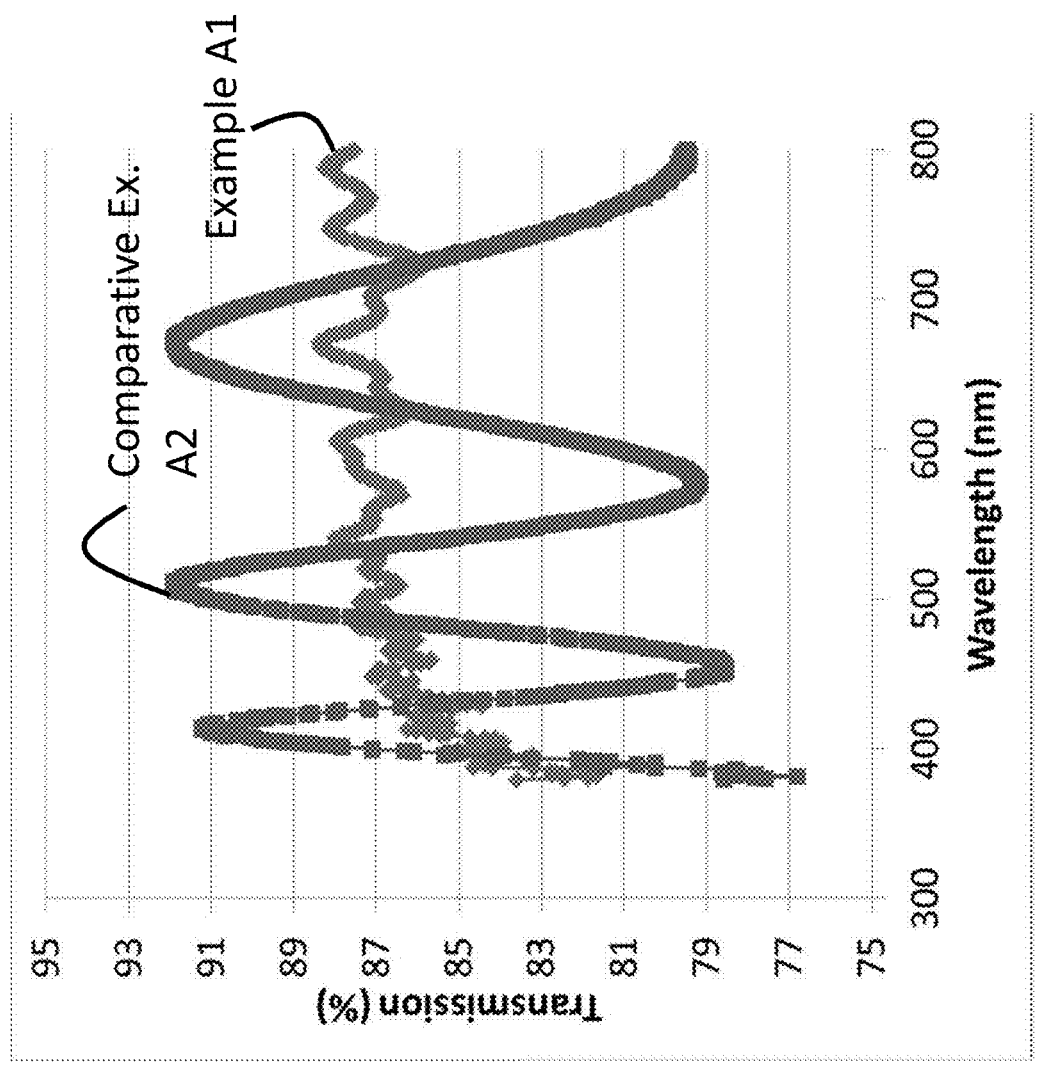
FIG. 10 is a plot showing the transmittance spectra of Example A1 and Comparative Example A2.

The substrates were not heated during deposition of the optical film of Example A1 or the single layer of Comparative Example A2. FIG. 9 shows a graphical representation of the recipe used to form Example A1. In Table 1, nitrogen gas and argon were flowed into the reactive sputtering chamber at the constant gas flow rates shown, while the rate of oxygen gas flow was varied. The transmittance spectra for Example A1 and Comparative Example A2 was obtained and is shown in FIG. 10. As shown in FIG. 10, the transmittance of Example A1 is notably smoother and has lower oscillation amplitudes over the wavelength range shown. Without being bound by theory, it was found that the inclusion of a capping layer as described herein increased the transmittance slightly (e.g., 1%).

Example A1 and Comparative Example A2 were scratched using garnet sandpaper. Example A1 exhibited almost no scratches visible to the eye, while Comparative Example A2 exhibited significant scratches which were visible to the eye.

Example A3 was formed using the same process recipe as Example A1; however, the substrate was heated to a temperature of about 200° C. during deposition of the optical film. Example A3 exhibited greater colorlessness (e.g., Example C appeared less yellow than Example A1).

Example B

Example B1 and Comparative Example B2 were formed using a strengthened aluminosilicate glass substrate. Example B1 included an optical film formed using the same process recipe used for Example A3 and having a thickness of about 3 μm. Comparative Example EB2 included a three-layer film that included a first layer of $Al_2O_3$ (having a thickness of about 115 nm, a second layer of AlOxNy (having a thickness of about 2 μm) and a third layer of SiO2 (having a thickness of about 32 nm. Comparative Example B2 was formed according to the process recipe shown in Table 2A and Table 2B.

TABLE 2A

Flow rates and power supplied to
targets for Comparative Example B2.

| Material | $Al_2O_3$ | AlOxNy | $SiO_2$ |
|---|---|---|---|
| Ar (Mag1) | 50 | 75 | 0 |
| Ar (Mag2) | 0 | 0 | 0 |
| $O_2$ (ion) | 40 | 4 | 10 |
| Ar (ion) | 10 | 25 | 25 |
| $N_2$ (ion) | 0 | 50 | 0 |
| DC Current | 280 | 200 | |
| DC Voltage | 80 | 50 | |

TABLE 2B

Sputtering process conditions
for Comparative Example B2:

| Step | Dep/Clean | Rate Å/sec | Time (min) | Pressure Torr | Ion Gun (Current, Power) |
|---|---|---|---|---|---|
| 1 | 60 minutes pump | 0 | 60 | | |
| 2 | Initialize Start Gas | 0.00 | 0.75 | | |
| 3 | Mag 1 Al clean | 0.00 | 2.5 | 5.2-4E | 200 watts, 50 volts |
| 4 | Mag 1 Al2O3 | 2.00 | 6 | 4-4E | 280 watts, 70 volts |
| 5 | Mag 1 Al clean | 0.00 | | | |
| 6 | Mag 1AlON | 2.00 | | 6.1-4E | 200 watts, 50 volts |
| 7 | SiO2 EBG Pocket 1 | 3.00 | | | |
| 8 | Cool down | | 1.0 | | |
| 9 | Shut down | | 20.0 | | |
| Total Process Time: | | 90.3 | Min | | |

Figure 11:
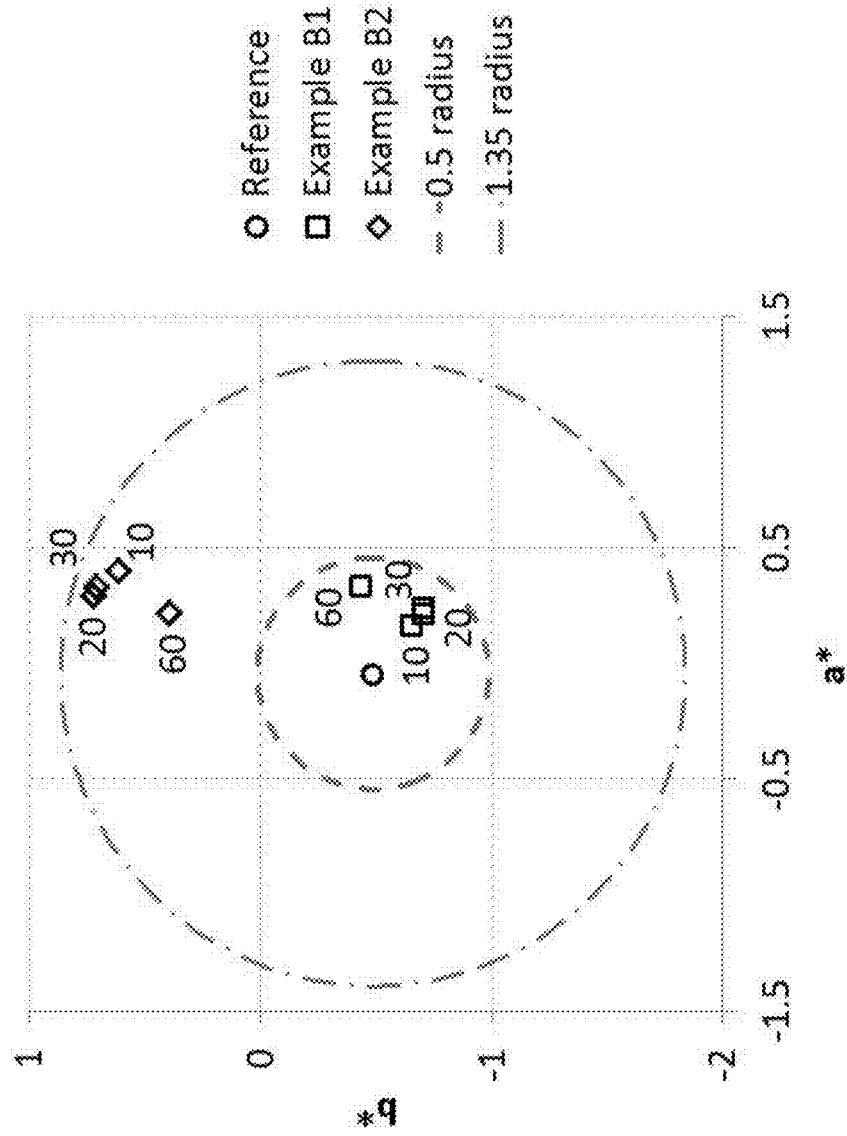
FIG. 11 is a plot showing the reflected a* and b* color values of Example B1 and Comparative Example B2 under D65 illuminant when viewed at incident viewing angles of 10 degrees, 20 degrees, 30 degrees and 60 degrees.

Example B1 and Comparative Example B2 were evaluated for their respective reflected color points (or color shifts) when viewed at incident viewing angles of 10 degrees, 20 degrees, 30 degrees and 60 degrees from normal incidence, under D65 illuminant. The reflected a* and b* values of Example B1 and Comparative Example B2 at the different incident viewing angles were plotted and compared to the a* and b* color values of the underlying substrates in FIG. 11. The a* and b* values for Example D are closer to the a* and b* values of the underlying substrate, indicating a low color shift such as, for example, a color shift of ±0.5.

The composition of the optical film of Example B1 was measured as a function of depth using (XPS and examined for its cross-sectional scanning electron microscope (SEM) secondary electron (SE) image. XPS data was obtained by sputtering the surface of the optical film with argon ions. The sputter rate was calibrated using values obtained by measuring the depth of constant composition films of different Si:Al:N:O ratios. The XPS-obtained compositions were calibrated for preferential sputtering of different atoms by sputtering films of known compositions. The XPS depth profiles showed the silicon content the highest at or adjacent to the first surface and the Al and N content as the highest opposite at or adjacent to the second surface.

Figure 12:
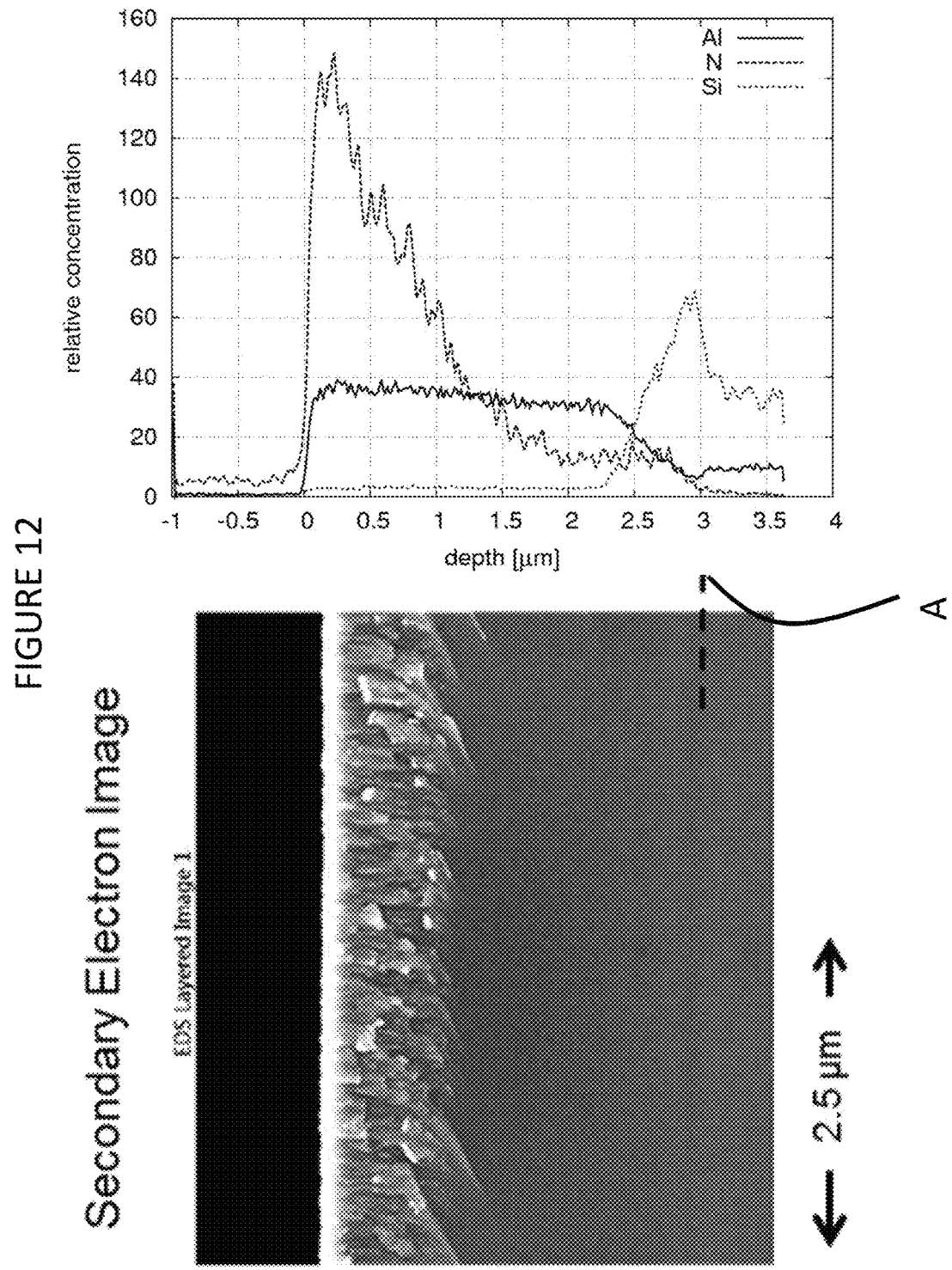
FIG. 12 shows the scanning electron microscope (SEM) secondary electron (SE) image and a compositional profile plot for the optical film of Example B1.

FIG. 12 specifically shows the SEM SE image of Example B1 and a compositional profile plot showing the relative concentrations of aluminum, silicon, oxygen and nitrogen in the optical film of Example B1. The compositional profiles were obtained by integrating the intensity of the X-ray depth profile obtained from a fracture surface to obtain relative intensities as a function of the depth. The dashed line "A" indicates the interface between the substrate and the optical film. As shown in FIG. 12, the relative concentration of silicon is highest near "A" (or at or adjacent to the first surface) and the concentration of aluminum is highest at the opposite end of the optical film from "A" (or at or adjacent to the second surface). The concentration of nitrogen changes substantially from "A" to the opposite end of the optical film from "A".

Figure 13:
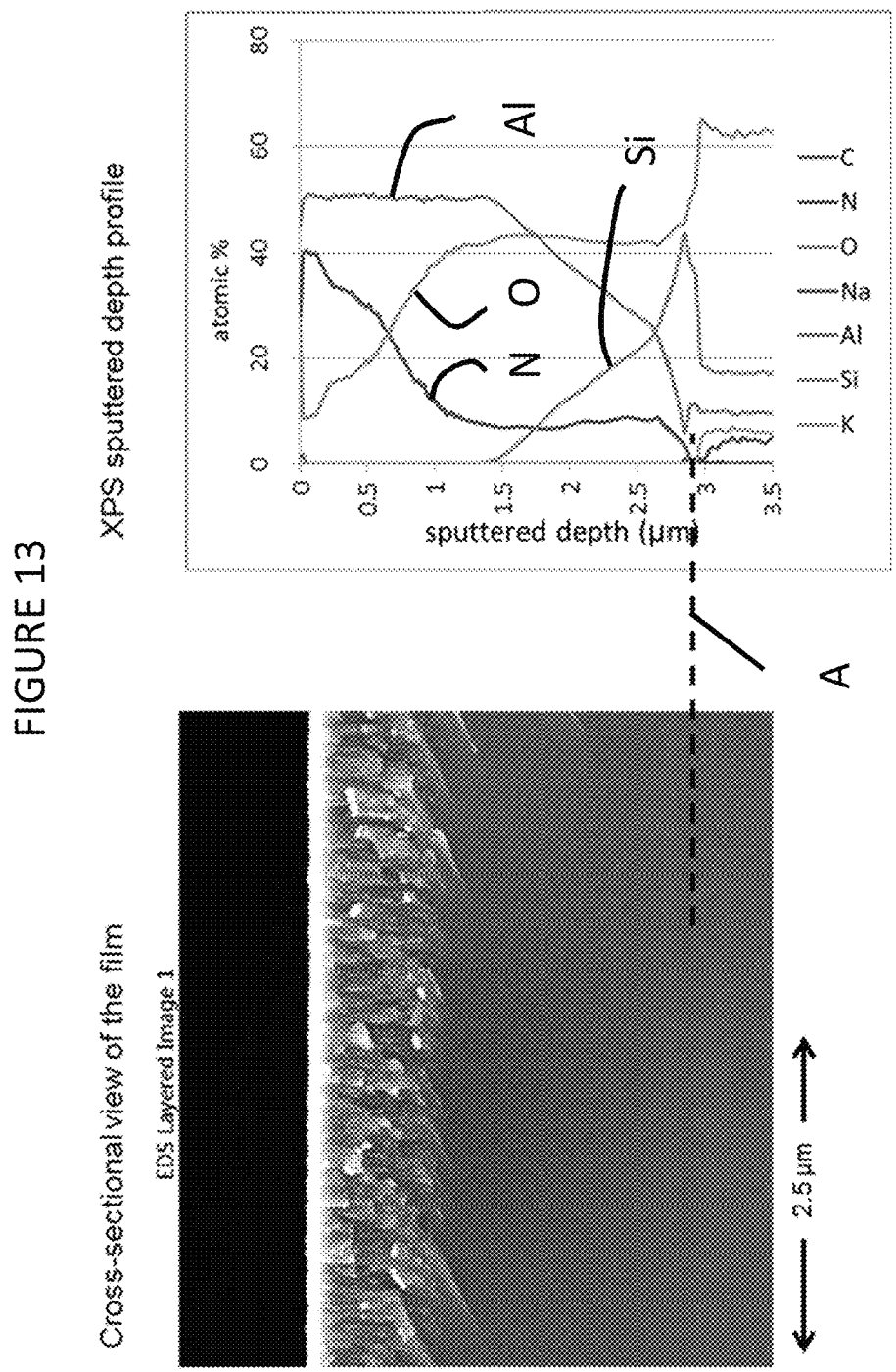
FIG. 13 shows a comparison of the energy dispersive spectroscopy (EDS) X-ray photoelectron spectroscopy (XPS) depth profile in terms of atomic % and the SEM SE image (also shown in FIG. 12) of Example B1.

FIG. 13 shows a comparison of the XPS depth profile in terms of atomic % and the SEM SE image of Example B1. FIGS. 12 and 13 show the optical film having a composition of SiOxNy at the first surface, although this composition is believed to be present in a thin sub-layer(s) at the first surface.

Example C

Examples C1, C2 and C3 were made to evaluate the effect of heat treatment of the optical film on optical absorption (and thus color). Each of Examples C1, C2 and C3 were made using the same substrate as used in Example A. A single layer of $Si_uAl_vO_xN_y$ was deposited at different temperatures onto each substrate. The films had a refractive index of approximately 1.6 and were made using an argon flow of about 2 sccm, nitrogen flow of 40 sccm, and oxygen flow of 8 sccm. About 40 W of DC power was supplied to the Si target and about 480 W of DC power was supplied to the Al target within a chamber having a pressure of about 10 mTorr. The deposition time for each Example was 30 minutes and the films were deposited at 25° C., 100° C. and 200° C., for Examples C1, C2 and C3 respectively.

Figure 14:
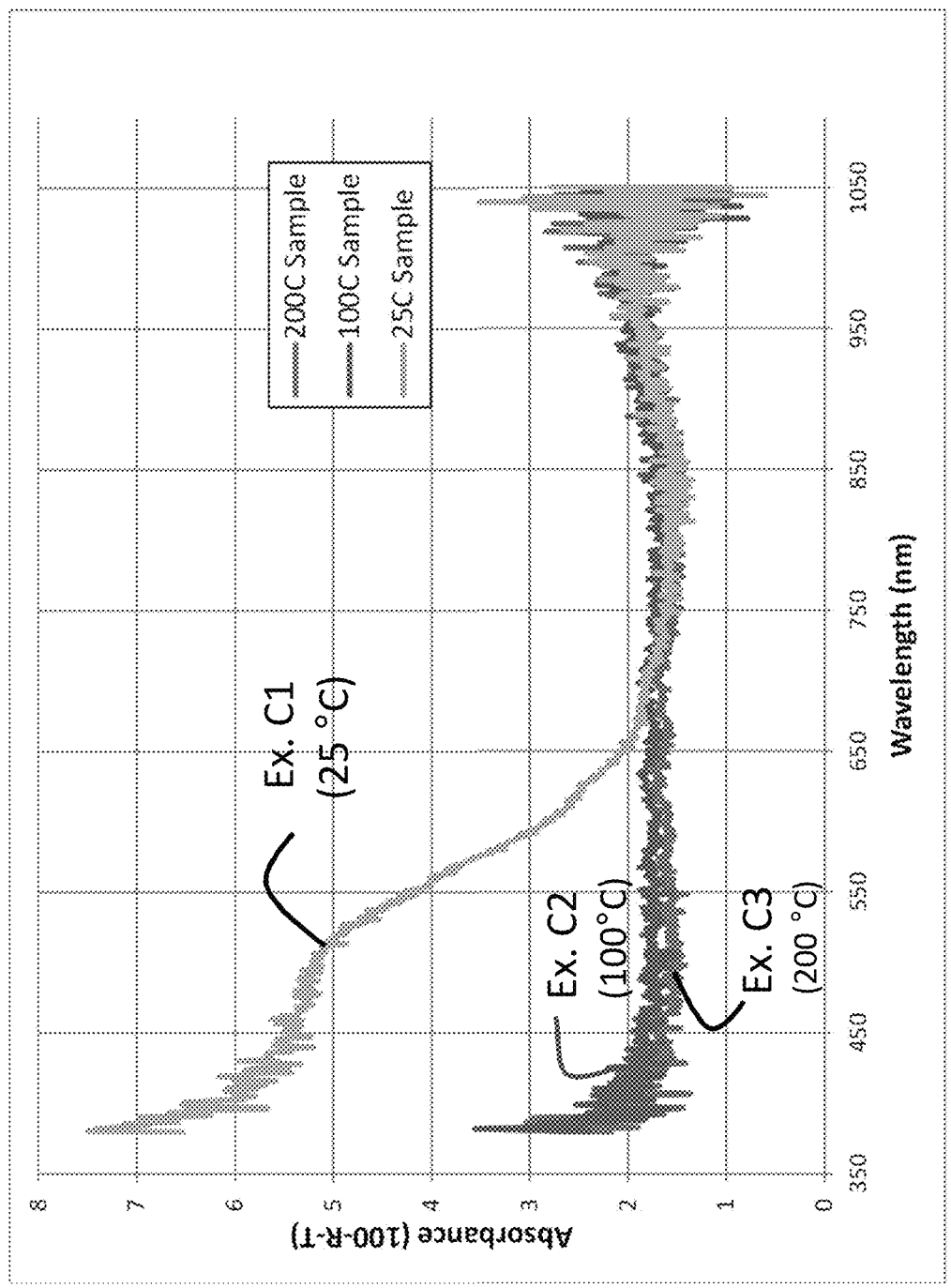
FIG. 14 shows a plot of optical absorbance vs. wavelength for Examples C1-C3.

The optical absorbance for each of Examples C1, C2 and C3 was plotted in FIG. 14. As shown in FIG. 14, a trend can be seen that Example C1 (deposited at a lower temperature) exhibited substantially higher absorbance, especially in blue and green portions of the optical wavelength regime. The resulting film had a visible yellow-brown color. In contrast, Examples C2 and C3 (deposited at higher temperatures exhibited low and flat absorbance spectra, as confirmed by their substantially clear and visible appearance to the eye.

Example D

Figure 15:
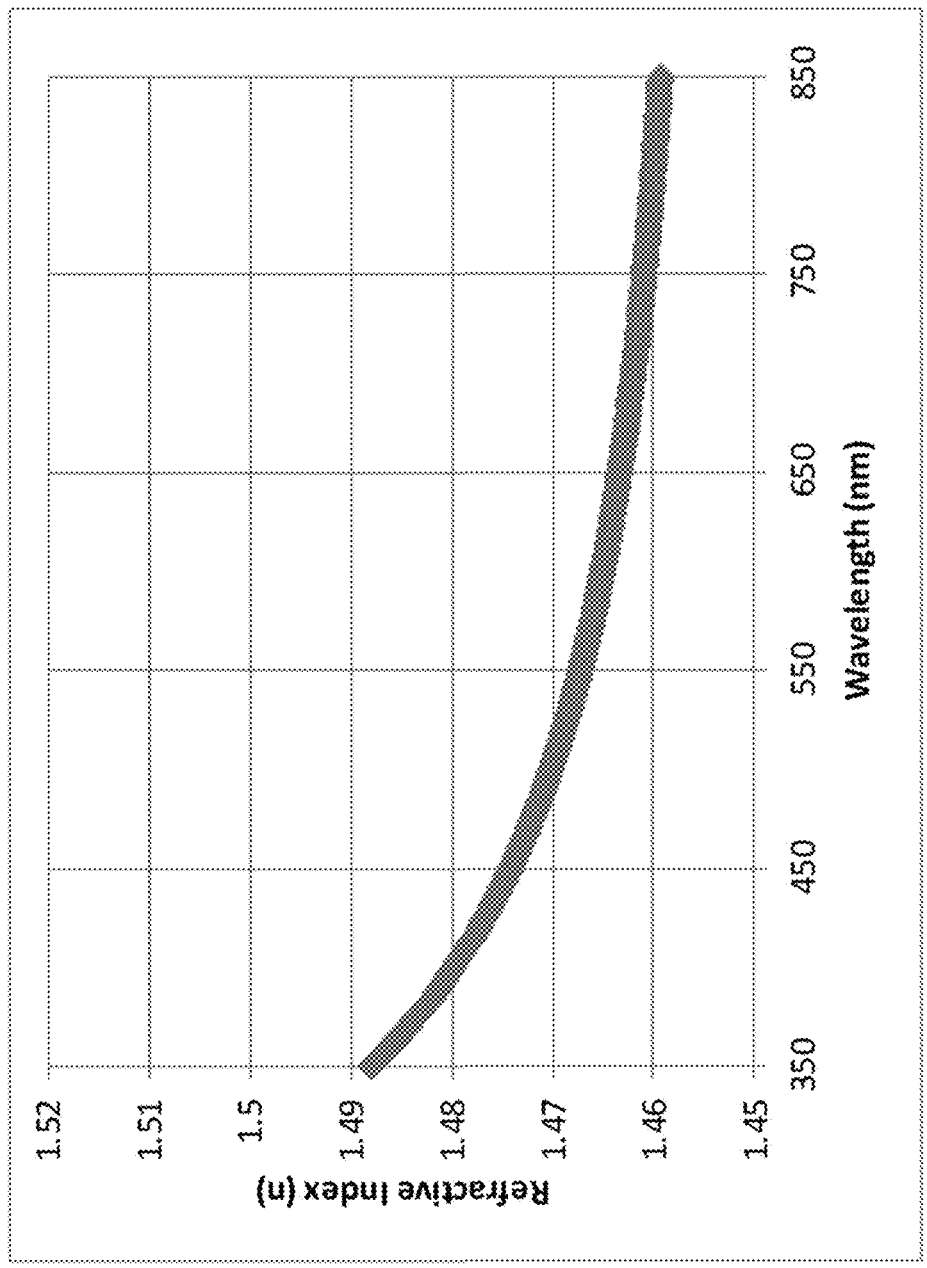
FIG. 15 shows a refractive index plot of e-beam evaporated porous $Al_2O_3$ according to Example D1.

Example D1 was prepared and included an optical film with a refractive index gradient, where said sub-layer has a refractive index close to that of a glass substrate. Example D1 included the same substrate as used in Examples B-C and included an optical film with an optical interference layer including porous $Al_2O_3$ sub-layers. The porous $Al_2O_3$ sub-layers were formed to have a refractive index similar to the refractive index of the glass substrate using e-beam evaporation under an oxygen flow of 150 sccm and argon flow of 100 sccm with a chamber pressure of 9.5 e-4 torr at approximately 25° C. The porous sub-layers were transparent and exhibited a measured refractive index of about 1.47 at 550 nm, which is indicative of a porosity level of 25-30%. FIG. 15 shows the refractive index of Example D1.

Modeled Example E

Modeled Examples E1-E2 included optical films with refractive index gradients formed by a combination of porosity gradients and different materials, as shown in Table 3. The refractive indices achievable for these different materials, by varying density or porosity of these films, were established experimentally through single-layer film deposition experiments using e-beam evaporation with varying or controlled chamber pressure and/or deposition rate. Modeled Example E1 included a first sub-layer of $Al_2O_3$ with a porosity gradient to provide a refractive index gradient range from about 1.51 to about 1.6. Modeled Example E1 also included a second sub-layer of $Ta_2O_5$ having a porosity gradient to provide a refractive index gradient range from about 1.6 to 1.95. Modeled Example E2 included a first sub-layer of $Y_2O_3$ and a second sub-layer of $Ta_2O_5$ to provide a refractive index gradient from about 1.45 to about 2.0.

As noted in Table 3, literature values for very dense films (achieved using alternate deposition processes or optimized e-beam evaporation processes with ion assist, which was not used here) can expand the refractive index ranges achievable for the optical films, particularly at or adjacent to the second surface, where high refractive index or dense materials are useful.

TABLE 3

Single-layers of materials deposited at varying pressure using e-beam evaporation without ion assist, and exemplary refractive indices achieved. The layers were deposited to illustrate the ranges of indices that can be achieved and thus used to form the refractive index gradients described herein.

| Material | Refractive Index (at 550 nm) | O$_2$ flow (sccm) | Pressure (mTorr) | Dep. Rate (Å/sec) | Literature Index for fully dense films[1] |
|---|---|---|---|---|---|
| Low-n Al2O3 | 1.453 | 100 | 0.6 | 1.5 | 1.65 |
| High-n Al2O3 | 1.609 | 4 | 0.044 | 2.5 | 1.65 |
| Low-n Ta2O5 | 1.586 | 180 | 1.2 | 1.0 | 2.25 |
| High-n Ta2O5 | 2.037 | 8 | 0.09 | 2.5 | 2.25 |
| Low-n Y2O3 | 1.456 | 70 | 0.39 | 0.5 | 1.98 |
| High-n Y2O3 | 1.701 | 4 | 0.04 | 2.5 | 1.98 |

[1]Balasubramanian et. al., "Comparative study of titanium dioxide thin films produced by electron-beam evaporation and by reactive low-voltage ion-plating", Applied Optics v.32, no.28, p.5594, (1993).

The refractive indices provided in Table 3 approximately define a low value and high value of a refractive index range achieved in these experiments. The high index can be increased even more using alternate or optimized deposition processes. Refractive indices in between the low value and the high value of the range can be made by tuning the gas pressure, substrate temperature, deposition rate, or gas composition during each deposition process, in order to form a gradient in refractive index, as in modeled examples E1 and E2 described above.

All of the materials described in Table 3 above were deposited using precursor materials such as oxides (e.g., $Al_2O_3$, $Ta_2O_5$, and $Y_2O_3$) and oxygen, which was added to the chamber to make fully oxidized films. The films made were optically clear with low absorption (<1%) and low scattering (<1%) across the optical wavelength regime. The only working gas added to these processes was oxygen, which also was used to control the chamber pressure. Other known method for controlling pressure such as adding argon/oxygen mixtures or throttling the vacuum valve are also likely to be effective. Deposition rate was also varied in the above experiments as shown.

Modeled Example F

Examples F1-F3 used modeling to understand the reflectance spectra and color shift of articles that included an optical film with an optical modifying layer having a refractive index gradient, a scratch-resistant layer and a capping layer. The modeling was based on collected refractive index data from formed layers of various materials and a strengthened aluminoborosilicate ("ABS") glass substrate.

The layers and sub-layers of the optical modifying layer were formed using calculated weighted averages of $Si_uAl_vO_xN_y$ mixtures deposited onto silicon wafers. The layers/sub-layers of $Si_uAl_vO_xN_y$ were deposited onto the silicon wafers by DC reactive sputtering combined with RF superimposed DC sputtering, with ion assist using a sputter deposition tool supplied by AJA-Industries. The wafer was heated to 200° C. during deposition and silicon targets having a 3 inch diameter and an aluminum targets having a 3 inch diameter were used. Reactive gases used included nitrogen and oxygen and argon was used as the inert gas. The RF power was supplied to the silicon target at 13.56 Mhz and DC power was supplied to the aluminum target.

The scratch-resistant layer included a single layer of $Si_uAl_vO_xN_y$ formed in the same manner as the optical modification layer. The resulting scratch-resistant layer had a refractive index at 550 nm of about 1.95 and a measured hardness of greater than about 15 GPa, using a Berkovitch indenter on the surface of the $Si_uAl_vO_xN_y$ layer being tested, as described herein.

The capping layer of $SiO_2$ was deposited onto silicon wafers by DC reactive sputtering from a silicon target at a temperature of about 50° C. using ion assist. The capping layers formed in this manner are designated with the indicator "RS".

The refractive indices (as a function of wavelength) of the formed layers of the optical film and the glass substrates were measured using spectroscopic ellipsometry. Tables 4-7 include the refractive indices and dispersion curves measured. For Mat1-Mat13 used in the optical modifying layer of Modeled Examples F1-F3, the extinction coefficients (k values) were all set to zero, in agreement with experiments from which the dispersion curves shown in Table 7 were derived. The refractive indices thus experimentally measured were then used to calculate reflectance spectra and angular color shift for the various modeled Examples.

TABLE 4

Refractive indices and dispersion curve for a RS-SiO2 layer vs. wavelength.

| Material Wavelength (nm) | SiO2-RS Refractive Index (n) | Extinction Coefficient (k) |
|---|---|---|
| 246.5 | 1.52857 | 0.0 |
| 275.2 | 1.51357 | 0.0 |
| 300.8 | 1.50335 | 0.0 |
| 324.7 | 1.49571 | 0.0 |
| 350.2 | 1.48911 | 0.0 |
| 375.8 | 1.48374 | 0.0 |
| 399.7 | 1.47956 | 0.0 |
| 425.2 | 1.47583 | 0.0 |

TABLE 4-continued

Refractive indices and dispersion curve for a RS-SiO2 layer vs. wavelength.

| Material Wavelength (nm) | SiO2-RS Refractive Index (n) | Extinction Coefficient (k) |
|---|---|---|
| 450.7 | 1.47269 | 0.0 |
| 476.3 | 1.47002 | 0.0 |
| 500.2 | 1.46788 | 0.0 |
| 525.7 | 1.46589 | 0.0 |
| 549.5 | 1.46427 | 0.0 |
| 575.0 | 1.46276 | 0.0 |
| 600.5 | 1.46143 | 0.0 |
| 625.9 | 1.46026 | 0.0 |
| 649.7 | 1.45928 | 0.0 |
| 675.1 | 1.45835 | 0.0 |
| 700.5 | 1.45751 | 0.0 |
| 725.9 | 1.45676 | 0.0 |
| 751.3 | 1.45609 | 0.0 |
| 775.0 | 1.45551 | 0.0 |
| 800.4 | 1.45496 | 0.0 |
| 850.9 | 1.45399 | 0.0 |
| 899.8 | 1.45320 | 0.0 |
| 950.2 | 1.45252 | 0.0 |
| 999.0 | 1.45195 | 0.0 |
| 1100.0 | 1.45100 | 0.0 |
| 1199.6 | 1.45028 | 0.0 |
| 1302.0 | 1.44971 | 0.0 |
| 1400.8 | 1.44928 | 0.0 |
| 1499.7 | 1.44892 | 0.0 |
| 1599.0 | 1.44863 | 0.0 |
| 1688.4 | 1.44841 | 0.0 |

TABLE 5

Refractive indices and dispersion curve for a $Si_uAl_vO_xN_y$ layer vs. wavelength.

| Material Wavelength (nm) | SiAlON-195 Refractive Index (n) | Extinction Coefficient (k) |
|---|---|---|
| 206.6 | 2.37659 | 0.21495 |
| 225.4 | 2.28524 | 0.11270 |
| 251.0 | 2.18818 | 0.04322 |
| 275.5 | 2.12017 | 0.01310 |
| 300.9 | 2.06916 | 0.00128 |
| 324.6 | 2.03698 | 0.0 |
| 350.2 | 2.01423 | 0.0 |
| 360.4 | 2.00718 | 0.0 |
| 371.2 | 2.00059 | 0.0 |
| 380.3 | 1.99562 | 0.0 |
| 389.9 | 1.99090 | 0.0 |
| 400.0 | 1.98640 | 0.0 |
| 410.5 | 1.98213 | 0.0 |
| 421.7 | 1.97806 | 0.0 |
| 430.5 | 1.97513 | 0.0 |
| 439.7 | 1.97230 | 0.0 |
| 449.2 | 1.96958 | 0.0 |
| 459.2 | 1.96695 | 0.0 |
| 469.6 | 1.96441 | 0.0 |
| 480.6 | 1.96197 | 0.0 |
| 492.0 | 1.95961 | 0.0 |
| 499.9 | 1.95808 | 0.0 |
| 512.3 | 1.95586 | 0.0 |
| 520.9 | 1.95442 | 0.0 |
| 529.9 | 1.95301 | 0.0 |
| 539.1 | 1.95165 | 0.0 |
| 548.6 | 1.95031 | 0.0 |
| 558.5 | 1.94900 | 0.0 |
| 568.7 | 1.94773 | 0.0 |
| 579.4 | 1.94649 | 0.0 |
| 590.4 | 1.94528 | 0.0 |
| 601.9 | 1.94410 | 0.0 |
| 613.8 | 1.94295 | 0.0 |
| 619.9 | 1.94239 | 0.0 |

TABLE 5-continued

Refractive indices and dispersion curve
for a $Si_xAl_yO_xN_y$ layer vs. wavelength.

| Material<br>Wavelength<br>(nm) | SiAlON-195<br>Refractive<br>Index (n) | Extinction<br>Coefficient (k) |
|---|---|---|
| 632.6 | 1.94128 | 0.0 |
| 639.1 | 1.94074 | 0.0 |
| 652.6 | 1.93968 | 0.0 |
| 666.6 | 1.93864 | 0.0 |
| 681.2 | 1.93763 | 0.0 |
| 696.5 | 1.93665 | 0.0 |
| 712.6 | 1.93569 | 0.0 |
| 729.3 | 1.93477 | 0.0 |
| 746.9 | 1.93386 | 0.0 |
| 765.3 | 1.93299 | 0.0 |
| 784.7 | 1.93214 | 0.0 |
| 805.1 | 1.93131 | 0.0 |
| 826.6 | 1.93051 | 0.0 |
| 849.2 | 1.92973 | 0.0 |
| 873.1 | 1.92898 | 0.0 |
| 898.4 | 1.92825 | 0.0 |
| 925.3 | 1.92754 | 0.0 |
| 953.7 | 1.92686 | 0.0 |
| 999.9 | 1.92587 | 0.0 |
| 1050.7 | 1.92494 | 0.0 |
| 1107.0 | 1.92406 | 0.0 |
| 1169.7 | 1.92323 | 0.0 |
| 1239.8 | 1.92245 | 0.0 |
| 1319.0 | 1.92172 | 0.0 |
| 1408.9 | 1.92103 | 0.0 |
| 1512.0 | 1.92040 | 0.0 |
| 1631.4 | 1.91981 | 0.0 |
| 1771.2 | 1.91926 | 0.0 |
| 1999.8 | 1.91861 | 0.0 |

TABLE 6

Refractive indices and dispersion curve
for a strengthened aluminoborosilicate
glass substrate vs. wavelength.

| Material<br>Wavelength<br>(nm) | ABS glass<br>Refractive<br>Index (n) | Extinction<br>Coefficient (k) |
|---|---|---|
| 350.6 | 1.53119 | 0.0 |
| 360.7 | 1.52834 | 0.0 |
| 370.8 | 1.52633 | 0.0 |
| 380.8 | 1.52438 | 0.0 |
| 390.9 | 1.52267 | 0.0 |
| 400.9 | 1.52135 | 0.0 |
| 411.0 | 1.52034 | 0.0 |
| 421.0 | 1.51910 | 0.0 |
| 431.1 | 1.51781 | 0.0 |
| 441.1 | 1.51686 | 0.0 |
| 451.2 | 1.51600 | 0.0 |
| 461.2 | 1.51515 | 0.0 |
| 471.2 | 1.51431 | 0.0 |
| 481.3 | 1.51380 | 0.0 |
| 491.3 | 1.51327 | 0.0 |
| 501.3 | 1.51259 | 0.0 |
| 511.4 | 1.51175 | 0.0 |
| 521.4 | 1.51124 | 0.0 |
| 531.4 | 1.51082 | 0.0 |
| 541.5 | 1.51040 | 0.0 |
| 551.5 | 1.50999 | 0.0 |
| 561.5 | 1.50959 | 0.0 |
| 571.5 | 1.50918 | 0.0 |
| 581.6 | 1.50876 | 0.0 |
| 591.6 | 1.50844 | 0.0 |
| 601.6 | 1.50828 | 0.0 |
| 611.6 | 1.50789 | 0.0 |
| 621.7 | 1.50747 | 0.0 |
| 631.7 | 1.50707 | 0.0 |
| 641.7 | 1.50667 | 0.0 |
| 651.7 | 1.50629 | 0.0 |
| 661.7 | 1.50591 | 0.0 |
| 671.8 | 1.50555 | 0.0 |
| 681.8 | 1.50519 | 0.0 |
| 691.8 | 1.50482 | 0.0 |
| 701.8 | 1.50445 | 0.0 |
| 709.8 | 1.50449 | 0.0 |
| 719.8 | 1.50456 | 0.0 |
| 729.9 | 1.50470 | 0.0 |
| 739.9 | 1.50484 | 0.0 |
| 749.9 | 1.50491 | 0.0 |

TABLE 7

Refractive indices and dispersion curve
for Mat 1-Mat 13 vs. wavelength.

| Wavelength<br>(nm) | Refractive<br>Index (n) | Refractive<br>Index (n) | Refractive<br>Index (n) | Refractive<br>Index (n) |
|---|---|---|---|---|
| Material | Mat1 | Mat2 | Mat3 | Mat4 |
| 324.6 | 1.60281 | 1.77200 | 1.95663 | 1.57203 |
| 350.2 | 1.59463 | 1.75783 | 1.93640 | 1.56499 |
| 375.7 | 1.58852 | 1.74760 | 1.92198 | 1.55966 |
| 400.0 | 1.58394 | 1.74013 | 1.91155 | 1.55564 |
| 424.6 | 1.58019 | 1.73410 | 1.90319 | 1.55231 |
| 449.2 | 1.57711 | 1.72922 | 1.89647 | 1.54958 |
| 476.9 | 1.57426 | 1.72476 | 1.89035 | 1.54703 |
| 499.9 | 1.57227 | 1.72167 | 1.88613 | 1.54525 |
| 525.4 | 1.57039 | 1.71878 | 1.88220 | 1.54356 |
| 548.6 | 1.56892 | 1.71652 | 1.87914 | 1.54223 |
| 574.0 | 1.56752 | 1.71439 | 1.87625 | 1.54097 |
| 601.9 | 1.56619 | 1.71238 | 1.87354 | 1.53977 |
| 626.2 | 1.56518 | 1.71086 | 1.87149 | 1.53886 |
| 652.6 | 1.56422 | 1.70942 | 1.86955 | 1.53799 |
| 673.8 | 1.56353 | 1.70838 | 1.86815 | 1.53736 |
| 696.5 | 1.56286 | 1.70738 | 1.86681 | 1.53676 |
| 720.8 | 1.56222 | 1.70642 | 1.86553 | 1.53617 |
| 746.9 | 1.56160 | 1.70550 | 1.86429 | 1.53561 |
| 774.9 | 1.56100 | 1.70462 | 1.86312 | 1.53507 |
| 805.1 | 1.56043 | 1.70377 | 1.86199 | 1.53455 |
| 849.2 | 1.55971 | 1.70270 | 1.86056 | 1.53389 |
| 898.4 | 1.55902 | 1.70169 | 1.85922 | 1.53327 |
| 999.9 | 1.55792 | 1.70008 | 1.85706 | 1.53227 |
| 1087.6 | 1.55722 | 1.69904 | 1.85569 | 1.53162 |
| 1192.2 | 1.55657 | 1.69810 | 1.85444 | 1.53103 |
| 1319.0 | 1.55598 | 1.69724 | 1.85330 | 1.53050 |
| 1441.7 | 1.55556 | 1.69663 | 1.85249 | 1.53011 |
| 1589.5 | 1.55517 | 1.69607 | 1.85174 | 1.52975 |
| 1771.2 | 1.55483 | 1.69556 | 1.85107 | 1.52944 |
| 1999.8 | 1.55452 | 1.69511 | 1.85048 | 1.52915 |
| Material | Mat5 | Mat6 | Mat7 | Mat8 |
| 324.6 | 1.68635 | 1.85893 | 1.99199 | 1.55213 |
| 350.2 | 1.67516 | 1.84185 | 1.97064 | 1.54585 |
| 375.7 | 1.66697 | 1.82962 | 1.95545 | 1.54103 |
| 400.0 | 1.66094 | 1.82073 | 1.94447 | 1.53737 |
| 424.6 | 1.65605 | 1.81358 | 1.93568 | 1.53432 |
| 449.2 | 1.65206 | 1.80783 | 1.92862 | 1.53181 |
| 476.9 | 1.64841 | 1.80257 | 1.92219 | 1.52947 |
| 499.9 | 1.64586 | 1.79894 | 1.91777 | 1.52782 |
| 525.4 | 1.64348 | 1.79556 | 1.91364 | 1.52626 |
| 548.6 | 1.64161 | 1.79291 | 1.91043 | 1.52502 |
| 574.0 | 1.63984 | 1.79042 | 1.90740 | 1.52385 |
| 601.9 | 1.63818 | 1.78808 | 1.90456 | 1.52274 |
| 626.2 | 1.63691 | 1.78630 | 1.90241 | 1.52189 |
| 652.6 | 1.63571 | 1.78462 | 1.90038 | 1.52108 |

TABLE 7-continued

Refractive indices and dispersion curve for Mat 1-Mat 13 vs. wavelength.

| Wavelength (nm) | Refractive Index (n) | Refractive Index (n) | Refractive Index (n) | Refractive Index (n) |
|---|---|---|---|---|
| 673.8 | 1.63484 | 1.78341 | 1.89891 | 1.52049 |
| 696.5 | 1.63401 | 1.78225 | 1.89751 | 1.51993 |
| 720.8 | 1.63321 | 1.78114 | 1.89617 | 1.51938 |
| 746.9 | 1.63244 | 1.78007 | 1.89487 | 1.51886 |
| 774.9 | 1.63170 | 1.77904 | 1.89364 | 1.51835 |
| 805.1 | 1.63099 | 1.77806 | 1.89246 | 1.51787 |
| 849.2 | 1.63009 | 1.77682 | 1.89096 | 1.51725 |
| 898.4 | 1.62925 | 1.77566 | 1.88956 | 1.51667 |
| 999.9 | 1.62789 | 1.77378 | 1.88731 | 1.51573 |
| 1087.6 | 1.62701 | 1.77258 | 1.88587 | 1.51512 |
| 1192.2 | 1.62622 | 1.77149 | 1.88456 | 1.51457 |
| 1319.0 | 1.62550 | 1.77051 | 1.88337 | 1.51407 |
| 1441.7 | 1.62498 | 1.76979 | 1.88252 | 1.51370 |
| 1589.5 | 1.62451 | 1.76915 | 1.88174 | 1.51337 |
| 1771.2 | 1.62408 | 1.76856 | 1.88104 | 1.51307 |
| 1999.8 | 1.62370 | 1.76805 | 1.88043 | 1.51280 |

| Material | Mat9 | Mat10 | Mat11 | Mat12 |
|---|---|---|---|---|
| 324.6 | 1.61136 | 1.72843 | 1.86707 | 1.97469 |
| 350.2 | 1.60287 | 1.71576 | 1.84972 | 1.95389 |
| 375.7 | 1.59654 | 1.70656 | 1.83730 | 1.93907 |
| 400.0 | 1.59181 | 1.69981 | 1.82828 | 1.92836 |
| 424.6 | 1.58794 | 1.69435 | 1.82104 | 1.91978 |
| 449.2 | 1.58477 | 1.68993 | 1.81520 | 1.91289 |
| 476.9 | 1.58183 | 1.68587 | 1.80987 | 1.90661 |
| 499.9 | 1.57978 | 1.68306 | 1.80619 | 1.90229 |
| 525.4 | 1.57785 | 1.68043 | 1.80276 | 1.89826 |
| 548.6 | 1.57634 | 1.67836 | 1.80008 | 1.89512 |
| 574.0 | 1.57490 | 1.67642 | 1.79756 | 1.89216 |
| 601.9 | 1.57354 | 1.67458 | 1.79518 | 1.88938 |
| 626.2 | 1.57250 | 1.67319 | 1.79338 | 1.88728 |
| 652.6 | 1.57152 | 1.67187 | 1.79168 | 1.88529 |
| 673.8 | 1.57080 | 1.67091 | 1.79045 | 1.88386 |
| 696.5 | 1.57012 | 1.67000 | 1.78928 | 1.88249 |
| 720.8 | 1.56946 | 1.66912 | 1.78815 | 1.88118 |
| 746.9 | 1.56882 | 1.66827 | 1.78706 | 1.87991 |
| 774.9 | 1.56821 | 1.66747 | 1.78603 | 1.87870 |
| 805.1 | 1.56763 | 1.66669 | 1.78504 | 1.87755 |
| 849.2 | 1.56689 | 1.66571 | 1.78378 | 1.87608 |
| 898.4 | 1.56619 | 1.66478 | 1.78260 | 1.87471 |
| 999.9 | 1.56506 | 1.66329 | 1.78070 | 1.87251 |
| 1087.6 | 1.56434 | 1.66234 | 1.77949 | 1.87110 |
| 1192.2 | 1.56367 | 1.66147 | 1.77838 | 1.86982 |
| 1319.0 | 1.56307 | 1.66069 | 1.77738 | 1.86866 |
| 1441.7 | 1.56264 | 1.66012 | 1.77666 | 1.86782 |
| 1589.5 | 1.56225 | 1.65960 | 1.77601 | 1.86706 |
| 1771.2 | 1.56189 | 1.65913 | 1.77542 | 1.86638 |
| 1999.8 | 1.56157 | 1.65872 | 1.77489 | 1.86577 |

| Material | Mat13 |
|---|---|
| 324.6 | 2.02518 |
| 350.2 | 2.00279 |
| 375.7 | 1.98689 |
| 400.0 | 1.97540 |
| 424.6 | 1.96621 |
| 449.2 | 1.95883 |
| 476.9 | 1.95212 |
| 499.9 | 1.94750 |
| 525.4 | 1.94319 |
| 548.6 | 1.93984 |
| 574.0 | 1.93669 |
| 601.9 | 1.93372 |
| 626.2 | 1.93148 |
| 652.6 | 1.92936 |
| 673.8 | 1.92783 |
| 696.5 | 1.92638 |
| 720.8 | 1.92498 |
| 746.9 | 1.92362 |
| 774.9 | 1.92234 |
| 805.1 | 1.92111 |
| 849.2 | 1.91955 |
| 898.4 | 1.91809 |
| 999.9 | 1.91575 |
| 1087.6 | 1.91425 |
| 1192.2 | 1.91289 |
| 1319.0 | 1.91165 |
| 1441.7 | 1.91076 |
| 1589.5 | 1.90996 |
| 1771.2 | 1.90923 |
| 1999.8 | 1.90858 |

Figure 16:
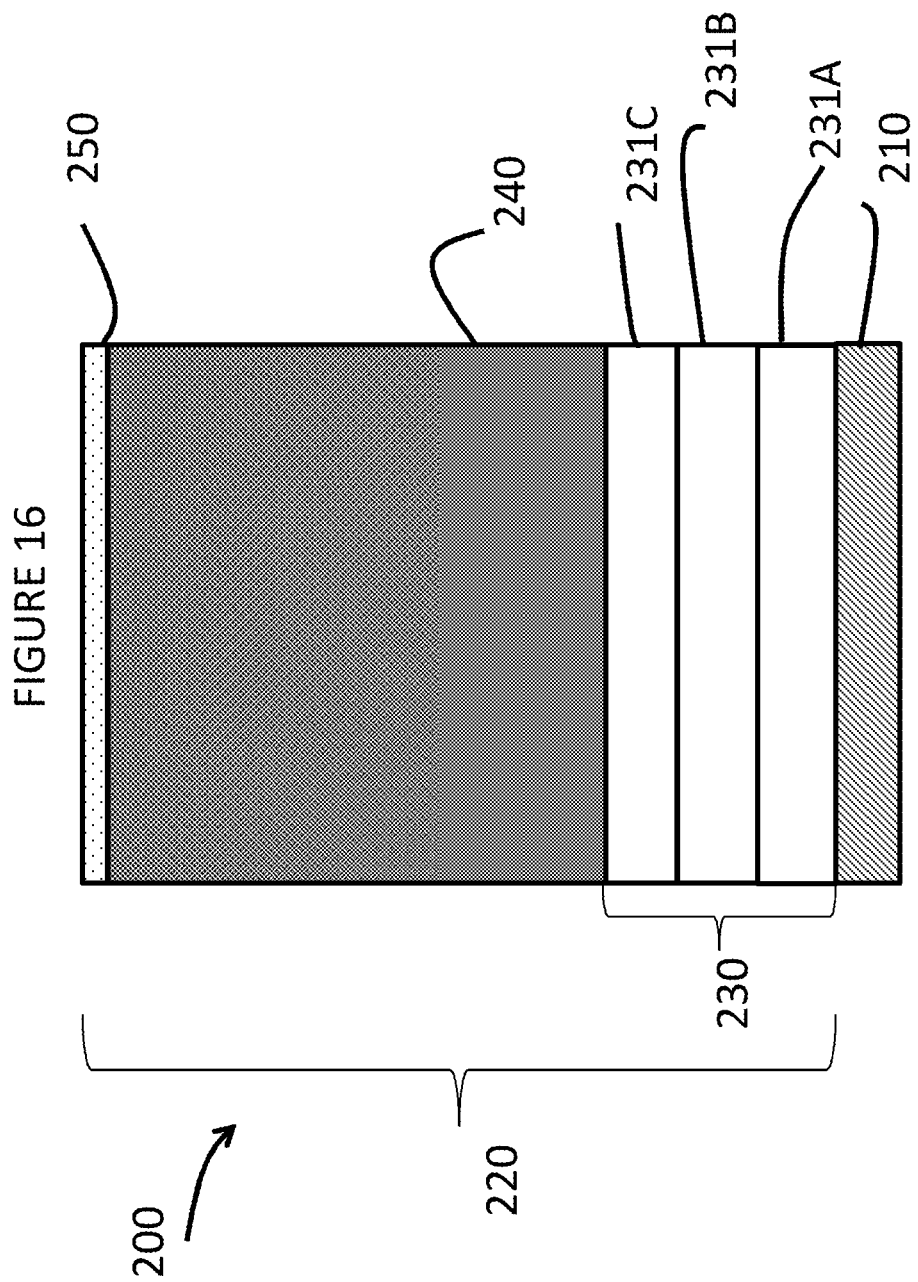
FIG. 16 is a schematic representation of modeled Example F1.

Modeled Example F1 included an article 200 including a chemically strengthened alkali aluminoborosilicate glass substrate 210 and an optical film 220 disposed on the substrate, as shown in FIG. 16. The optical film included an optical modifying layer 230 with three sub-layers 231A, 231B, 231C, a scratch-resistant layer 240 disposed on the optical modifying layer and a capping layer 250 disposed on the scratch-resistant layer. The optical film materials and thicknesses of each layer, in the order arranged in the optical film, are provided in Table 8. The three sub-layers of the optical modifying layer form a refractive index gradient due to their relative thicknesses and compositions.

TABLE 8

Optical film attributes for modeled Example F1.

| Layer | | Material | Modeled Physical Thickness |
|---|---|---|---|
| Ambient medium | | Air | Immersed |
| Capping layer | | RS-SiO$_2$ | 10 nm |
| Scratch-resistant layer | | Si$_u$Al$_v$O$_x$N$_y$ | 2000 nm |
| Optical modifying Layer | sub-layer | Mat. 3 - Si$_u$Al$_v$O$_x$N$_y$ | 71.11 nm |
| | sub-layer | Mat. 2 - Si$_u$Al$_v$O$_x$N$_y$ | 78.35 nm |
| | sub-layer | Mat. 1 - Si$_u$Al$_v$O$_x$N$_y$ | 85.74 nm |
| Substrate | | ABS Glass | Immersed |

Figure 17:
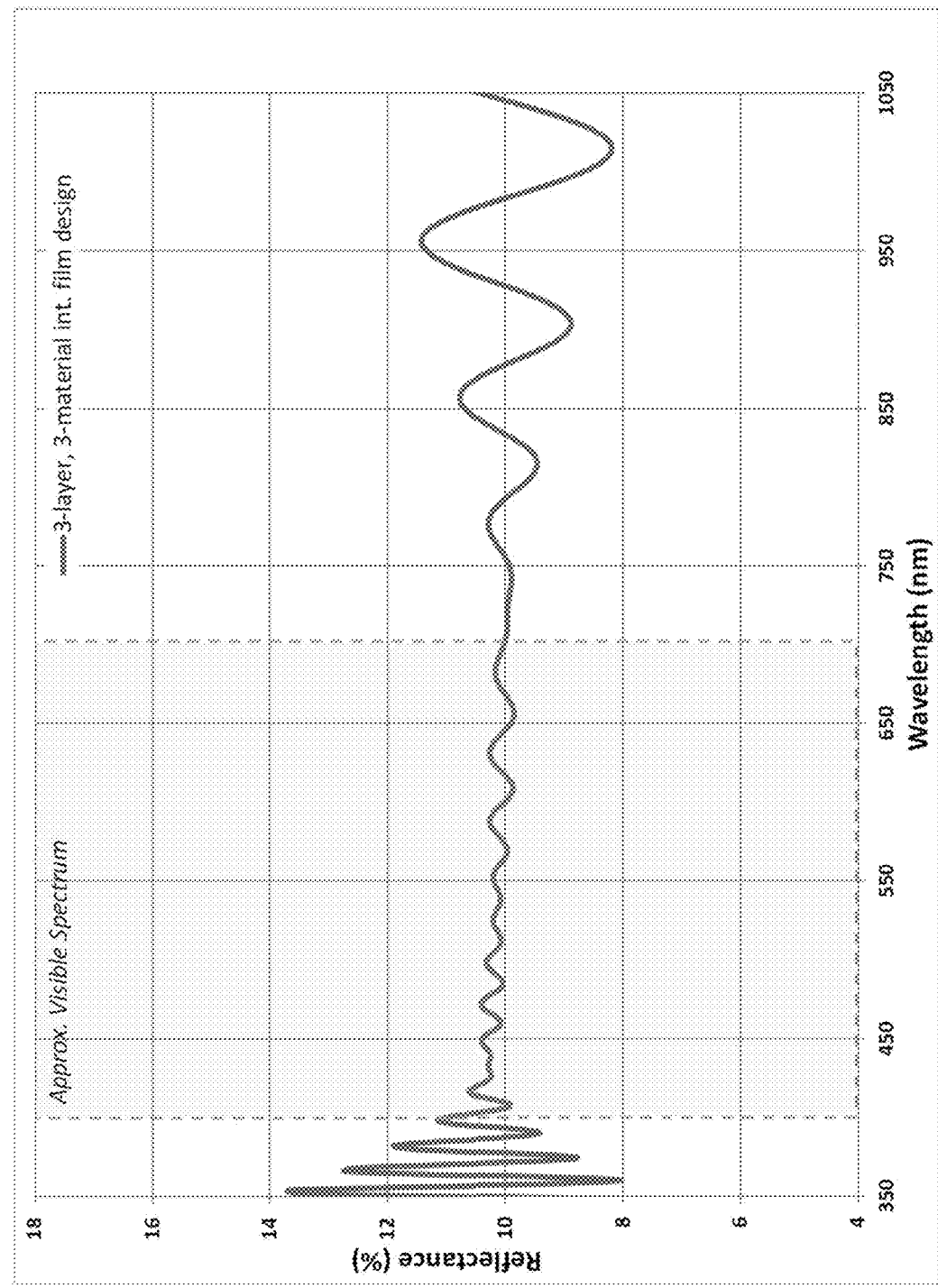
FIG. 17 is a calculated reflectance spectra for modeled Example F1.

The calculated reflectance spectrum for modeled Example F1 is shown in FIG. 17. As shown in FIG. 17, the oscillations in the reflectance spectrum are small (i.e., less than about 0.5 percentage points over the optical wavelength regime), leading to relatively low calculated visible color shift for a 10 degree observer, over a range of incidence viewing angles from 60 degrees to normal incidence, under an F2 illuminant.

Figure 18:
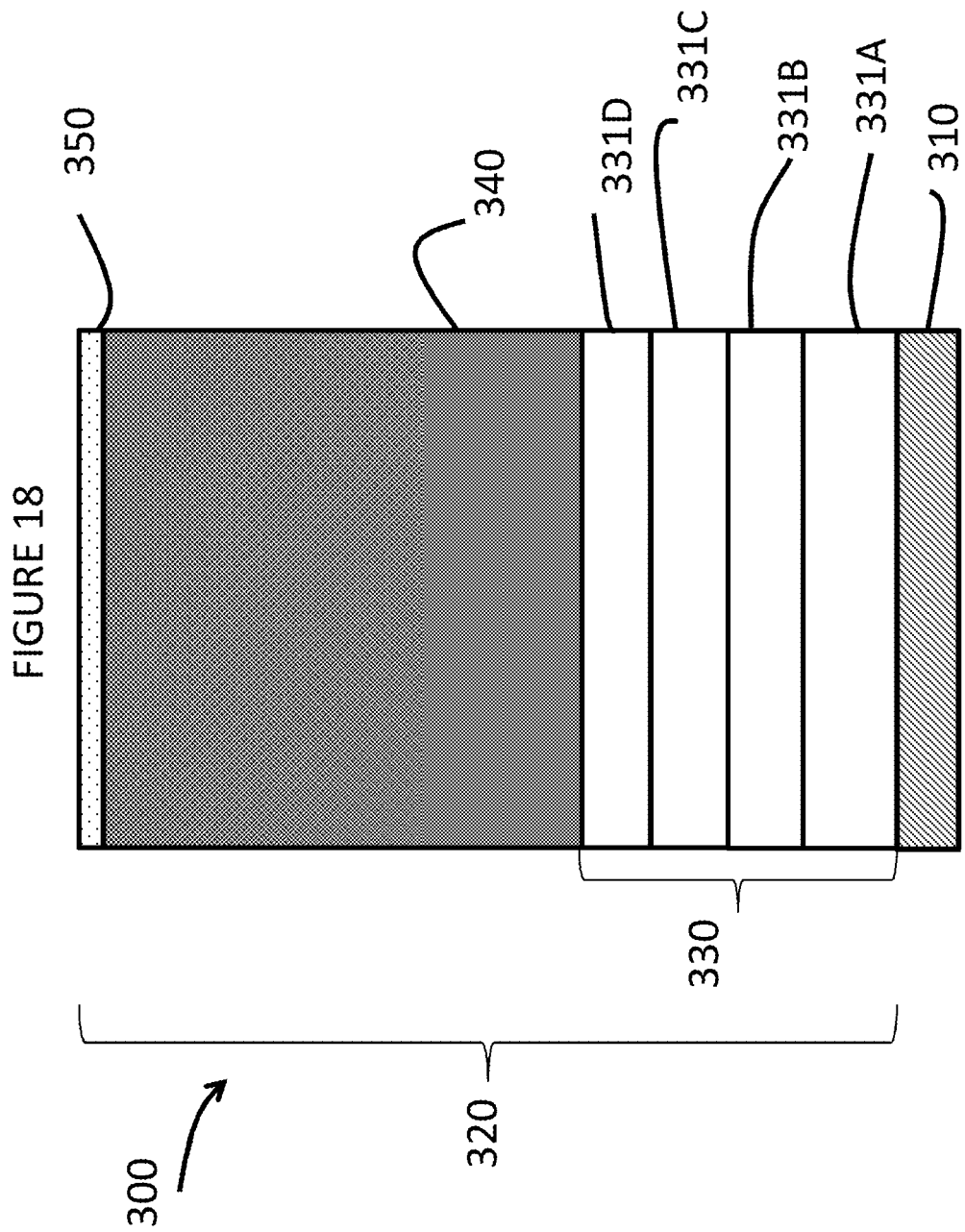
FIG. 18 is a schematic representation of modeled Example F2.

Modeled Example F2 included an article 300 including a chemically strengthened alkali aluminoborosilicate glass substrate 310 and an optical film 320 disposed on the substrate, as shown in FIG. 18. The optical film included an optical modifying layer 330 with four sub-layers 331A, 331B, 331C, 331D, a scratch-resistant layer 340 disposed on the optical modifying layer and a capping layer 350 disposed on the scratch-resistant layer. The optical film materials and thicknesses of each layer, in the order arranged in the optical film, are provided in Table 9. The four sub-layers of the optical modifying layer form a refractive index gradient due to their relative thicknesses and compositions.

TABLE 9

Optical film attributes for modeled Example F2.

| Layer | | Material | Modeled Physical Thickness |
|---|---|---|---|
| Ambient medium | | Air | Immersed |
| Capping layer | | RS-SiO$_2$ | 10 nm |
| Scratch-resistant layer | | Si$_u$Al$_v$O$_x$N$_y$ | 2000 nm |
| Optical modifying Layer | sub-layer | Mat. 7 - Si$_u$Al$_v$O$_x$N$_y$ | 68.71 nm |
| | sub-layer | Mat. 6- Si$_u$Al$_v$O$_x$N$_y$ | 74.69 nm |
| | sub-layer | Mat. 5 - Si$_u$Al$_v$O$_x$N$_y$ | 83.92 nm |
| | sub-layer | Mat. 4 - Si$_u$Al$_v$O$_x$N$_y$ | 91.22 nm |
| Substrate | | ABS Glass | Immersed |

Figure 19:
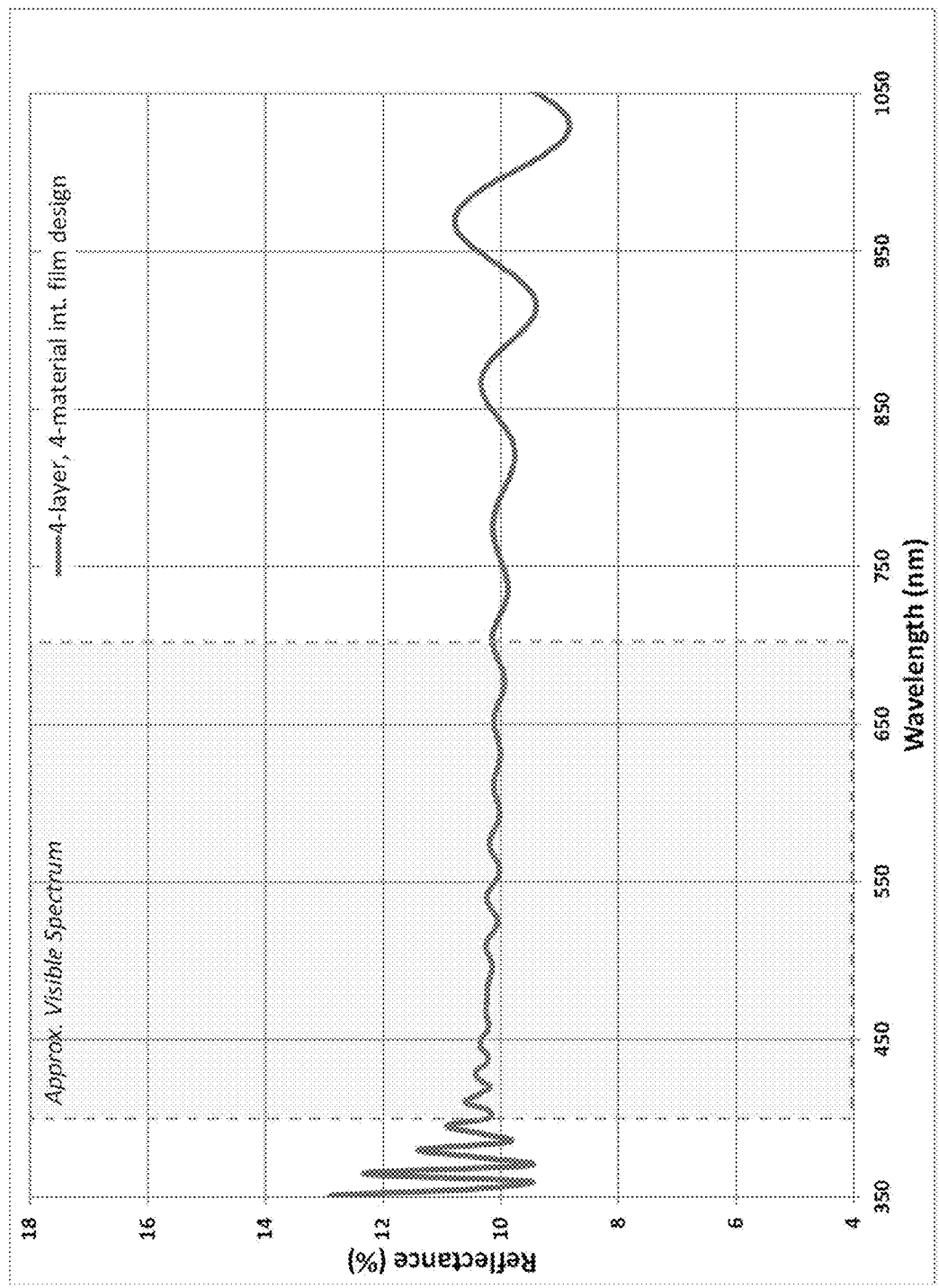
FIG. 19 is a calculated reflectance spectra for modeled Example F2.

The calculated reflectance spectrum for modeled Example F2 is shown in FIG. 19. As shown in FIG. 19, the oscillations in the reflectance spectrum are small (i.e., less than about 0.5 percentage points over the optical wavelength regime), leading to relatively low calculated visible color shift for a 10 degree observer, over a range of incidence viewing angles from 60 degrees to normal incidence, under an F2 illuminant.

Figure 20:
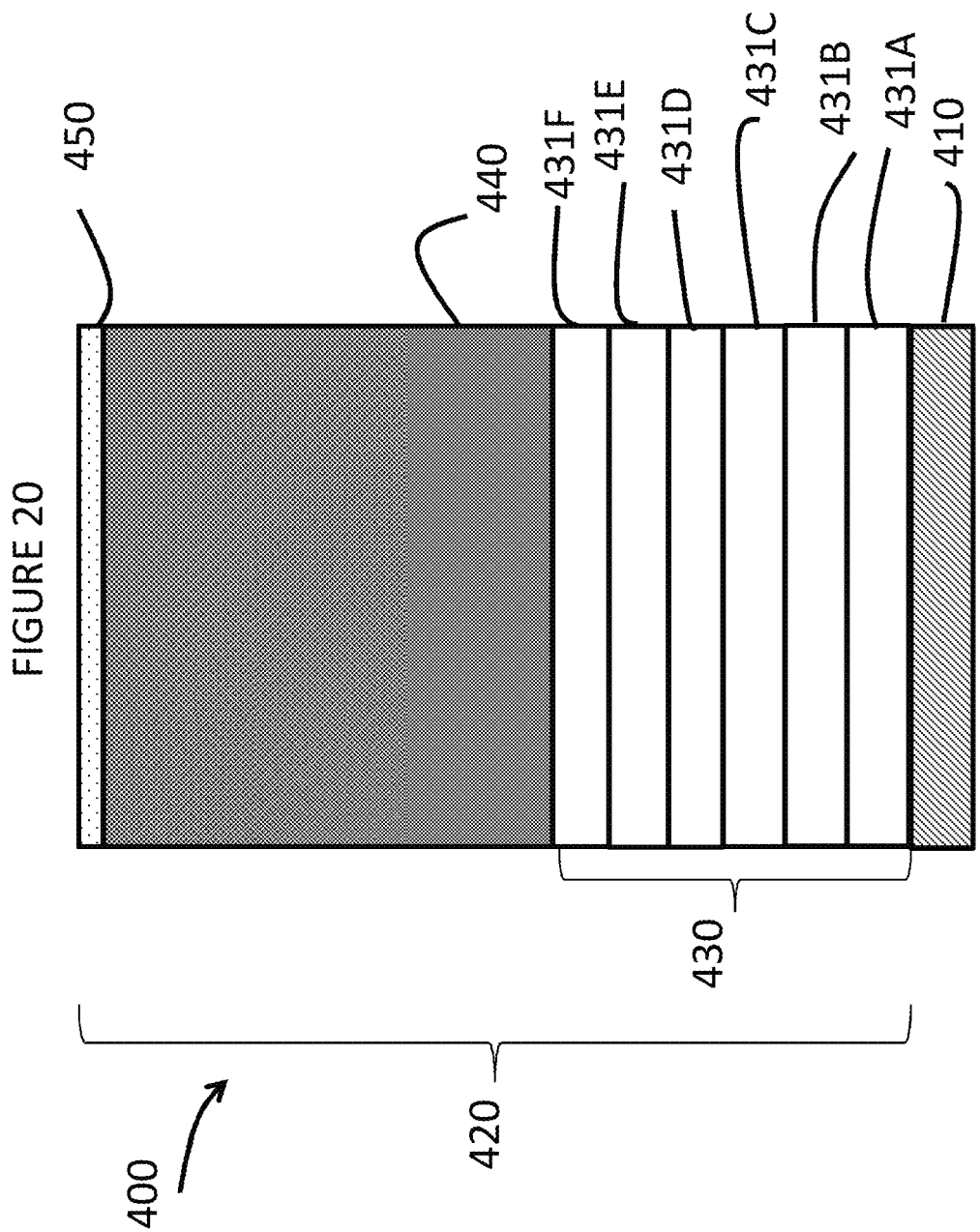
FIG. 20 is a schematic representation of modeled Example F3.

Modeled Example F3 included an article 400 including a chemically strengthened alkali aluminoborosilicate glass substrate 410 and an optical film 420 disposed on the substrate, as shown in FIG. 20. The optical film included an optical modifying layer 430 with six sub-layers 431A, 431B, 431C, 431D, 431E, 431F, a scratch-resistant layer 440 disposed on the optical modifying layer, and a capping layer 450 disposed on the scratch-resistant layer. The optical film materials and thicknesses of each layer, in the order arranged in the optical film, are provided in Table 10. The six sub-layers of the optical modifying layer form a refractive index gradient due to their relative thicknesses and compositions.

TABLE 10

Optical film attributes for modeled Example F3.

| Layer | | Material | Modeled Physical Thickness |
|---|---|---|---|
| Ambient medium | | Air | Immersed |
| Capping layer | | RS-SiO$_2$ | 10 nm |
| Scratch-resistant layer | | Si$_u$Al$_v$O$_x$N$_y$ | 2000 nm |
| Optical modifying Layer | sub-layer | Mat. 13 - Si$_u$Al$_v$O$_x$N$_y$ | 74.08 nm |
| | sub-layer | Mat. 12 - Si$_u$Al$_v$O$_x$N$_y$ | 74.70 nm |
| | sub-layer | Mat. 11 - Si$_u$Al$_v$O$_x$N$_y$ | 77.40 nm |
| | sub-layer | Mat. 10 - Si$_u$Al$_v$O$_x$N$_y$ | 79.64 nm |
| | sub-layer | Mat. 9 - Si$_u$Al$_v$O$_x$N$_y$ | 78.66 nm |
| | sub-layer | Mat. 8 - Si$_u$Al$_v$O$_x$N$_y$ | 74.13 nm |
| Substrate | | ABS Glass | Immersed |

Figure 21:
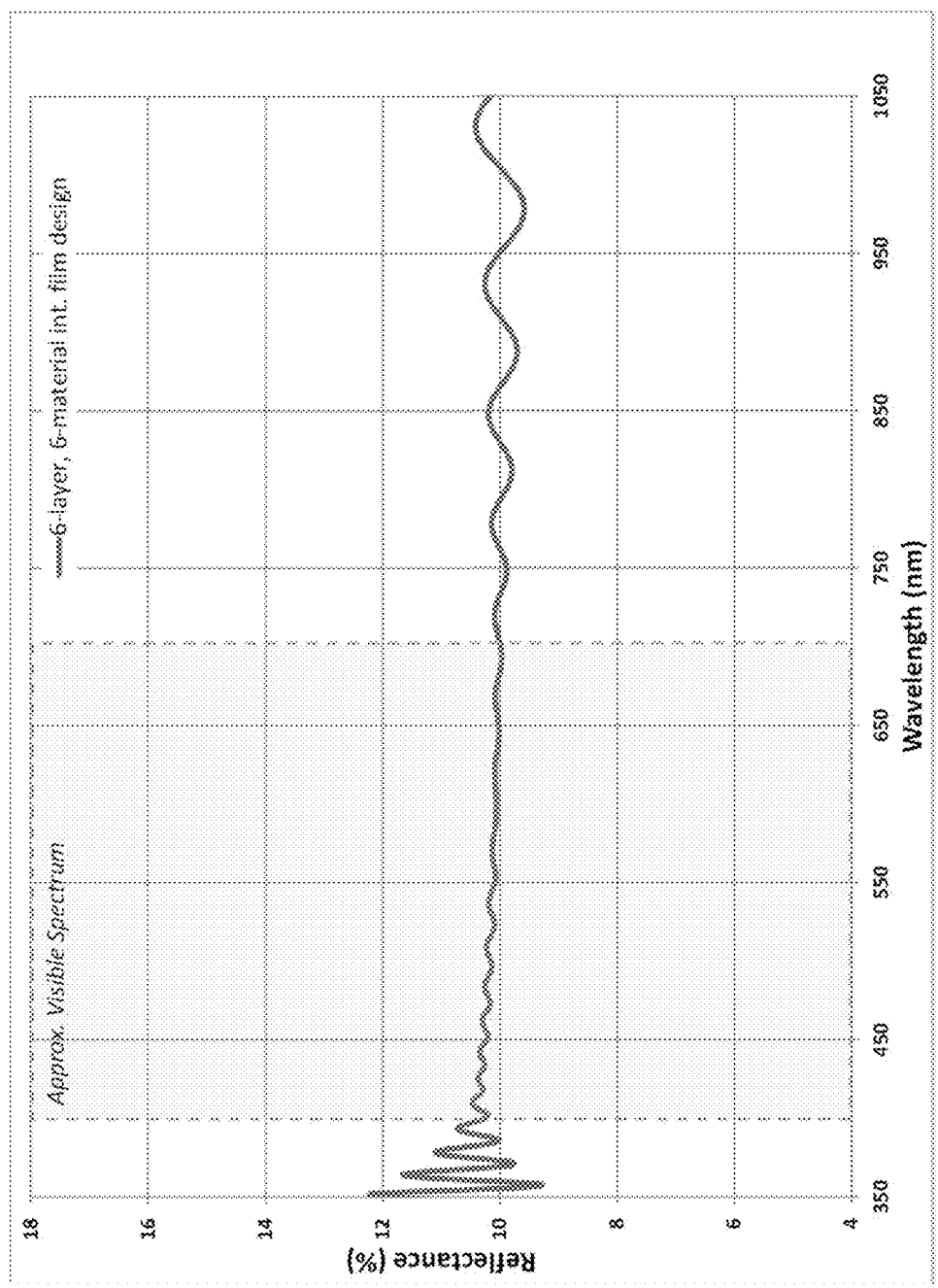
FIG. 21 is a calculated reflectance spectra for modeled Example F3.

The calculated reflectance spectrum for modeled Example F3 is shown in FIG. 21. As shown in FIG. 21, the oscillations in the reflectance spectrum are small (i.e., less than about 0.5 percentage points over the optical wavelength regime), leading to relatively low calculated visible color shift for a 10 degree observer, over a range of incidence viewing angles from 60 degrees to normal incidence, under an F2 illuminant.

It will be apparent to those skilled in the art that various modifications and variations can be made without departing from the spirit or scope of the invention. Modeled Examples F1-F3 exhibit a faster change in refractive index vs. thickness as well as a more discrete step-changing profile of refractive index, with fewer steps and a thinner overall optical modifying layer than in preceding other Examples described herein. For example, Modeled Examples F1-F3 may embody a step-wise gradient created in some cases by the sub-layers. In such embodiments, the step-wise gradient may have a transition zone thickness in which the refractive index changes from one value to another value between steps (or sub-layers) of less than about 5 nm, or even less than about 1 nm, with less than 10 steps (or sub-layers), less than 7 steps (or sub-layers), or less than 5 steps (or sub-layers), where the refractive index changes by at least 0.01, and in some cases by at least 0.05 between steps. Each step (or sub-layer) in the step-wise refractive index gradient shown of Modeled Examples F1-F3 may have a physical thickness less than about 100 nm or an optical thickness n*d of 10-200 nm, or 40-200 nm, or 40-160 nm. The overall physical thickness of the optical modeling layer comprising all sub-layers of the step-wise refractive index gradient may be less than about 800 nm, less than about 400 nm, or less than about 300 nm, with the refractive index change over this physical thickness being at least 0.1, at least 0.2, or at least 0.3 measured at 550 nm.

Example G

Examples G1-G3 were made to evaluate the effect of different thickness of scratch-resistant layers would have on the hardness and the optical properties of the articles. Each of Examples G1-G5 was made using the same substrate as used in Example B, and similar AJA sputter deposition process as in previous examples, with process parameters further described below. Example G1 included an optical film including Si$_u$Al$_v$O$_x$N$_y$ disposed on the ABS substrate. The Si$_u$Al$_v$O$_x$N$_y$ optical film included an aluminum content gradient and an oxygen content gradient that provided a refractive index gradient in the Si$_u$Al$_v$O$_x$N$_y$ film in the range from about 1.51 to about 2.0. The total thickness of the Si$_u$Al$_v$O$_x$N$_y$ film was about 2.26 μm, as measured by profilometry. The optical film of Example G1 did not include any other layers (including any layers having a uniform refractive index or composition over a thickness of about 100 nm or greater) and was tested for hardness and Young's modulus, as shown in Table 11. The optical film of Example G1 was formed using a sputtering process as described herein. The process conditions for forming Example G1 are shown in Table 12, which includes the flow rates of argon, oxygen and nitrogen gases and the power (RF or DC) supplied to the Al and/or Si targets.

Example G2 included an optical film including a Si$_u$Al$_v$O$_x$N$_y$ optical modifying layer disposed on the ABS substrate. The Si$_u$Al$_v$O$_x$N$_y$ optical modifying layer included an aluminum content gradient and an oxygen content gradient that provided a refractive index gradient in the Si$_u$Al$_v$O$_x$N$_y$ film in the range from about 1.51 to about 2.0. The total thickness of the Si$_u$Al$_v$O$_x$N$_y$ film was about 2.1 μm. The optical film of Example G2 included a scratch-resistant layer disposed on the optical modifying layer. The scratch-resistant layer included Si$_u$Al$_v$O$_x$N$_y$, and had a thickness of about 900 nm and a refractive index of about 2 along at least a thickness of about 100 nm of the scratch-resistant layer. The optical film of Example G2 also included a capping layer of SiO$_x$N$_y$ having a thickness of about 10 nm and a refractive index of about 1.51. The article of G2 (including the substrate and the optical film) exhibited a hardness and a Young's modulus, as shown in Table 11. The optical film of Example G1 was formed using a sputtering process as described herein in Table 12. The process conditions for forming the optical film of Example G2 are shown in Table 13.

TABLE 11

Hardness and Young's modulus values for Examples G1 and G2.

| Example | Modulus | Hardness |
|---|---|---|
| Ex. G1 | 201 GPa | 18 GPa |
| Ex. G2 | 234 GPa | 22 GPa |

TABLE 12

Sputtering process conditions for the optical film of Example G1.

| Step | Time (sec) | Ar flow (sccm) | N2 flow (sccm) | O2 flow (sccm) | Al ($W_{RF}$) | Al ($V_{DC}$) | Si ($W_{RF}$) |
|---|---|---|---|---|---|---|---|
| 1 | 180 | 30 | 30 | 3.3 | 70 | 262 | 500 |
| 2 | 180 | 30 | 30 | 3.3 | 73 | 262 | 500 |
| 3 | 180 | 30 | 30 | 3.3 | 76 | 262 | 500 |
| 4 | 180 | 30 | 30 | 3.3 | 79 | 262 | 500 |
| 5 | 180 | 30 | 30 | 3.3 | 82 | 262 | 500 |
| 6 | 180 | 30 | 30 | 3.3 | 85 | 262 | 500 |
| 7 | 180 | 30 | 30 | 3.3 | 88 | 262 | 500 |
| 8 | 180 | 30 | 30 | 3.3 | 91 | 262 | 500 |
| 9 | 180 | 30 | 30 | 3.3 | 94 | 262 | 500 |
| 10 | 180 | 30 | 30 | 3.3 | 97 | 262 | 500 |
| 11 | 180 | 30 | 30 | 3.3 | 100 | 262 | 500 |
| 12 | 180 | 30 | 30 | 3.3 | 103 | 262 | 500 |
| 13 | 180 | 30 | 30 | 3.3 | 106 | 262 | 500 |
| 14 | 180 | 30 | 30 | 3.3 | 109 | 262 | 500 |
| 15 | 180 | 30 | 30 | 3.3 | 112 | 262 | 500 |
| 16 | 180 | 30 | 30 | 3.3 | 115 | 262 | 500 |
| 17 | 180 | 30 | 30 | 3.3 | 118 | 262 | 500 |
| 18 | 180 | 30 | 30 | 3.3 | 121 | 262 | 500 |
| 19 | 180 | 30 | 30 | 3.3 | 124 | 262 | 500 |
| 20 | 180 | 30 | 30 | 3.3 | 127 | 262 | 500 |
| 21 | 180 | 30 | 30 | 3.3 | 130 | 262 | 500 |
| 22 | 180 | 30 | 30 | 3.3 | 133 | 262 | 500 |
| 23 | 180 | 30 | 30 | 3.3 | 136 | 262 | 500 |
| 24 | 180 | 30 | 30 | 3.3 | 139 | 262 | 500 |
| 25 | 180 | 30 | 30 | 3.3 | 142 | 262 | 500 |
| 26 | 180 | 30 | 30 | 3.3 | 145 | 262 | 500 |
| 27 | 180 | 30 | 30 | 3.3 | 148 | 262 | 500 |
| 28 | 180 | 30 | 30 | 3.3 | 151 | 262 | 500 |
| 29 | 180 | 30 | 30 | 3.3 | 154 | 262 | 500 |
| 30 | 180 | 30 | 30 | 3.3 | 157 | 262 | 500 |
| 31 | 180 | 30 | 30 | 3.3 | 160 | 262 | 500 |
| 32 | 180 | 30 | 30 | 3.3 | 163 | 262 | 500 |
| 33 | 180 | 30 | 30 | 3.3 | 166 | 262 | 500 |
| 34 | 180 | 30 | 30 | 3.3 | 169 | 262 | 500 |
| 35 | 180 | 30 | 30 | 3.3 | 172 | 262 | 500 |
| 36 | 180 | 30 | 30 | 3.3 | 175 | 262 | 500 |
| 37 | 180 | 30 | 30 | 3.3 | 178 | 262 | 500 |
| 38 | 180 | 30 | 30 | 3.3 | 181 | 262 | 500 |
| 39 | 180 | 30 | 30 | 3.3 | 184 | 262 | 500 |
| 40 | 180 | 30 | 30 | 3.3 | 187 | 262 | 500 |
| 41 | 180 | 30 | 30 | 3.3 | 190 | 262 | 500 |
| 42 | 180 | 30 | 30 | 3.3 | 193 | 262 | 500 |
| 43 | 180 | 30 | 30 | 3.3 | 196 | 262 | 500 |
| 44 | 180 | 30 | 30 | 3.3 | 199 | 262 | 500 |
| 45 | 180 | 30 | 30 | 3.3 | 200 | 262 | 500 |
| 46 | 180 | 30 | 30 | 3.28 | 200 | 262 | 500 |
| 47 | 180 | 30 | 30 | 3.26 | 200 | 262 | 500 |
| 48 | 180 | 30 | 30 | 3.24 | 200 | 262 | 500 |
| 49 | 180 | 30 | 30 | 3.22 | 200 | 262 | 500 |
| 50 | 180 | 30 | 30 | 3.2 | 200 | 262 | 500 |
| 51 | 180 | 30 | 30 | 3.18 | 200 | 262 | 500 |
| 52 | 180 | 30 | 30 | 3.16 | 200 | 262 | 500 |
| 53 | 180 | 30 | 30 | 3.14 | 200 | 262 | 500 |
| 54 | 180 | 30 | 30 | 3.12 | 200 | 262 | 500 |
| 55 | 180 | 30 | 30 | 3.1 | 200 | 262 | 500 |
| 56 | 180 | 30 | 30 | 3.08 | 200 | 262 | 500 |
| 57 | 180 | 30 | 30 | 3.06 | 200 | 262 | 500 |
| 58 | 180 | 30 | 30 | 3.04 | 200 | 262 | 500 |
| 59 | 180 | 30 | 30 | 3.02 | 200 | 262 | 500 |
| 60 | 180 | 30 | 30 | 3 | 200 | 262 | 500 |
| 61 | 180 | 30 | 30 | 2.98 | 200 | 262 | 500 |
| 62 | 180 | 30 | 30 | 2.96 | 200 | 262 | 500 |
| 63 | 180 | 30 | 30 | 2.94 | 200 | 262 | 500 |
| 64 | 180 | 30 | 30 | 2.92 | 200 | 262 | 500 |
| 65 | 180 | 30 | 30 | 2.9 | 200 | 262 | 500 |
| 66 | 180 | 30 | 30 | 2.88 | 200 | 262 | 500 |
| 67 | 180 | 30 | 30 | 2.86 | 200 | 262 | 500 |
| 68 | 180 | 30 | 30 | 2.84 | 200 | 262 | 500 |
| 69 | 180 | 30 | 30 | 2.82 | 200 | 262 | 500 |
| 70 | 180 | 30 | 30 | 2.8 | 200 | 262 | 500 |
| 71 | 180 | 30 | 30 | 2.78 | 200 | 262 | 500 |
| 72 | 180 | 30 | 30 | 2.76 | 200 | 262 | 500 |
| 73 | 180 | 30 | 30 | 2.74 | 200 | 262 | 500 |
| 74 | 180 | 30 | 30 | 2.72 | 200 | 262 | 500 |
| 75 | 180 | 30 | 30 | 2.7 | 200 | 262 | 500 |
| 76 | 180 | 30 | 30 | 2.68 | 200 | 262 | 500 |
| 77 | 180 | 30 | 30 | 2.66 | 200 | 262 | 500 |
| 78 | 180 | 30 | 30 | 2.64 | 200 | 262 | 500 |
| 79 | 180 | 30 | 30 | 2.62 | 200 | 262 | 500 |
| 80 | 180 | 30 | 30 | 2.6 | 200 | 262 | 500 |
| 81 | 180 | 30 | 30 | 2.58 | 200 | 262 | 500 |
| 82 | 180 | 30 | 30 | 2.56 | 200 | 262 | 500 |
| 83 | 180 | 30 | 30 | 2.54 | 200 | 262 | 500 |
| 84 | 180 | 30 | 30 | 2.52 | 200 | 262 | 500 |
| 85 | 180 | 30 | 30 | 2.5 | 200 | 262 | 500 |
| 86 | 180 | 30 | 30 | 2.48 | 200 | 262 | 500 |
| 87 | 180 | 30 | 30 | 2.46 | 200 | 262 | 500 |
| 88 | 180 | 30 | 30 | 2.44 | 200 | 262 | 500 |
| 89 | 180 | 30 | 30 | 2.42 | 200 | 262 | 500 |
| 90 | 180 | 30 | 30 | 2.4 | 200 | 262 | 500 |
| 91 | 180 | 30 | 30 | 2.38 | 200 | 262 | 500 |
| 92 | 180 | 30 | 30 | 2.36 | 200 | 262 | 500 |
| 93 | 180 | 30 | 30 | 2.34 | 200 | 262 | 500 |
| 94 | 180 | 30 | 30 | 2.32 | 200 | 262 | 500 |
| 95 | 180 | 30 | 30 | 2.3 | 200 | 262 | 500 |
| 96 | 180 | 30 | 30 | 2.28 | 200 | 262 | 500 |
| 97 | 180 | 30 | 30 | 2.26 | 200 | 262 | 500 |
| 98 | 180 | 30 | 30 | 2.24 | 200 | 262 | 500 |
| 99 | 180 | 30 | 30 | 2.22 | 200 | 262 | 500 |
| 100 | 180 | 30 | 30 | 2.2 | 200 | 262 | 500 |
| 101 | 180 | 30 | 30 | 2.18 | 200 | 262 | 500 |
| 102 | 180 | 30 | 30 | 2.16 | 200 | 262 | 500 |
| 103 | 180 | 30 | 30 | 2.14 | 200 | 262 | 500 |
| 104 | 180 | 30 | 30 | 2.12 | 200 | 262 | 500 |
| 105 | 180 | 30 | 30 | 2.1 | 200 | 262 | 500 |
| 106 | 180 | 30 | 30 | 2.08 | 200 | 262 | 500 |
| 107 | 180 | 30 | 30 | 2.06 | 200 | 262 | 500 |
| 108 | 180 | 30 | 30 | 2.04 | 200 | 262 | 500 |
| 109 | 180 | 30 | 30 | 2.02 | 200 | 262 | 500 |
| 110 | 180 | 30 | 30 | 2 | 200 | 262 | 500 |
| 111 | 180 | 30 | 30 | 1.98 | 200 | 262 | 500 |
| 112 | 180 | 30 | 30 | 1.96 | 200 | 262 | 500 |
| 113 | 180 | 30 | 30 | 1.94 | 200 | 262 | 500 |
| 114 | 180 | 30 | 30 | 1.92 | 200 | 262 | 500 |
| 115 | 180 | 30 | 30 | 1.9 | 200 | 262 | 500 |
| 116 | 180 | 30 | 30 | 1.88 | 200 | 262 | 500 |
| 117 | 180 | 30 | 30 | 1.86 | 200 | 262 | 500 |
| 118 | 180 | 30 | 30 | 1.84 | 200 | 262 | 500 |
| 119 | 180 | 30 | 30 | 1.82 | 200 | 262 | 500 |
| 120 | 180 | 30 | 30 | 1.8 | 200 | 262 | 500 |
| 121 | 180 | 30 | 30 | 1.78 | 200 | 262 | 500 |
| 122 | 180 | 30 | 30 | 1.76 | 200 | 262 | 500 |
| 123 | 180 | 30 | 30 | 1.74 | 200 | 262 | 500 |
| 124 | 180 | 30 | 30 | 1.72 | 200 | 262 | 500 |
| 125 | 180 | 30 | 30 | 1.7 | 200 | 262 | 500 |
| 126 | 180 | 30 | 30 | 1.68 | 200 | 262 | 500 |
| 127 | 180 | 30 | 30 | 1.66 | 200 | 262 | 500 |
| 128 | 180 | 30 | 30 | 1.64 | 200 | 262 | 500 |
| 129 | 180 | 30 | 30 | 1.62 | 200 | 262 | 500 |

TABLE 12-continued

Sputtering process conditions for the optical film of Example G1.

| Step | Time (sec) | Ar flow (sccm) | N2 flow (sccm) | O2 flow (sccm) | Al ($W_{RF}$) | Al ($V_{DC}$) | Si ($W_{RF}$) |
|---|---|---|---|---|---|---|---|
| 130 | 180 | 30 | 30 | 1.6 | 200 | 262 | 500 |
| 131 | 180 | 30 | 30 | 1.58 | 200 | 262 | 500 |
| 132 | 180 | 30 | 30 | 1.56 | 200 | 262 | 500 |
| 133 | 180 | 30 | 30 | 1.54 | 200 | 262 | 500 |
| 134 | 180 | 30 | 30 | 1.52 | 200 | 262 | 500 |
| 135 | 180 | 30 | 30 | 1.5 | 200 | 262 | 500 |
| 136 | 180 | 30 | 30 | 1.48 | 200 | 262 | 500 |
| 137 | 180 | 30 | 30 | 1.46 | 200 | 262 | 500 |
| 138 | 180 | 30 | 30 | 1.44 | 200 | 262 | 500 |
| 139 | 180 | 30 | 30 | 1.42 | 200 | 262 | 500 |
| 140 | 180 | 30 | 30 | 1.4 | 200 | 262 | 500 |
| 141 | 180 | 30 | 30 | 1.38 | 200 | 262 | 500 |
| 142 | 180 | 30 | 30 | 1.36 | 200 | 262 | 500 |
| 143 | 180 | 30 | 30 | 1.34 | 200 | 262 | 500 |
| 144 | 180 | 30 | 30 | 1.32 | 200 | 262 | 500 |
| 145 | 180 | 30 | 30 | 1.3 | 200 | 262 | 500 |
| 146 | 180 | 30 | 30 | 1.28 | 200 | 262 | 500 |
| 147 | 180 | 30 | 30 | 1.26 | 200 | 262 | 500 |
| 148 | 180 | 30 | 30 | 1.24 | 200 | 262 | 500 |
| 149 | 180 | 30 | 30 | 1.22 | 200 | 262 | 500 |
| 150 | 180 | 30 | 30 | 1.2 | 200 | 262 | 500 |
| 151 | 180 | 30 | 30 | 1.18 | 200 | 262 | 500 |
| 152 | 180 | 30 | 30 | 1.16 | 200 | 262 | 500 |
| 153 | 180 | 30 | 30 | 1.14 | 200 | 262 | 500 |
| 154 | 180 | 30 | 30 | 1.12 | 200 | 262 | 500 |
| 155 | 180 | 30 | 30 | 1.1 | 200 | 262 | 500 |
| 156 | 180 | 30 | 30 | 1.08 | 200 | 262 | 500 |
| 157 | 180 | 30 | 30 | 1.06 | 200 | 262 | 500 |
| 158 | 180 | 30 | 30 | 1.04 | 200 | 262 | 500 |
| 159 | 180 | 30 | 30 | 1.02 | 200 | 262 | 500 |
| 160 | 180 | 30 | 30 | 1 | 200 | 262 | 500 |
| 161 | 180 | 30 | 30 | 0.98 | 200 | 262 | 500 |
| 162 | 180 | 30 | 30 | 0.96 | 200 | 262 | 500 |
| 163 | 180 | 30 | 30 | 0.94 | 200 | 262 | 500 |
| 164 | 180 | 30 | 30 | 0.92 | 200 | 262 | 500 |
| 165 | 180 | 30 | 30 | 0.9 | 200 | 262 | 500 |
| 166 | 180 | 30 | 30 | 0.88 | 200 | 262 | 500 |
| 167 | 180 | 30 | 30 | 0.86 | 200 | 262 | 500 |
| 168 | 180 | 30 | 30 | 0.84 | 200 | 262 | 500 |
| 169 | 180 | 30 | 30 | 0.82 | 200 | 262 | 500 |
| 170 | 180 | 30 | 30 | 0.8 | 200 | 262 | 500 |
| 171 | 180 | 30 | 30 | 0.78 | 200 | 262 | 500 |
| 172 | 180 | 30 | 30 | 0.76 | 200 | 262 | 500 |
| 173 | 180 | 30 | 30 | 0.74 | 200 | 262 | 500 |
| 174 | 180 | 30 | 30 | 0.72 | 200 | 262 | 500 |
| 175 | 180 | 30 | 30 | 0.7 | 200 | 262 | 500 |
| 176 | 180 | 30 | 30 | 0.68 | 200 | 262 | 500 |
| 177 | 180 | 30 | 30 | 0.66 | 200 | 262 | 500 |
| 178 | 180 | 30 | 30 | 0.64 | 200 | 262 | 500 |
| 179 | 180 | 30 | 30 | 0.62 | 200 | 262 | 500 |
| 180 | 180 | 30 | 30 | 0.6 | 200 | 262 | 500 |
| 181 | 180 | 30 | 30 | 0.58 | 200 | 262 | 500 |
| 182 | 180 | 30 | 30 | 0.56 | 200 | 262 | 500 |
| 183 | 180 | 30 | 30 | 0.54 | 200 | 262 | 500 |
| 184 | 180 | 30 | 30 | 0.52 | 200 | 262 | 500 |
| 185 | 180 | 30 | 30 | 0.5 | 200 | 262 | 500 |

TABLE 13

Sputtering process conditions for Example G2.

| Step | Time (sec) | Ar flow (sccm) | N2 flow (sccm) | O2 flow (sccm) | Al ($W_{RF}$) | Al ($W_{DC}$) | Si ($W_{RF}$) |
|---|---|---|---|---|---|---|---|
| 1 | 450 | 30 | 30 | 3.2 | 70 | 100 | 500 |
| 2 | 405 | 30 | 30 | 3.2 | 73 | 104.5 | 500 |
| 3 | 360 | 30 | 30 | 3.2 | 76 | 109 | 500 |
| 4 | 315 | 30 | 30 | 3.2 | 79 | 113.5 | 500 |
| 5 | 270 | 30 | 30 | 3.2 | 82 | 118 | 500 |
| 6 | 225 | 30 | 30 | 3.2 | 85 | 122.5 | 500 |
| 7 | 180 | 30 | 30 | 3.2 | 88 | 127 | 500 |
| 8 | 180 | 30 | 30 | 3.2 | 91 | 131.5 | 500 |
| 9 | 180 | 30 | 30 | 3.2 | 94 | 136 | 500 |
| 10 | 180 | 30 | 30 | 3.2 | 97 | 140.5 | 500 |
| 11 | 180 | 30 | 30 | 3.2 | 100 | 145 | 500 |
| 12 | 180 | 30 | 30 | 3.2 | 103 | 149.5 | 500 |
| 13 | 180 | 30 | 30 | 3.2 | 106 | 154 | 500 |
| 14 | 180 | 30 | 30 | 3.2 | 109 | 158.5 | 500 |
| 15 | 180 | 30 | 30 | 3.2 | 112 | 163 | 500 |
| 16 | 180 | 30 | 30 | 3.2 | 115 | 167.5 | 500 |
| 17 | 180 | 30 | 30 | 3.2 | 118 | 172 | 500 |
| 18 | 180 | 30 | 30 | 3.2 | 121 | 176.5 | 500 |
| 19 | 180 | 30 | 30 | 3.2 | 124 | 181 | 500 |
| 20 | 180 | 30 | 30 | 3.2 | 127 | 185.5 | 500 |
| 21 | 180 | 30 | 30 | 3.2 | 130 | 190 | 500 |
| 22 | 180 | 30 | 30 | 3.2 | 133 | 194.5 | 500 |
| 23 | 180 | 30 | 30 | 3.2 | 136 | 199 | 500 |
| 24 | 180 | 30 | 30 | 3.2 | 139 | 203.5 | 500 |
| 25 | 180 | 30 | 30 | 3.2 | 142 | 208 | 500 |
| 26 | 180 | 30 | 30 | 3.2 | 145 | 212.5 | 500 |
| 27 | 180 | 30 | 30 | 3.2 | 148 | 217 | 500 |
| 28 | 180 | 30 | 30 | 3.2 | 151 | 221.5 | 500 |
| 29 | 180 | 30 | 30 | 3.2 | 154 | 226 | 500 |
| 30 | 180 | 30 | 30 | 3.2 | 157 | 230.5 | 500 |
| 31 | 180 | 30 | 30 | 3.2 | 160 | 235 | 500 |
| 32 | 180 | 30 | 30 | 3.2 | 163 | 239.5 | 500 |
| 33 | 180 | 30 | 30 | 3.2 | 166 | 244 | 500 |
| 34 | 180 | 30 | 30 | 3.2 | 169 | 248.5 | 500 |
| 35 | 180 | 30 | 30 | 3.2 | 172 | 253 | 500 |
| 36 | 180 | 30 | 30 | 3.2 | 175 | 257.5 | 500 |
| 37 | 180 | 30 | 30 | 3.2 | 178 | 262 | 500 |
| 38 | 180 | 30 | 30 | 3.2 | 181 | 266.5 | 500 |
| 39 | 180 | 30 | 30 | 3.2 | 184 | 271 | 500 |
| 40 | 180 | 30 | 30 | 3.2 | 187 | 275.5 | 500 |
| 41 | 180 | 30 | 30 | 3.2 | 190 | 280 | 500 |
| 42 | 225 | 30 | 30 | 3.2 | 193 | 284.5 | 500 |
| 43 | 270 | 30 | 30 | 3.2 | 196 | 289 | 500 |
| 44 | 315 | 30 | 30 | 3.2 | 199 | 293.5 | 500 |
| 45 | 315 | 30 | 30 | 3.2 | 200 | 298 | 500 |
| 46 | 315 | 30 | 30 | 3.2 | 200 | 300 | 500 |
| 47 | 270 | 30 | 30 | 3.18 | 200 | 300 | 500 |
| 48 | 225 | 30 | 30 | 3.16 | 200 | 300 | 500 |
| 49 | 180 | 30 | 30 | 3.14 | 200 | 300 | 500 |
| 50 | 120 | 30 | 30 | 3.12 | 200 | 300 | 500 |
| 51 | 120 | 30 | 30 | 3.1 | 200 | 300 | 500 |
| 52 | 120 | 30 | 30 | 3.08 | 200 | 300 | 500 |
| 53 | 120 | 30 | 30 | 3.06 | 200 | 300 | 500 |
| 54 | 120 | 30 | 30 | 3.04 | 200 | 300 | 500 |
| 55 | 120 | 30 | 30 | 3.02 | 200 | 300 | 500 |
| 56 | 120 | 30 | 30 | 3 | 200 | 300 | 500 |
| 57 | 120 | 30 | 30 | 2.98 | 200 | 300 | 500 |
| 58 | 120 | 30 | 30 | 2.96 | 200 | 300 | 500 |
| 59 | 120 | 30 | 30 | 2.94 | 200 | 300 | 500 |
| 60 | 120 | 30 | 30 | 2.92 | 200 | 300 | 500 |
| 61 | 120 | 30 | 30 | 2.9 | 200 | 300 | 500 |
| 62 | 120 | 30 | 30 | 2.88 | 200 | 300 | 500 |
| 63 | 120 | 30 | 30 | 2.86 | 200 | 300 | 500 |
| 64 | 120 | 30 | 30 | 2.84 | 200 | 300 | 500 |
| 65 | 120 | 30 | 30 | 2.82 | 200 | 300 | 500 |
| 66 | 120 | 30 | 30 | 2.8 | 200 | 300 | 500 |
| 67 | 120 | 30 | 30 | 2.78 | 200 | 300 | 500 |
| 68 | 120 | 30 | 30 | 2.76 | 200 | 300 | 500 |
| 69 | 120 | 30 | 30 | 2.74 | 200 | 300 | 500 |
| 70 | 120 | 30 | 30 | 2.72 | 200 | 300 | 500 |
| 71 | 120 | 30 | 30 | 2.7 | 200 | 300 | 500 |
| 72 | 120 | 30 | 30 | 2.68 | 200 | 300 | 500 |
| 73 | 120 | 30 | 30 | 2.66 | 200 | 300 | 500 |
| 74 | 120 | 30 | 30 | 2.64 | 200 | 300 | 500 |
| 75 | 120 | 30 | 30 | 2.62 | 200 | 300 | 500 |
| 76 | 120 | 30 | 30 | 2.6 | 200 | 300 | 500 |
| 77 | 120 | 30 | 30 | 2.58 | 200 | 300 | 500 |
| 78 | 120 | 30 | 30 | 2.56 | 200 | 300 | 500 |
| 79 | 120 | 30 | 30 | 2.54 | 200 | 300 | 500 |
| 80 | 120 | 30 | 30 | 2.52 | 200 | 300 | 500 |
| 81 | 120 | 30 | 30 | 2.5 | 200 | 300 | 500 |
| 82 | 120 | 30 | 30 | 2.48 | 200 | 300 | 500 |
| 83 | 120 | 30 | 30 | 2.46 | 200 | 300 | 500 |

TABLE 13-continued

Sputtering process conditions for Example G2.

| Step | Time (sec) | Ar flow (sccm) | N2 flow (sccm) | O2 flow (sccm) | Al ($W_{RF}$) | Al ($W_{DC}$) | Si ($W_{RF}$) |
|---|---|---|---|---|---|---|---|
| 84 | 120 | 30 | 30 | 2.44 | 200 | 300 | 500 |
| 85 | 120 | 30 | 30 | 2.42 | 200 | 300 | 500 |
| 86 | 120 | 30 | 30 | 2.4 | 200 | 300 | 500 |
| 87 | 120 | 30 | 30 | 2.38 | 200 | 300 | 500 |
| 88 | 120 | 30 | 30 | 2.36 | 200 | 300 | 500 |
| 89 | 120 | 30 | 30 | 2.34 | 200 | 300 | 500 |
| 90 | 120 | 30 | 30 | 2.32 | 200 | 300 | 500 |
| 91 | 120 | 30 | 30 | 2.3 | 200 | 300 | 500 |
| 92 | 120 | 30 | 30 | 2.28 | 200 | 300 | 500 |
| 93 | 120 | 30 | 30 | 2.26 | 200 | 300 | 500 |
| 94 | 120 | 30 | 30 | 2.24 | 200 | 300 | 500 |
| 95 | 120 | 30 | 30 | 2.22 | 200 | 300 | 500 |
| 96 | 120 | 30 | 30 | 2.2 | 200 | 300 | 500 |
| 97 | 120 | 30 | 30 | 2.18 | 200 | 300 | 500 |
| 98 | 120 | 30 | 30 | 2.16 | 200 | 300 | 500 |
| 99 | 120 | 30 | 30 | 2.14 | 200 | 300 | 500 |
| 100 | 120 | 30 | 30 | 2.12 | 200 | 300 | 500 |
| 101 | 120 | 30 | 30 | 2.1 | 200 | 300 | 500 |
| 102 | 120 | 30 | 30 | 2.08 | 200 | 300 | 500 |
| 103 | 120 | 30 | 30 | 2.06 | 200 | 300 | 500 |
| 104 | 120 | 30 | 30 | 2.04 | 200 | 300 | 500 |
| 105 | 120 | 30 | 30 | 2.02 | 200 | 300 | 500 |
| 106 | 120 | 30 | 30 | 2 | 200 | 300 | 500 |
| 107 | 120 | 30 | 30 | 1.98 | 200 | 300 | 500 |
| 108 | 120 | 30 | 30 | 1.96 | 200 | 300 | 500 |
| 109 | 120 | 30 | 30 | 1.94 | 200 | 300 | 500 |
| 110 | 120 | 30 | 30 | 1.92 | 200 | 300 | 500 |
| 111 | 120 | 30 | 30 | 1.9 | 200 | 300 | 500 |
| 112 | 120 | 30 | 30 | 1.88 | 200 | 300 | 500 |
| 113 | 120 | 30 | 30 | 1.86 | 200 | 300 | 500 |
| 114 | 120 | 30 | 30 | 1.84 | 200 | 300 | 500 |
| 115 | 120 | 30 | 30 | 1.82 | 200 | 300 | 500 |
| 116 | 120 | 30 | 30 | 1.8 | 200 | 300 | 500 |
| 117 | 120 | 30 | 30 | 1.78 | 200 | 300 | 500 |
| 118 | 120 | 30 | 30 | 1.76 | 200 | 300 | 500 |
| 119 | 120 | 30 | 30 | 1.74 | 200 | 300 | 500 |
| 120 | 120 | 30 | 30 | 1.72 | 200 | 300 | 500 |
| 121 | 120 | 30 | 30 | 1.7 | 200 | 300 | 500 |
| 122 | 120 | 30 | 30 | 1.68 | 200 | 300 | 500 |
| 123 | 120 | 30 | 30 | 1.66 | 200 | 300 | 500 |
| 124 | 120 | 30 | 30 | 1.64 | 200 | 300 | 500 |
| 125 | 120 | 30 | 30 | 1.62 | 200 | 300 | 500 |
| 126 | 120 | 30 | 30 | 1.6 | 200 | 300 | 500 |
| 127 | 120 | 30 | 30 | 1.58 | 200 | 300 | 500 |
| 128 | 120 | 30 | 30 | 1.56 | 200 | 300 | 500 |
| 129 | 120 | 30 | 30 | 1.54 | 200 | 300 | 500 |
| 130 | 120 | 30 | 30 | 1.52 | 200 | 300 | 500 |
| 131 | 120 | 30 | 30 | 1.5 | 200 | 300 | 500 |
| 132 | 120 | 30 | 30 | 1.48 | 200 | 300 | 500 |
| 133 | 120 | 30 | 30 | 1.46 | 200 | 300 | 500 |
| 134 | 120 | 30 | 30 | 1.44 | 200 | 300 | 500 |
| 135 | 120 | 30 | 30 | 1.42 | 200 | 300 | 500 |
| 136 | 120 | 30 | 30 | 1.4 | 200 | 300 | 500 |
| 137 | 120 | 30 | 30 | 1.38 | 200 | 300 | 500 |
| 138 | 120 | 30 | 30 | 1.36 | 200 | 300 | 500 |
| 139 | 120 | 30 | 30 | 1.34 | 200 | 300 | 500 |
| 140 | 120 | 30 | 30 | 1.32 | 200 | 300 | 500 |
| 141 | 120 | 30 | 30 | 1.3 | 200 | 300 | 500 |
| 142 | 120 | 30 | 30 | 1.28 | 200 | 300 | 500 |
| 143 | 120 | 30 | 30 | 1.26 | 200 | 300 | 500 |
| 144 | 120 | 30 | 30 | 1.24 | 200 | 300 | 500 |
| 145 | 120 | 30 | 30 | 1.22 | 200 | 300 | 500 |
| 146 | 120 | 30 | 30 | 1.2 | 200 | 300 | 500 |
| 147 | 120 | 30 | 30 | 1.18 | 200 | 300 | 500 |
| 148 | 120 | 30 | 30 | 1.16 | 200 | 300 | 500 |
| 149 | 120 | 30 | 30 | 1.14 | 200 | 300 | 500 |
| 150 | 120 | 30 | 30 | 1.12 | 200 | 300 | 500 |
| 151 | 120 | 30 | 30 | 1.1 | 200 | 300 | 500 |
| 152 | 120 | 30 | 30 | 1.08 | 200 | 300 | 500 |
| 153 | 120 | 30 | 30 | 1.06 | 200 | 300 | 500 |
| 154 | 120 | 30 | 30 | 1.04 | 200 | 300 | 500 |
| 155 | 120 | 30 | 30 | 1.02 | 200 | 300 | 500 |
| 156 | 120 | 30 | 30 | 1 | 200 | 300 | 500 |
| 157 | 120 | 30 | 30 | 0.98 | 200 | 300 | 500 |
| 158 | 120 | 30 | 30 | 0.96 | 200 | 300 | 500 |
| 159 | 120 | 30 | 30 | 0.94 | 200 | 300 | 500 |
| 160 | 120 | 30 | 30 | 0.92 | 200 | 300 | 500 |
| 161 | 120 | 30 | 30 | 0.9 | 200 | 300 | 500 |
| 162 | 120 | 30 | 30 | 0.88 | 200 | 300 | 500 |
| 163 | 120 | 30 | 30 | 0.86 | 200 | 300 | 500 |
| 164 | 120 | 30 | 30 | 0.84 | 200 | 300 | 500 |
| 165 | 120 | 30 | 30 | 0.82 | 200 | 300 | 500 |
| 166 | 120 | 30 | 30 | 0.8 | 200 | 300 | 500 |
| 167 | 120 | 30 | 30 | 0.78 | 200 | 300 | 500 |
| 168 | 120 | 30 | 30 | 0.76 | 200 | 300 | 500 |
| 169 | 120 | 30 | 30 | 0.74 | 200 | 300 | 500 |
| 170 | 120 | 30 | 30 | 0.72 | 200 | 300 | 500 |
| 171 | 120 | 30 | 30 | 0.7 | 200 | 300 | 500 |
| 172 | 120 | 30 | 30 | 0.68 | 200 | 300 | 500 |
| 173 | 120 | 30 | 30 | 0.66 | 200 | 300 | 500 |
| 174 | 120 | 30 | 30 | 0.64 | 200 | 300 | 500 |
| 175 | 180 | 30 | 30 | 0.62 | 200 | 300 | 500 |
| 176 | 225 | 30 | 30 | 0.6 | 200 | 300 | 500 |
| 177 | 270 | 30 | 30 | 0.58 | 200 | 300 | 500 |
| 178 | 315 | 30 | 30 | 0.56 | 200 | 300 | 500 |
| 179 | 360 | 30 | 30 | 0.54 | 200 | 300 | 500 |
| 180 | 405 | 30 | 30 | 0.52 | 200 | 300 | 500 |
| 181 | 9000 | 30 | 30 | 0.5 | 200 | 300 | 500 |
| 182 | 108 | 30 | 30 | 3.2 | 70 | 100 | 500 |

Figure 22:
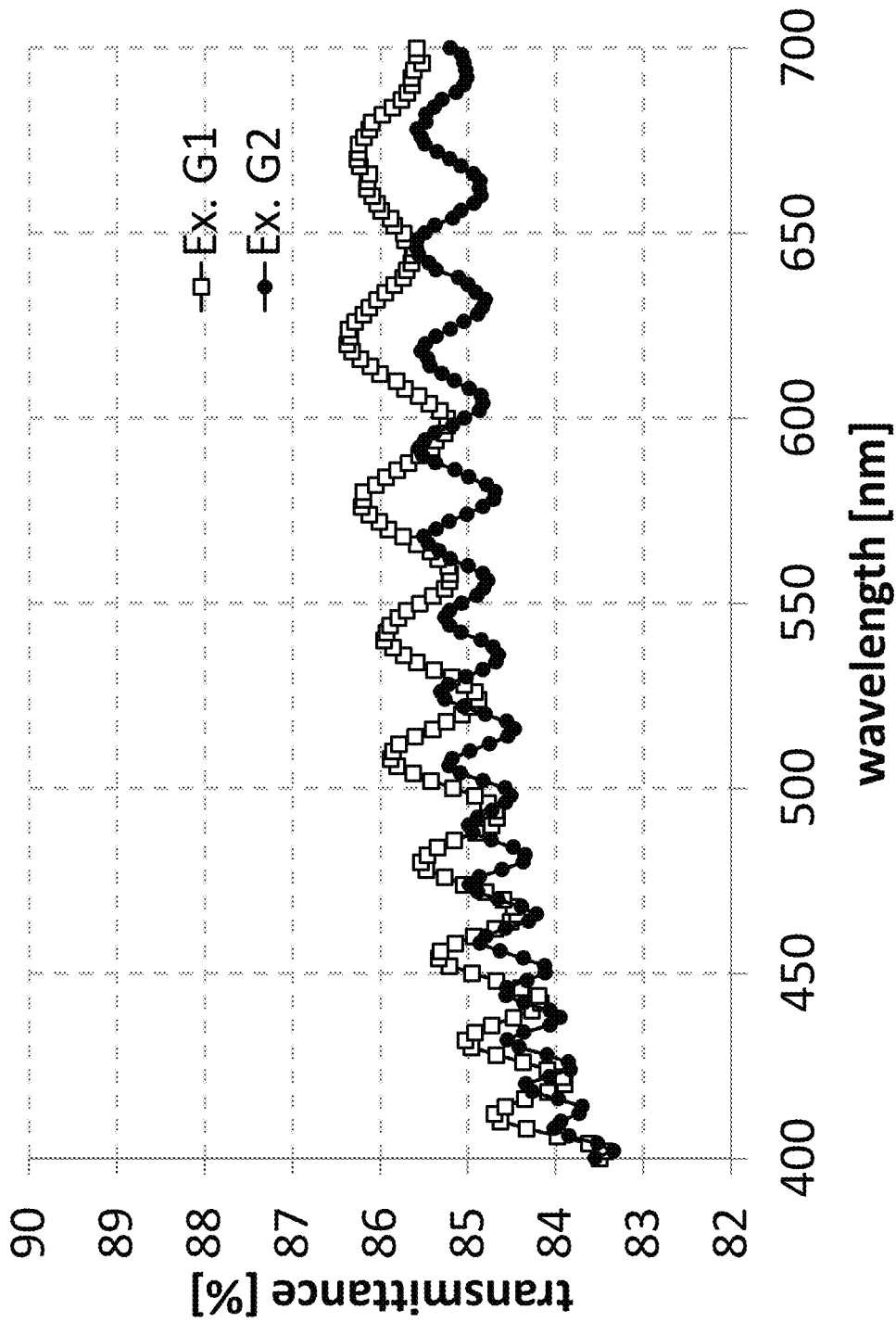
FIG. 22 is the transmittance spectra of Examples G1 and G2.
Figure 23:
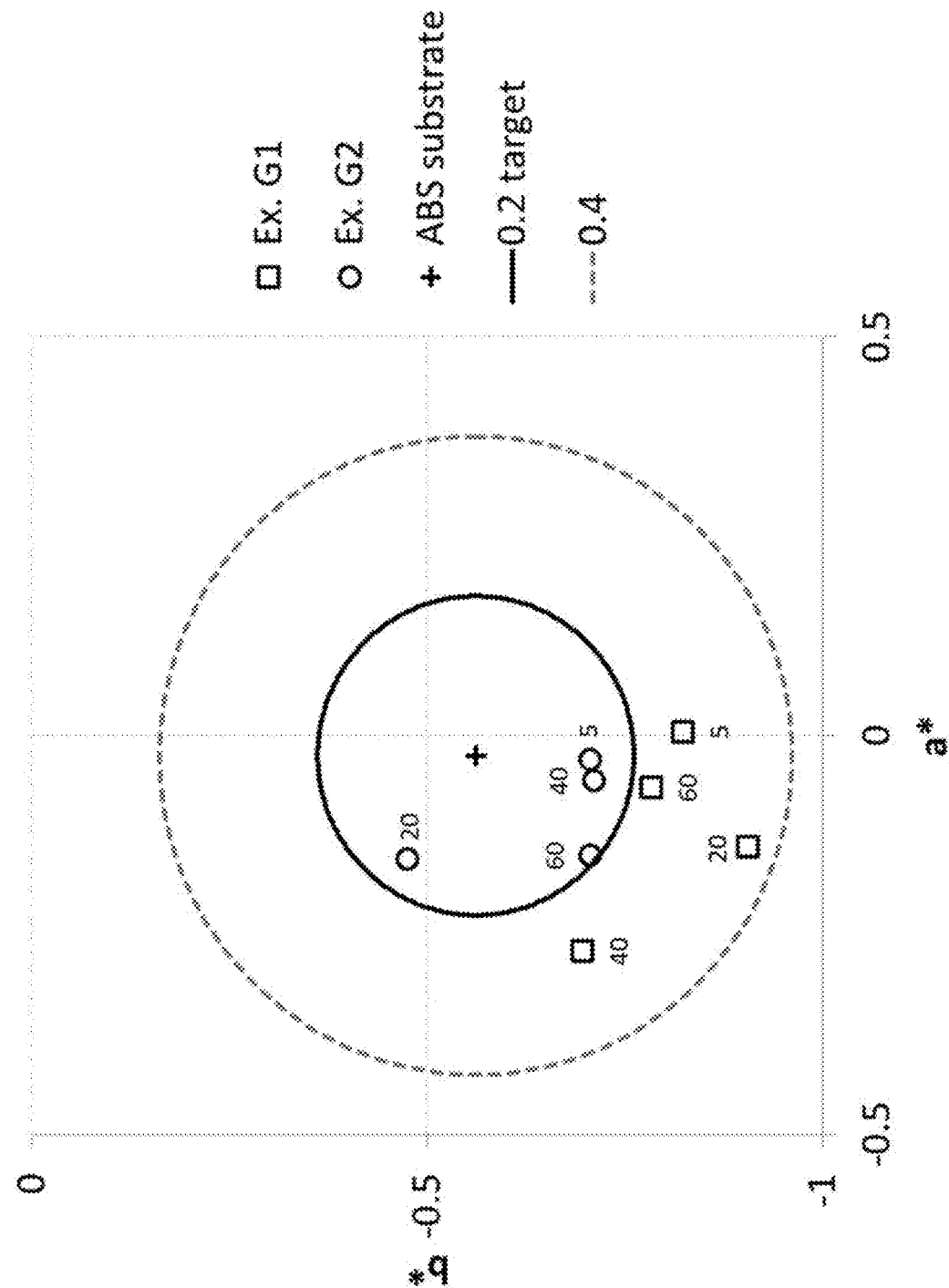
FIG. 23 is a plot showing the reflected a* and b* color values of Examples G1-G2 and the substrate used in Examples G1-G2 under an F2 illuminant.

The transmittance of Examples G1-G2 was measured at incident illumination angles of 5 degrees, 20 degrees, 40 degrees and 60 degrees, using an F2 illuminant and plotted in FIG. 22. The reflected a* and b* values of Examples G1-G2 at each incident viewing angle were plotted and compared to the reflected a* and b* values at each incident viewing angle of the substrate used to form Examples G1-G2 in FIG. 23. The a* and b* values for Examples G1 and G2 are near the a* and b* values of the substrate, indicating a low color shift such as, for example, a color shift of ±0.5.

What is claimed is:
1. An article comprising:
a substrate having a surface; and
an optical film comprising a metal oxynitride disposed on the surface forming a coated surface,
wherein the article exhibits a color shift of less than 2, when viewed at an incident illumination angle in the range from about 5 degrees to about 60 degrees from normal incidence under a CIE F2 illuminant, and
wherein the article exhibits an average transmittance or average reflectance having an average oscillation amplitude of about 10 percentage points or less, over an optical wavelength regime.
2. The article of claim 1, further exhibiting an average transmittance of at least 80% over the optical wavelength regime.
3. The article of claim 1, wherein the transmittance over a selected wavelength of about 100 nm over the optical wavelength regime has a maximum oscillation amplitude of about 5 percentage points.
4. The article of claim 1, wherein the transmittance over a selected wavelength of about 100 nm over the optical wavelength regime has a maximum oscillation amplitude of about 3 percentage points.
5. The article of claim 1, wherein the optical film comprises a plurality of layers.
6. The article of claim 1, wherein optical film has a thickness in the range from about 0.5 μm to about 3 μm.

7. The article of claim 1, wherein the article has an average hardness in the range from about 5 GPa to about 30 GPa as measured on the coated surface by indenting the coated surface with a Berkovitch indenter to form an indent having an indentation depth of at least about 100 nm from the surface of the coated surface.

8. The article of claim 7, wherein the optical film further comprises a scratch resistant layer.

9. The article of claim 1, wherein the optical film has a first surface disposed on the substrate and a second surface, and wherein the first surface has a first refractive index and the second surface has a refractive index that is greater than the first refractive index.

10. The article of claim 9, wherein the optical film comprises a refractive index gradient comprising a refractive index that increases from the first surface to the second surface along the thickness at an average rate in the range from about 0.2/μm to about 0.5/μm.

11. The article of claim 9, wherein the optical film comprises an optical modifying layer, and wherein the optical modifying layer comprises the first surface and the second surface opposite from the first surface.

12. An article comprising:
a substrate comprising a substrate surface; and
an optical film comprising a metal oxynitride disposed on the surface forming a coated surface,
wherein the optical film comprises a first surface adjacent to the substrate surface, a second surface, and a refractive index gradient extending from the first surface to the second surface,
wherein the refractive index at the second surface is greater than the refractive index at the first surface,
wherein the article exhibits an average transmittance or average reflectance having an average oscillation amplitude of about 10 percentage points or less, over an optical wavelength regime, and
wherein the article exhibits a hardness in the range from about 8 GPa to about 50 GPa as measured on the coated surface by indenting the coated surface with a Berkovitch indenter to form an indent having an indentation depth of at least about 100 nm from the surface of the coated surface.

13. The article of claim 12, wherein the optical film comprises a compositional gradient, the compositional gradient comprising at least two of Si, Al, N, and O.

14. The article of claim 12, wherein the optical film comprises a gradient selected from at least one of a porosity gradient, a density gradient and an elastic modulus gradient.

15. The article of claim 12, wherein the refractive index gradient comprises a positive slope gradient and is in the range from about 1.5 to about 2.0.

16. The article of claim 15, wherein the refractive index gradient comprises a first refractive index at the first surface in the range from about 1.4 to about 1.65 and a second refractive index at the second surface in the range from about 1.7 to about 2.2.

17. A method of forming an article comprising:
providing a substrate having a major surface and comprising an amorphous substrate or a crystalline substrate;
disposing an optical film having a thickness and comprising a metal oxynitride on the major surface; and
creating a refractive index gradient along at least a portion of the thickness of the optical film,
wherein the article exhibits an average light transmittance having an average amplitude of less than about 5%, over the optical wavelength regime.

18. The method of claim 17, wherein creating a refractive index gradient comprises varying along the thickness of the optical film at least one of the composition and the porosity of the optical film.

19. The method of claim 17, further comprising reducing light absorption of the optical film by exposing the optical film to one of an elevated temperature or light, as the optical film is disposed on the surface.

* * * * *